US007856523B2

(12) United States Patent
Bittner, Jr.

(10) Patent No.: US 7,856,523 B2
(45) Date of Patent: Dec. 21, 2010

(54) RANDOM ACCESS MEMORY (RAM) BASED CONTENT ADDRESSABLE MEMORY (CAM) MANAGEMENT

(75) Inventor: Ray A. Bittner, Jr., Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 672 days.

(21) Appl. No.: 11/734,168

(22) Filed: Apr. 11, 2007

(65) Prior Publication Data

US 2007/0186036 A1    Aug. 9, 2007

Related U.S. Application Data

(63) Continuation-in-part of application No. 11/143,307, filed on Jun. 1, 2005, now Pat. No. 7,451,297, and a continuation-in-part of application No. 11/143,308, filed on Jun. 1, 2005, now Pat. No. 7,707,387, and a continuation-in-part of application No. 11/143,060, filed on Jun. 1, 2005, now Pat. No. 7,793,040.

(51) Int. Cl.
*G06F 12/00* (2006.01)
(52) U.S. Cl. .......................... 711/108; 711/E12.017
(58) Field of Classification Search ..................... None
See application file for complete search history.

(56) References Cited

U.S. PATENT DOCUMENTS

| 5,247,634 | A | 9/1993 | Cline et al. |
|---|---|---|---|
| 5,339,411 | A | 8/1994 | Heaton, Jr. |
| 6,115,799 | A | 9/2000 | Ogawa |
| 6,470,436 | B1 | 10/2002 | Croft et al. |
| 6,507,898 | B1* | 1/2003 | Gibson et al. ............... 711/168 |
| 6,574,626 | B1 | 6/2003 | Regelman et al. |
| 6,867,991 | B1* | 3/2005 | Tezcan et al. ............. 365/49.16 |
| 6,876,559 | B1* | 4/2005 | Rathnavelu et al. ........ 365/49.1 |
| 6,928,430 | B1* | 8/2005 | Chien et al. .................... 707/3 |
| 7,093,096 | B2 | 8/2006 | Fougeroux et al. |
| 2001/0018731 | A1 | 8/2001 | Fujii et al. |
| 2002/0016896 | A1 | 2/2002 | Siebert |
| 2002/0046291 | A1* | 4/2002 | O'Callaghan et al. ....... 709/238 |
| 2006/0149916 | A1 | 7/2006 | Nase |
| 2006/0155915 | A1* | 7/2006 | Pereira ....................... 711/100 |
| 2006/0248102 | A1 | 11/2006 | Bowler et al. |

OTHER PUBLICATIONS

M. A. Ruiz-Sanchez, E.W. Biersack, and W. Dabbous, "Survey and taxonomy of IP address lookup algorithms," IEEE/ACM Trans. Networking, vol. 15, pp. 8-23, Mar./Apr. 2001.*
Ganger, et al., "Self-* Storage", available at least as early as Feb. 20, 2007, at <<http://www.pdl.cmu.edu/PDL-FTP/News/newsletter03.pdf>>, pp. 1-20.

(Continued)

*Primary Examiner*—Matt Kim
*Assistant Examiner*—John P Fishburn
(74) *Attorney, Agent, or Firm*—Lee & Hayes, PLLC

(57) ABSTRACT

A Random Access Memory (RAM) based Content Addressable Memory (CAM) architecture is disclosed. In an implementation, the CAM architecture includes a CAM data structure associated with a RAM to store one or more tags and associated data values. Each of the tags includes one or more bit fields which are utilized as an index for referencing a look-up table. One or more look-up tables may be realized for supporting memory operations facilitating efficient transfer modes available in the RAM.

11 Claims, 46 Drawing Sheets

OTHER PUBLICATIONS

"Geodesic Systems' Great Circle to Support Microsoft Visual C++ 6.0", available at least as early as Feb. 21, 2007, at <<http://www.findarticles.com/p/articles/mi_m0EIN/is_1998_Sept_14/ai_21163832 >>, FindArticles, 2007, pp. 1-4.

Richter, "Garbage Collection: Automatic Memory Management in the Microsoft .NET Framework", available at least as early as Feb. 21, 2007, at <<http://www.cs.inf.ethz.ch/ssw/files/GC_in_NET.pdf>>, Microsoft Corporation, 2001, pp. 1-18.

* cited by examiner

Pre-Recursive Code Input Tag Format for $X_{ij}$

| X Tag Prefix | $X_i$ Instance | j | 0,1 |
|---|---|---|---|
| Tag Prefix | Instance | Recursive State | Set Position |

Post-Recursive Code Input Tag Format for $X_{ik}$

| Y Tag Prefix | $X_i$ Instance | k | 0,1,2,3 |

FIG. 49

Low Space Page Table Pointers – 1024 Pointers (4K Page)

| Page Table Pointer 0 | Page Table Pointer 1 |
| Page Table Pointer 2 | Page Table Pointer 3 |
| ⋯ | ⋯ |
| Page Table Pointer 1022 | Page Table Pointer 1023 |

| | 7 | 6 | 5 | 4 | 3 | 2 | 1 | 0 |
|---|---|---|---|---|---|---|---|---|
| | | Page Pointer 0 | | | | | | |
| 0x00 | Op Set Flags | Op Set Flags | Op Set Flags | Op Set Flags | Op Set Flags | Op Set Flags | Op Set Flags | Op Set Flags |
| 0x08 | Op Set Flags | Op Set Flags | Op Set Flags | Op Set Flags | Op Set Flags | Op Set Flags | Op Set Flags | Op Set Flags |
| 0x10 | Op Set Flags | Op Set Flags | Op Set Flags | Op Set Flags | Op Set Flags | Op Set Flags | Op Set Flags | Op Set Flags |
| 0x18 | Op Set Flags | Op Set Flags | Op Set Flags | Op Set Flags | Op Set Flags | Op Set Flags | Op Set Flags | Op Set Flags |
| 0x20 | Op Set Flags | Op Set Flags | Op Set Flags | Op Set Flags | Op Set Flags | Op Set Flags | Op Set Flags | Op Set Flags |
| 0x28 | Op Set Flags | Op Set Flags | Op Set Flags | Op Set Flags | Op Set Flags | Op Set Flags | Op Set Flags | Op Set Flags |
| 0x30 | Op Set Flags | Op Set Flags | Op Set Flags | Op Set Flags | Op Set Flags | Op Set Flags | Op Set Flags | Op Set Flags |
| 0x38 | Op Set Flags | Op Set Flags | Op Set Flags | Op Set Flags | Op Set Flags | Op Set Flags | Op Set Flags | Op Set Flags |
| 0x40 | Op Set Flags | Op Set Flags | Op Set Flags | Op Set Flags | Op Set Flags | Op Set Flags | Op Set Flags | Op Set Flags |
| 0x48 | Op Set Flags | Op Set Flags | Op Set Flags | Op Set Flags | Op Set Flags | Op Set Flags | Op Set Flags | Op Set Flags |
| 0x50 | Op Set Flags | Op Set Flags | Op Set Flags | Op Set Flags | Op Set Flags | Op Set Flags | Op Set Flags | Op Set Flags |
| 0x58 | Op Set Flags | Op Set Flags | Op Set Flags | Op Set Flags | Op Set Flags | Op Set Flags | Op Set Flags | Op Set Flags |
| 0x60 | Op Set Flags | Op Set Flags | Op Set Flags | Op Set Flags | Op Set Flags | Op Set Flags | Op Set Flags | Op Set Flags |
| 0x68 | Op Set Flags | Op Set Flags | Op Set Flags | Op Set Flags | Op Set Flags | Op Set Flags | Op Set Flags | Op Set Flags |
| 0x70 | Op Set Flags | Op Set Flags | Op Set Flags | Op Set Flags | Op Set Flags | Op Set Flags | Op Set Flags | Op Set Flags |
| 0x78 | Op Set Flags | Op Set Flags | Op Set Flags | Op Set Flags | Op Set Flags | Op Set Flags | Op Set Flags | Op Set Flags |

*FIG. 50*

| | 7 | 6 | 5 | 4 | 3 | 2 | 1 | 0 |
|---|---|---|---|---|---|---|---|---|
| | | Page Pointer 15 | | | | | | |
| 0x00 | Op Set Flags | Op Set Flags | Op Set Flags | Op Set Flags | Op Set Flags | Op Set Flags | Op Set Flags | Op Set Flags |
| 0x08 | Op Set Flags | Op Set Flags | Op Set Flags | Op Set Flags | Op Set Flags | Op Set Flags | Op Set Flags | Op Set Flags |
| 0x10 | Op Set Flags | Op Set Flags | Op Set Flags | Op Set Flags | Op Set Flags | Op Set Flags | Op Set Flags | Op Set Flags |
| 0x18 | Op Set Flags | Op Set Flags | Op Set Flags | Op Set Flags | Op Set Flags | Op Set Flags | Op Set Flags | Op Set Flags |
| 0x20 | Op Set Flags | Op Set Flags | Op Set Flags | Op Set Flags | Op Set Flags | Op Set Flags | Op Set Flags | Op Set Flags |
| 0x28 | Op Set Flags | Op Set Flags | Op Set Flags | Op Set Flags | Op Set Flags | Op Set Flags | Op Set Flags | Op Set Flags |
| 0x30 | Op Set Flags | Op Set Flags | Op Set Flags | Op Set Flags | Op Set Flags | Op Set Flags | Op Set Flags | Op Set Flags |
| 0x38 | Op Set Flags | Op Set Flags | Op Set Flags | Op Set Flags | Op Set Flags | Op Set Flags | Op Set Flags | Op Set Flags |
| 0x40 | Op Set Flags | Op Set Flags | Op Set Flags | Op Set Flags | Op Set Flags | Op Set Flags | Op Set Flags | Op Set Flags |
| 0x48 | Op Set Flags | Op Set Flags | Op Set Flags | Op Set Flags | Op Set Flags | Op Set Flags | Op Set Flags | Op Set Flags |
| 0x50 | Op Set Flags | Op Set Flags | Op Set Flags | Op Set Flags | Op Set Flags | Op Set Flags | Op Set Flags | Op Set Flags |
| 0x58 | Op Set Flags | Op Set Flags | Op Set Flags | Op Set Flags | Op Set Flags | Op Set Flags | Op Set Flags | Op Set Flags |
| 0x60 | Op Set Flags | Op Set Flags | Op Set Flags | Op Set Flags | Op Set Flags | Op Set Flags | Op Set Flags | Op Set Flags |
| 0x68 | Op Set Flags | Op Set Flags | Op Set Flags | Op Set Flags | Op Set Flags | Op Set Flags | Op Set Flags | Op Set Flags |
| 0x70 | Op Set Flags | Op Set Flags | Op Set Flags | Op Set Flags | Op Set Flags | Op Set Flags | Op Set Flags | Op Set Flags |
| 0x78 | Op Set Flags | Op Set Flags | Op Set Flags | Op Set Flags | Op Set Flags | Op Set Flags | Op Set Flags | Op Set Flags |

*FIG. 51*

| Operand Set 0 Data 1 | Operand Set 0 Data 0 |
|---|---|
| Operand Set 0 Data 3 | Operand Set 0 Data 2 |
| Operand Set 0 Data 5 | Operand Set 0 Data 4 |
| Operand Set 0 Data 7 | Operand Set 0 Data 6 |
| Operand Set 1 Data 1 | Operand Set 1 Data 0 |
| Operand Set 1 Data 3 | Operand Set 1 Data 2 |
| Operand Set 1 Data 5 | Operand Set 1 Data 4 |
| Operand Set 1 Data 7 | Operand Set 1 Data 6 |
| — — | — — |
| Operand Set 127 Data 1 | Operand Set 127 Data 0 |
| Operand Set 127 Data 3 | Operand Set 127 Data 2 |
| Operand Set 127 Data 5 | Operand Set 127 Data 4 |
| Operand Set 127 Data 7 | Operand Set 127 Data 6 |

*FIG. 52*

RANDOM ACCESS MEMORY (RAM) BASED CONTENT ADDRESSABLE MEMORY (CAM) MANAGEMENT

CROSS-REFERENCE TO RELATED APPLICATIONS

The present application is a continuation in part of U.S. patent application Ser. No. 11/143,307 entitled "Execution Model for Parallel Computing;" U.S. patent application Ser. No. 11/143,308, entitled "Conditional Execution via Content Addressable Memory and Parallel Computing Execution Model;" and U.S. patent application Ser. No. 11/143,060, entitled "Content Addressable Memory Architecture" all of which are assigned to the assignee of the present invention, were filed on 1Jun, 2005 and are herein incorporated by reference in their entireties.

BACKGROUND

For a considerable time, computer program developers and users have been able to benefit from advances in technology that have shrunk silicon feature sizes. As the size of the devices (e.g., microprocessors and memory) that can be created grows smaller, the devices become faster, cheaper and more densely packed. The effect of these advances has allowed contemporary computing to continue to use a control driven (Von Neumann) execution model, in which a series of instructions is written by a programmer for the processor to follow, and when executed in order, will perform a desired computation.

However, the limits of such conventional computing technology are being reached. This is because of a number of problems that arise as the silicon feature size continues to shrink. For example, effects such as crosstalk, capacitive loading, defect density and heat dissipation become more pronounced as the chips become more densely packed.

As a result, in an attempt to continue to advance computational power, manufacturers are introducing solutions based on some amount of parallel computing. For example, modern processors automatically attempt to extract some parallelism from control driven code, by attempting to find operations that can be executed in any order, and thus can be executed in parallel, without changing the outcome. However, extracting parallelism in this way is a complex problem that is not particularly successful or efficient, as it requires a significant amount of looking ahead or behind in the instructions to determine which operations, if any, can be conducted in parallel. Despite such complexities, the computer industry is moving towards parallel computing. What is needed is a better architecture for parallel computing.

SUMMARY

The summary is provided to introduce simplified concepts of Random Access Memory (RAM) based Content Addressable Memory (CAM) management, which is further described below in the Detailed Description. This summary is not intended to identify essential features of the claimed subject matter, nor is it intended for use in determining the scope of the claimed subject matter.

CAM architecture is disclosed for management of RAM memory. In an embodiment, a system includes a CAM data structure associated with a RAM memory. The CAM data structure includes an operand set that is characterized by one or more tags. Each of the tags is sub-dividable into one or more bit fields, with each bit field utilized as an index for referencing a look-up table. The look-up table associated with the last bit field in the tag may reference a list of bins, each bin capable of associating more than one value to each tag.

BRIEF DESCRIPTION OF THE DRAWINGS

FIGS. 20 and 21 are representations of cache management examples using the functional input tag space model, in accordance with various aspects of the present invention.

FIGS. 31-33 are exemplary diagrams representing the use of flags for blocking the flow of input data for a time until other data in a graph has been processed, in accordance with various aspects of the present invention.

FIG. 36 is a representation of pre- and post-recursive code input tag formats used in handling recursive functions, in accordance with various aspects of the present invention.

FIGS. 47-52 are representations of various tables used in managing tags and data in external memory, in accordance with various aspects of the present invention.

DETAILED DESCRIPTION

Content Addressable Memory (CAM) Architecture

The content addressable memory (CAM) architecture of the present invention is generally aimed at providing a platform for performing relatively demanding computational tasks in a way that is easy to program, has a practical implementation and can be applied to general purpose problems. There are a wide variety of computing problems and tasks that are amenable to parallelization, such as graphics, speech processing, artificial intelligence, simulation and modeling, bio-logical synthesis, data mining, data processing, databases, server applications, and so forth. Many of these applications are well known and are the domain of supercomputers.

Notwithstanding, the present invention is not limited to any particular data processing applications. In general, while one described example architecture of the present invention attempts to address some or all of the above-identified problems and tasks, the CAM architecture may be scaled down to an extent. As a result, higher-speed computation provided by the CAM architecture may be available to mass market users; e.g., many of the CAM-based features may be incorporated into consumer computing environments such as word processing, database and game programs.

Figure 1:
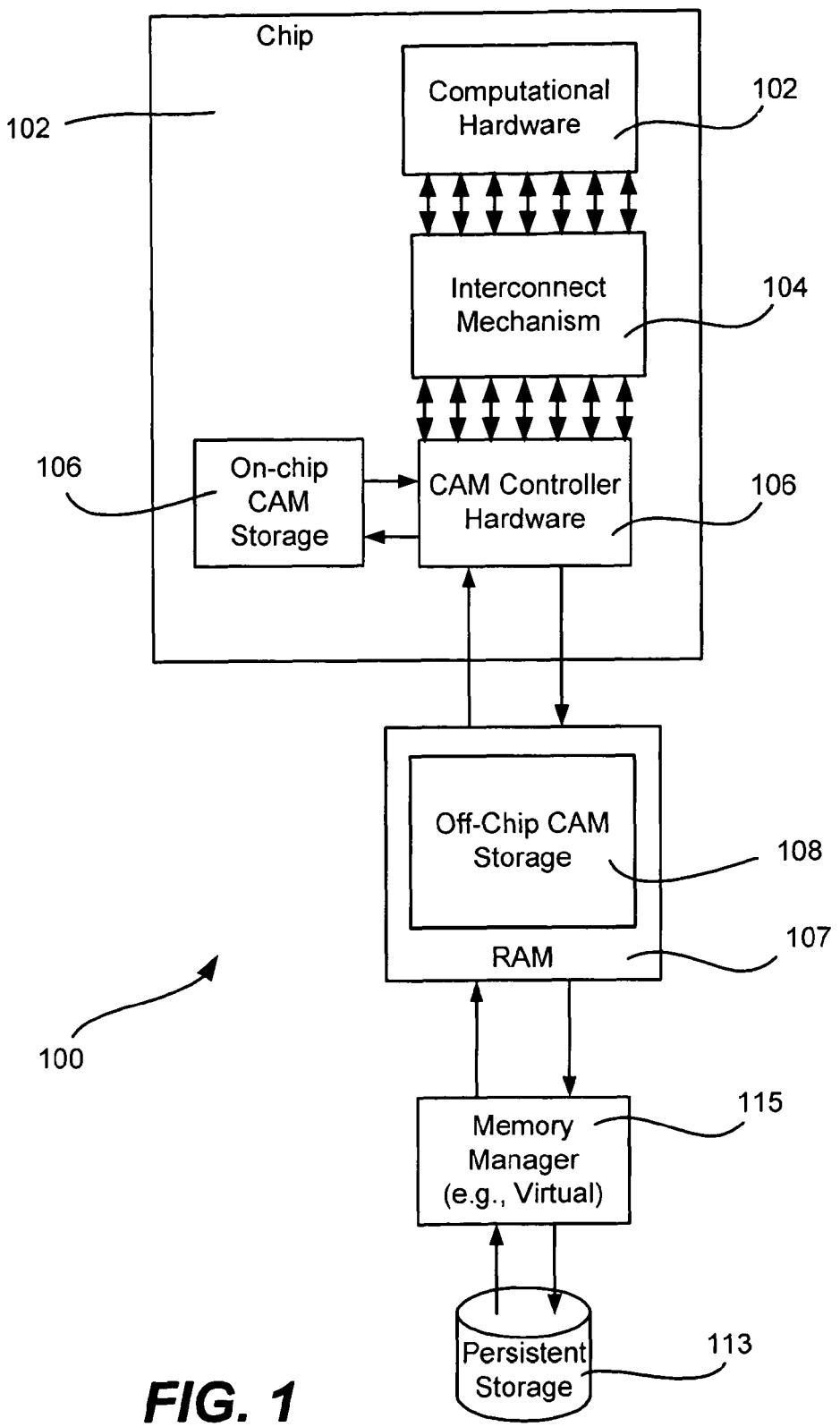
FIG. 1 is a block diagram generally representing a computing environment into which the present invention may be incorporated.

FIG. 1 shows a general computing environment such as a computing machine 100 into which various aspects of the present invention are implemented. In FIG. 1, a machine includes a chip having some computational hardware 102 coupled through an interconnect network 104 and CAM controller hardware 105 to an on-chip CAM storage area 106. Note that the CAM controller hardware 105 may be combined with the interconnect network 104, at least to some extent, for greater efficiency and/or better implementation.

Also shown in FIG. 1 is some random access memory 107 containing an off-chip CAM storage area 108. In general, and as described below, the on-chip CAM storage buffer 106 is a fast cache, with the off-chip CAM storage area 108 serving as a slower-access but larger backing store for the on-chip CAM storage buffer 106. Note that the off-chip CAM storage 108 can itself be virtualized memory backed by a persistent storage 113, such as a hard disk drive. A memory manager 115 or the like (itself loaded in part in the RAM) can handle such RAM/persistent storage virtualization in a known manner. The various CAM-related components are described in more detail below.

In accordance with various aspects of the present invention, the CAM (comprised of its various components) provides a way to identify and track data for parallel execution. In contrast to control driven architectures, in which a series of instructions is written by a programmer for the processor to execute in order, the present invention may employ a data driven, or dataflow program, in which no strict order is imposed on processing when another interpretation of the instructions may give the same results. Although a dataflow driven architecture does explicitly show necessary dependencies between operations (or steps), it does not put any restrictions on operations that can be performed in parallel. Instead, a dataflow processor takes a dataflow program as input and then applies as much parallelism to the problem as the explicitly-specified dependencies allow.

Figure 2:
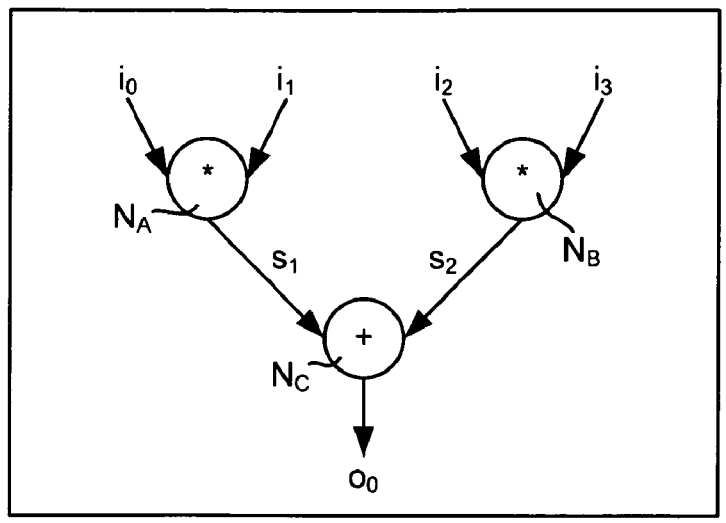
FIG. 2 is a dataflow graph of nodes generally representing computational hardware and the flow of data operands through the graph, where the graph may be part or all of a configuration, in accordance with various aspects of the present invention.

As represented in FIG. 2, a dataflow program may be specified as a graph of connected operators, (represented as nodes $N_A$-$N_C$), whereby the program is often referred to as a dataflow graph. Operands (e.g., $i_0$-$i_3$ and S1S2 and $O_0$) comprise the data that flow implicitly across the connected arcs. Whenever an operator has operands on all of its input arcs, such as the node $N_A$ having operands $i_0$ and $i_1$ present, the operand is allowed to fire (perform its operation) and produce one or more output operands (e.g., $s_1$) for the next computation.

Dataflow processing gets its name from the way that the data flows through the graph. In the example of FIG. 2, if each instruction takes one unit time to execute, the dataflow program can execute in two time steps because the two multiply operations are allowed to execute in parallel in the first time step, with only a second time step needed to perform the sum.

In contrast, a control driven program will execute in three time steps (one for the first multiply, one for the second, and one for the sum operation).

One property of a dataflow graph is that each node in the graph can be considered to be an isolated system; the node waits for inputs, and when they are present it produces an output. In general, the node does not need to consider the actions of the other nodes around it, other than queuing up inputs and producing outputs with some kind of flow control scheme. Thus, a system may be designed in which a (possibly relatively simple) processor is dedicated to each of these nodes, and the processors can act in parallel. For example, in FIG. 2, one processor may handle the multiplication operation at node $N_A$, another the multiplication operation at node $N_B$, and another the sum operation at node $N_C$. Note however, that because often such graphs are much larger than can be realized with a per-processor node approach, dataflow architectures attempt to deal with the problem of mapping a large dataflow graph onto a much smaller set of computational resources. Note that as described below, the hardware may be reconfigurable at runtime, (e.g., via field programmable gate array-like hardware), whereby dataflow graphs or portions thereof can be configured as needed.

Moreover, once a processor performs its operation, it is free to perform another operation as soon as it receives its full set of input operands, independent of downstream processing. Nodes are thus independent. To this end, a node may receive its operands from the CAM, such as in a FIFO queue, and place its outputs into a similar FIFO queue (e.g., a set of hardware registers) that is in turn consumed by a downstream processor or the CAM. Alternatively, while queues may connect the processing nodes, the processing nodes may be directly connected so that there is no queue between them, or have a queue length of one. By building a complete operand set before launching it into the computational nodes, the necessary values are guaranteed to be available, whereby once an operand set is launched, there is no need for delays waiting for values in the computation, reducing or eliminating the need for queues. In effect, the CAM acts as the global queue for data, and complete operand sets are pulled out of it as they become available. Notwithstanding, hardware that does not require a complete operand set to be fully assembled before being launched may be used to provide other advantages. Further, there may be operating modes that produce more than one output for a given input, whereby queues between nodes may be advantageous. Moreover, because different nodes in a graph may need different numbers of clock cycles to complete a computation, it may be necessary to make use of fixed delay queues between nodes in order to path length match the outputs from two sibling nodes that feed a common child.

In addition to parallel computations, the independence of nodes offers the ability to process data in sets, essentially as waves of operands. Thus, for example, unlike a control driven program, once the node $N_A$ has fired, it can fire again as soon as it has its inputs. This means that while the node $N_C$ is firing, such as on the second time unit, the nodes $N_A$ and $N_B$ can also be firing on the same second time unit, such as with input operands $i_4$ through $i_7$ (not shown). Thus, after the nodes $N_A$ and $N_B$ have fired once, the three nodes represented in FIG. 2 can be firing at the same time until no more data is available in the CAM to input to the nodes $N_A$ and $N_B$. As can be appreciated, by considering thousands of sets of data input, for example, all but the first and last sets of data are handled with three parallel operations, in two time steps. For example, given 1,000 sets of four data inputs ($i_0$ through $i_{3999}$) and one time step per operation, 1,001 time steps are required to process the entire set; time T0 would start (half-process) set S0 of $i_0$-$i_3$, time T1 would finish set S0 and start set S1, time T2 would finish set S1 and start set S2 and so on, until time T1,000 finished set S999. As can be seen, unlike a control driven program that would require three operations (multiply, multiply, then add) per set, then start over on the next set, and thus 3,000 time units in the above example, with large amounts of data, a tremendous gain in computation speed (approximately three times in the above example) is achieved by such parallelism. In general, the more complex (e.g., wider) the graph, the greater the gain in computation speed.

As can be seen, the speedup offered by the dataflow approach is directly related to the parallelism that the algorithm allows. The amount of parallelism present in a program can vary considerably from algorithm to algorithm, but there are many applications that exhibit a high degree of parallelism and can benefit from a dataflow model of computation. Some of these areas include graphics, neural networks, digital signal processing, communications, network servers, speech processing, data mining, weather forecasting, simulators of many kinds and scientific computing in general. Dataflow programs can greatly speedup these types of applications given a computer that is capable of exploiting the explicitly-specified parallelism.

Although not necessary to the present invention, dataflow computation corresponds well to the concept of runtime reconfiguration (RTR). More particularly, the dataflow programming model is one of specifying the connections between a set of independently-operating computing nodes, while runtime reconfiguration is one possible way of causing the hardware to implement the actions of those nodes. To this end, unlike conventional chip technology in which functions are etched in silicon and never altered, but instead are only directed by the instructions of a control driven program, runtime reconfigurable systems attempt to construct the logic of a device in such a way that they can be re-purposed at runtime to fit a current task. In the dataflow example of FIG. 2, there may be three general purpose nodes on the device, and for that program, two are configured to be multipliers, while the third is configured to be an adder. Thus, runtime reconfigurable machines attempt to make better use of available silicon. Not only is the reconfiguration ability different, but runtime reconfigurable systems are different from having three general purpose processors fixed on the die, for example, because the general purpose nodes in a runtime reconfigurable system are typically much simpler. For example, it may be more practical to have hundreds or even thousands of simple reconfigurable functional units, as opposed to hundreds or thousands of full-featured general purpose processors.

Thus, a runtime reconfigurable chip may be used to convert a set of processing elements to realize a given function, and thereby perform parallel computations and achieve speedups over fixed function general purpose processors. When a speedup advantage is attained, the speedup may, if desired, be traded off for power. In other words, higher-speed execution means fewer clock cycles are needed to perform the computation, whereby the faster runtime reconfigurable system can also be made to consume less power than the slower, general-purpose processors.

As is thus understood, a large set of configurable computing elements that can be connected in various ways maps well to dataflow computation. A runtime reconfigurable system has some finite number of these computing elements (or functional units), and different configurations (the entire graph or sub-graphs) are programmed into these functional units at runtime. As described below, the configurations can be paged into the hardware on a demand basis, similar to how virtual memory is handled in a conventional computer. As a set of data is produced, its corresponding configuration is paged into the hardware and then the dataset is run through it. This then produces a new set of data which causes a new configuration to be paged in, and so on down through the program.

Figure 3:
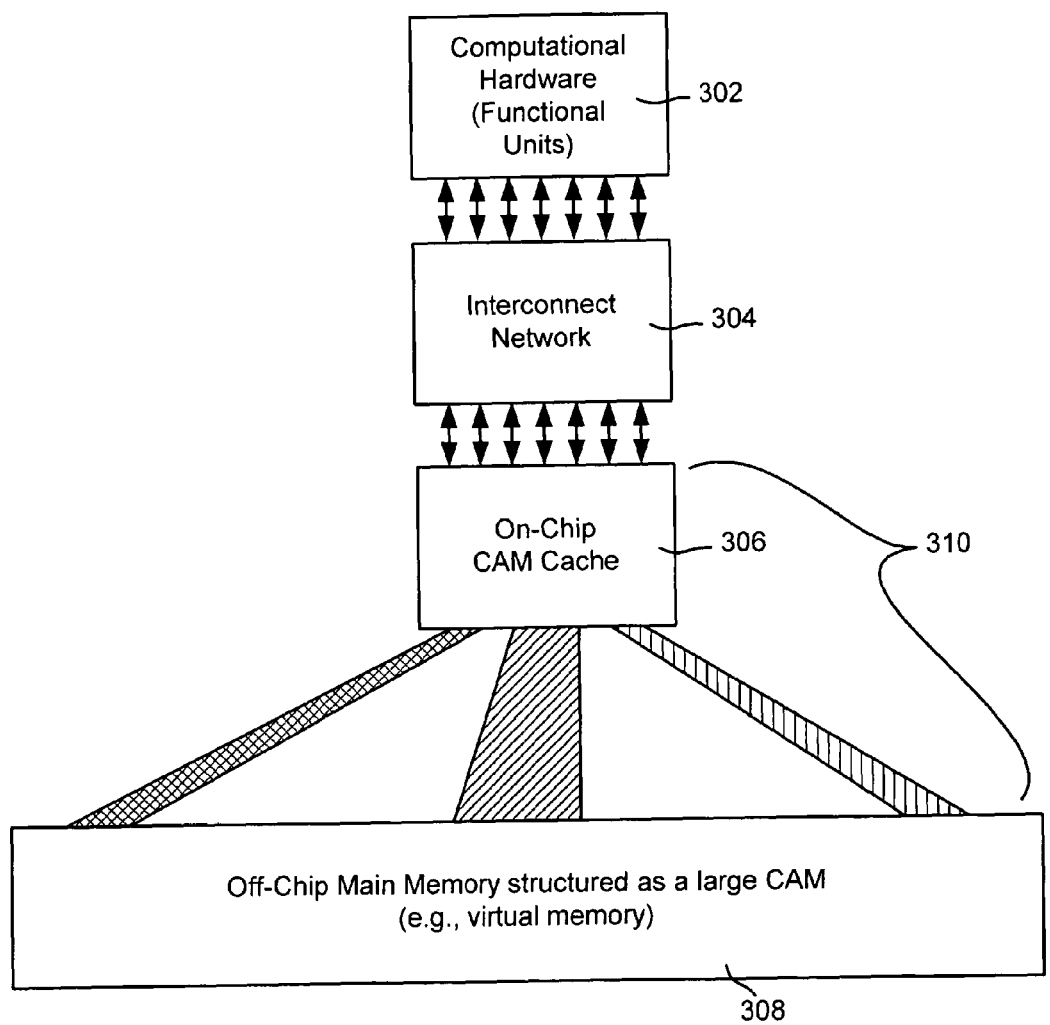
FIG. 3 is a block diagram generally representing a content addressable memory (CAM) architecture in accordance with various aspects of the present invention.

The general CAM system architecture is depicted in FIG. 3, wherein connections between computational hardware such as functional units 302 that contain the computational logic and the CAM on-chip cache component 306 are through an interconnect network 304, such as a crossbar. The crossbar may be size limited via hierarchy as necessary, depending on space constraints. For example, functional units may be broken into clusters, each of which contains a local crossbar that is interfaced to a chip-level crossbar.

The functional units 302 comprise the hardware for processing logical operations, integer operations and other operations, such as digit serial floating point operations (described below). The functional units 302 may be constructed to operate with fixed known delays, so that they can be connected through the interconnect network (crossbar) 304 in a pipelined manner, without introducing pipeline stalls or bubbles. In some situations, it may be necessary to introduce extra pipeline stage delays into the dataflow graph to achieve such a result. Further, because paths through a graph are not necessarily the same length (e.g., in nodes), these delays may be used for path length equalization for two merging paths that have different latencies. Such pipeline stages may be included in the functional units 302, in the interconnect (routing) network 304 and/or as separate elements connected to the interconnect network 304. Note, however, that variable delays are also feasible, as well as queues at the outputs of the functional units.

As represented in FIG. 3, the CAM comprises two components, the on-chip cache component 306 and an off-chip main memory component 308 that is constructed from conventional RAM; (collectively, these components are referred to as the content addressable memory, or the CAM, 310). The on-chip cache 306 is small and fast memory that is used to feed data into the functional units 302, and attempts to minimize off-chip accesses by storing a shadow copy of data that will be needed in the immediate future. The off-chip memory 308 is much larger and slower relative to the on-chip cache 306, and is managed by the hardware using data structures, as described below. As described with reference to FIG. 1 and as noted in FIG. 3, the off-chip memory 308 may be virtualized for even more capacity by storing parts of it on disk, as is known in general with virtual memory.

In accordance with an aspect of the present invention, the CAM architecture virtualizes the main memory in a way that normal processors do not. More particularly, the CAM 310, also referred to as an associative memory, is used as the main storage and synchronization mechanism for the machine. To this end, and in general, every piece of data in the system is assigned a unique tag that the program uses to reference that data. The data, and its associated tag, are stored in memory using a hardware-managed allocation system. As a result, the hardware can help prevent random access patterns by using various clever storage techniques.

Figure 4:
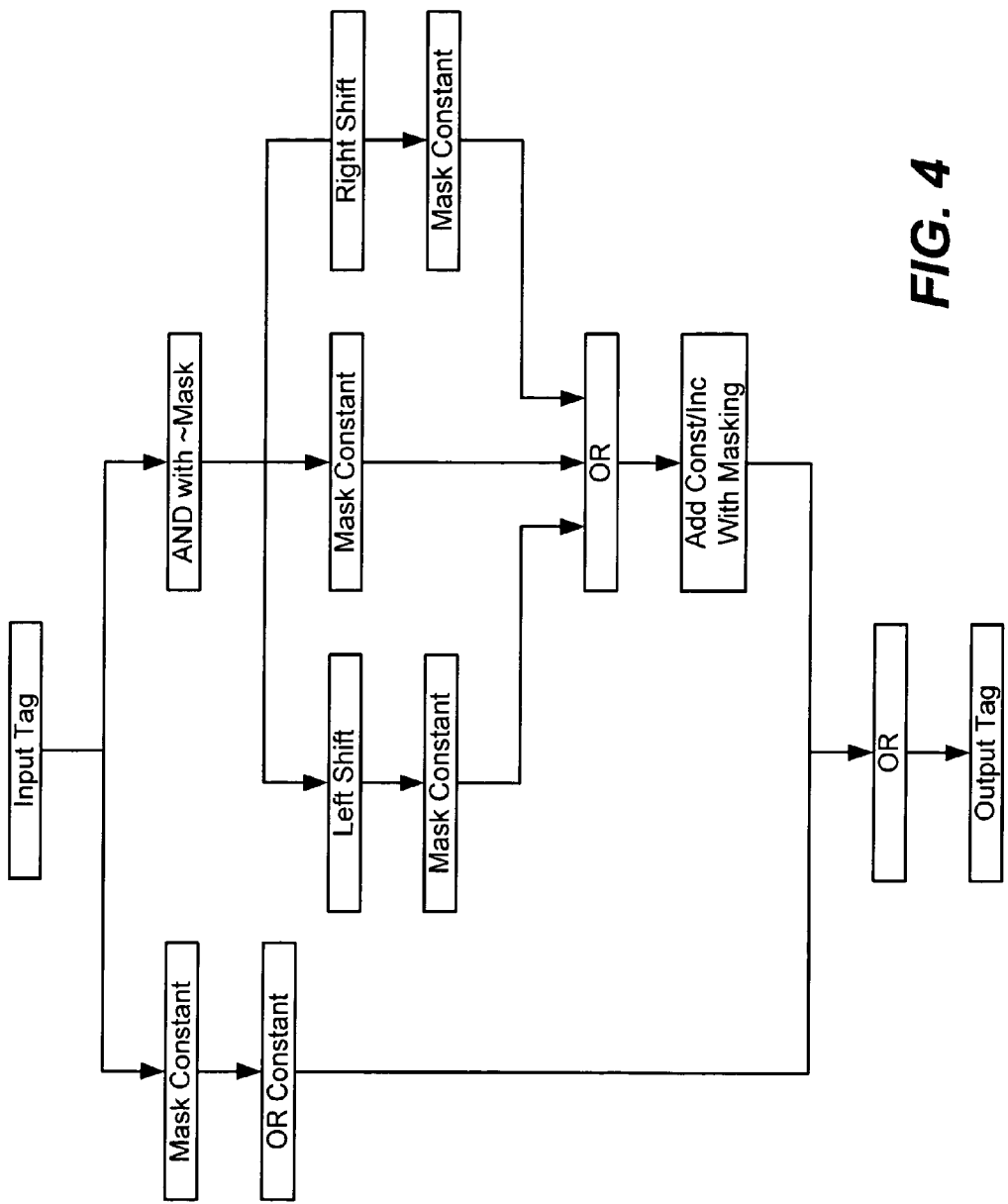
FIG. 4 is a representation of various ways to manipulate a tag used in a CAM architecture to identify and store data, in accordance with various aspects of the present invention.

One suitable example tag generation mechanism used in the CAM architecture is a process that tagged data items use to travel from one part of the dataflow graph to the next. This process is described below, but in general, one concept of the tag generation hardware is represented in the conceptual model of FIG. 4. In FIG. 4, an output tag is generated as some function of the input tag. Various masking techniques, Boolean operations, shift operations and additions are possible to convert a desired input tag to a desired output tag. Note that as described below, the CAM handles the tag generation, and only data sent to the computational hardware; (note that there are times that tag-related values are sent as data into the computational hardware). Further, note that the operations shown in FIG. 4 are only intended to illustrate the concept in general, and are not intended to represent a full set of functionality that will be likely required in a given machine.

Thus, in addition to acting as storage, the CAM 310 also provides a synchronization mechanism for the system. Tag/data pairs are collected as they are produced, and they are organized for later retrieval. For example, the CAM will have a tag for identifying data to be input to the computational hardware, provide the data in the form of operands to the computational hardware for consumption (e.g., in a FIFO queue), and re-associate the resultant output data (e.g., in another FIFO queue) with an output tag that is based on the corresponding data's input tag. Tags can be generated so that data values that will be used in the same operation by following configurations have adjacent locations in memory, which facilitates fast retrieval.

As data is created, the data is forwarded through the memory hierarchy so that (ordinarily) it comes to rest in close proximity to the other operands with which it will later be used. For example, if the quantity A is computed, it will be forwarded to come to rest next to B, so that when C=A+B is executed, both A and B will be in close physical proximity in the memory. This concept is described below with reference to operand sets.

Further enhancements result from similarly placing all or most of the data that a given sequence of operations will need in close proximity. In other words, not only are the individual A and B elements of the computation above next to one another, but if there are several pairs of A's and B's that need to be added together, the pairs will also be physically close to one another in main memory. This facilitates faster memory accesses than may otherwise be possible.

In accordance with an aspect of the present invention, via tags, the CAM architecture introduces the concept of objects at the hardware level, including as a means of simplifying the programming model as well as a mechanism to introduce parallelism into the system. In general, every operand that is used in the CAM architecture can be thought of as an object referenced by a unique tag, which as described above allows tracking the operands used in intermediate computations. These operands are combined to form bigger objects, which may be then referenced by code blocks and processed as a whole.

Dataflow machines work well in an object-oriented programming model. Object-oriented languages have been defined and are used on many processors today, however, the code running on a contemporary processor has no concept of an object, and in fact the object-oriented model only presents an illusion of object-oriented behavior to the programmer. Object-oriented programming is thus an organizational tool for the programmer that is only syntax deep. For example, while it is possible to write source code for a vector addition operation of the form:

C=A+B;(where A, B and C are vectors), internally the source code will ultimately result in something close to the following being executed:

for (i=0;i<n;i++) C[i]=A[i]+B[i].

In keeping with the present invention, the elements of a particular object may share a common pattern (e.g., a prefix)

of tag bits that are used to reference the object. The index i in the above example is represented as variable bits in the tag, and these are used to keep iterations separated in the tag space. For example, the vectors A and B in the above example may have a common tag prefix, and each index i is allowed to select a particular A[i], B[i] pair using the low order bits of the tag. The hardware provides mechanisms for managing these objects (tag spaces), effectively replacing the garbage collector in a more conventional system.

To attempt to maximize the use of available parallelism, the CAM processor uses the object-oriented programming style as one mechanism. When the user specifies an operation between two objects, the iteration variable is implicit, as described below. The hardware is then allowed to process the elements of those objects in any order, using as much parallelism as possible. This is essentially equivalent to loop unrolling at a hardware level.

This technique allows for both spatial and temporal parallelism. Depending on the number of elements in the objects, the effective setup time of the processing pipeline, and the processing time per element, the hardware may elect to configure a wide, highly-parallel processing configuration, perhaps only processing one element per node. On the other hand, the hardware may also be configured in a more pipelined fashion, such as a very narrow configuration with only one processing element. These types of decisions can be made at runtime to match the execution conditions present on the processor.

Further, if some elements of an object require a longer processing time than others, or if some elements are ready for processing while others are not, the present invention generally makes it possible for the elements to be processed out of order, so that more optimal use is made of the computational resources. For example, in a loop that iterates on the elements of a vector, some elements may require more iterations than others. In such a process, it may be beneficial to allow the elements that exhibit early termination to fall through the loop for further processing, while allowing the elements that require more iteration to remain behind. This is beneficial overall because the later stages of the algorithm are allowed to begin executing earlier than they would if the elements were required to exit the iterative step in order, and for example, the first element happened to require many iterations.

Another advantage is that the computational pipeline will be kept more full. By way of example, if the pipeline is five time cycles long, then each iteration of a particular operand will require five clock cycles to complete. If the first operand needs five iterations, then twenty-five clock cycles are spent on that one computation. However, other operands can occupy the "empty" pipeline stages during those same twenty-five clock cycles. If those other operands require fewer iterations, then they will stop iterating sooner, thus freeing up their slots in the pipeline for new operands. Thus, it would be possible for many other operands to complete the loop while that one twenty-five-cycle long computation is also performed.

As an additional benefit, this type of parallelism has the effect of averaging the execution time of the iterative step across the elements, so that a few individual elements that require many iterations will be balanced against faster iterating elements that are dropped into the loop and quickly fall out. This may be important for scheduling, as execution path lengths in the dataflow graph are matched for optimal performance.

By way of example, consider a vector, where it is desired to find the square root of each element using Newton's Method. The exact number of iterations needed to compute the root is not known in advance, and each element may require a different number of iterations. However, using an object-oriented approach to the vector, elements can be processed and completed in any order, while ensuring that the computational nodes are kept occupied to a significant extent.

Thus, the CAM architecture further improves on various other models by treating entire data sets as objects with respect to the memory system. A single request can be issued from the processing node for all operand sets of a particular tag space. The network can then be used in a circuit-switched manner to deliver the operand sets satisfying the request, with very little management overhead per operand. In contrast, systems that steer every tag/data pair individually have a more overhead intensive task. By managing objects comprised of many operands rather than the individual operands themselves, a system may add additional computational nodes to scale up the processing capabilities of the machine. Because the CAM 310 is treated as a more monolithic structure, there are fewer problems with overflow and deadlock as a result of the size of a per-processing node associative memory.

Another goal of a parallel system is scalability, in which adding more computational resources to the system results in faster solution times. The degree to which this is true depends on the computation and on the architecture. Every computing problem has a limit on how much parallel computation can take place, and the CAM architecture allows the expression of the algorithm's natural parallelism through the use of objects (tag spaces). The system can then apply as much parallelism as possible to complete the task, as described herein.

In terms of architectural constraints, bottlenecks may appear in either the data processing section of the machine, or in the control section of the machine. One of the benefits of a dataflow computing model is that it inherently reduces the data dependencies of a computing problem towards the least possible that are needed to correctly complete the computation. Further, operations are local to each processing node, whereby it is possible to use a distributed control structure to efficiently process a dataflow graph. The data is also local to each node, giving it the same benefits. By constructing the machine architecture to take advantage of the locality of data and control to allow fully distributed processing, scalability inherently results.

As can be seen in FIG. 3, unlike processors having an internal cache, the CAM architecture of the present invention separates the associative memory (CAM) 310 away from the processing element (functional units) 302, and accesses the memory as a separate shared resource on the computing network. As a result, processing elements alone may be added as a unit of scalability. When a processing element executes, the element requests an object (tag space) that may comprise many operands, each of which will be run through the processing element when its operand set is complete. Note that in contrast, other dataflow architectures divide a machine into nodes that each contain an associative memory for operand matching, along with a processing element; the unit of scalability is the associative memory/processing element pair. Moreover, in conventional processing, data is retrieved and stored in a main memory, which has a limited bandwidth. Conventional microprocessor hardware attempts to lessen the bandwidth-related problems of data retrieval and storage by using a hierarchy of cache memory, followed by off-chip main memory. The small, but fast, cache is used to mirror the larger, slower, off-chip memory in the anticipation that future accesses will either request the same data, or data that is in the same vicinity as the last data access. However, the conventional hardware does not have much control over the pattern of memory accesses that the software chooses to use. As a result, it is possible for a program on a normal microprocessor to access the memory in such as way that the cache provides little-to-no benefit.

Turning to another general design aspect, computer application programs tend to be either "processor bound" or "I/O bound," where processor bound applications are characterized as spending more resources (and time) performing computation and less time moving data, while I/O bound applications tend to spend more resources (and time) moving data and less time executing code. Typically, it is more difficult to architect a machine for I/O bound applications than it is to architect one for processor bound applications, because of the limitations of I/O subsystems such as disk and off-chip memories. Moreover, an architecture that is designed for I/O bound applications will generally perform better at executing processor-bound applications than a processor-bound architecture will perform executing an I/O bound computation. As can be readily appreciated, as the amount of computing power that can be placed on a single chip increases, applications will become more and more I/O bound.

Many applications that have a high degree of parallelism are also I/O bound, and thus the CAM architecture design of the present invention attempts to provide I/O capabilities. The architecture of an (e.g., run time reconfigurable) machine generally comprises programmable computing elements (functional units) 302, a routing network 304 to move data between them, some type of control and memory. The elements for good I/O performance comprise the routing network and the memory.

The routing network 304 determines the flexibility of connections between functional units 302. A more complex network, such as a crossbar, allows arbitrary or nearly arbitrary connection patterns at the expense of more chip real estate. A less complex network, such as a bus, will still allow arbitrary connection with small real estate cost, but at the expense of performance due to time multiplexing. Other networks, such as meshes, are a compromise between the two extremes by offering good connectivity to nearest neighbors. These do not suffer the full performance penalty of buses, but also do not offer the full flexibility of a crossbar. This can lead to internal fragmentation of the functional units while trying to satisfy the allowable arbitrary patterns of a dataflow graph, and so can end up wasting functional unit resources. In addition, routing constraints imposed by the network may force the dataflow graph to be broken into smaller pieces leading to a need for additional buffering, which can spill into off chip memory.

Because the CAM architecture is primarily directed towards providing a high-performance machine for highly parallel problems that will likely exhibit I/O bound behavior, it is desirable to maintain maximum connectivity while minimizing the impact to chip area. Thus, one implementation uses a crossbar as the primary on chip interconnect 304. Note that its typically large space requirements may be mitigated, such as by the choice of a digit serial arithmetic scheme.

More particularly, digit serial arithmetic comprises an alternate numeric representation technique that can be used to represent floating point numbers. Digit serial arithmetic proceeds from most significant digit to least significant digit rather than the least-to-most approach to which most programmers and machine designers are accustomed. It can do this because later digits are allowed to make some corrections to earlier digits, within some tolerance. The tolerance can be thought of as the interval of calculation at any given digit step.

Although not necessary to the present invention, there are advantages to using digit serial arithmetic as a representation scheme for the machine, including that digit serial techniques produce the most significant digit first, thus it is literally possible to begin the next computation before the previous one has completed. A digit serial machine can be pipelined from one operation to the next on a digit by digit level. In terms of a pipeline structure, any function can be reduced to a single clock cycle in the limit of operation. Further, digit serial data paths can be much narrower than typical word-wide paths. This reduces the area needed for data routing and makes richer interconnect structures possible in the system. More interconnect means that larger dataflow graphs can be represented concurrently on the chip, as well as making the mapping problem easier. It can also mean that more functional units are included on the chip because there is now more space for them.

The individual digit operations for digit serial can be made quite simply, such as with shifts and adds. Thus, it is possible to clock such a machine at very high rates. It is also possible to construct more complex functions than the standard add, subtract, multiply and divide in a single digit serial node. For example, transcendentals can be implemented, as well as other functions of interest. Moreover, the function of a particular node can be changed simply by modifying a few starting parameters, which fits in well with a reconfigurable architecture. Notwithstanding, although digit serial arithmetic may be a primary computational method in a CAM architecture, and in other architectures as well, the CAM architecture can function without digit serial arithmetic.

To an extent, CAM is similar to a normal RAM in that data is stored at a particular address, and that address can be used to retrieve the data. However, there are several differences between a CAM and a RAM, including that the CAM 310 facilitates fast parallel search and retrieval operations, including by requesting a particular tag to see if it exists in the memory. Unlike RAM, the CAM 310 allows a partially-specified tag to match a range of individual tags in the CAM 310 and retrieve them all in succession. While possible in a RAM, such an operation requires a software search.

Moreover, the CAM 310 can be used as a hardware-managed sorting device, whereby the hardware provides large speedups for certain algorithms. Sorting is accomplished in the CAM 310 by using the key value as part of the tag, and then allowing tag ranges to be retrieved from the CAM 310 in sorted order. Note that tags are not necessarily retrieved in sorted order; rather, the key value used for the sort can be included as part of the tag which will create a similar effect. Even though the tags themselves may be retrieved out of order, the fact that the key value is included in the tag will allow mechanisms to know the relative order of a particular tag in the set.

Still further, in the CAM 310, the size of the tag may be much wider than the address width of the corresponding RAM. In other words, there may be thirty-two address lines on a four gigabyte RAM, which in a direct-addressed scheme would limit the tag width to essentially 32-bits. However, the CAM 310 manages the memory so that even though the physical size of the memory may be four gigabytes, for example, the tag width can be much larger, e.g., 64-bits, or more. Wide tag widths are valuable for some operations, such as recursion where many tags may be required, as described below.

Tags themselves are not exposed to the computational hardware 302. Rather, they are maintained entirely within the CAM components 306 and 308, except when included as part of the data stream for further manipulation and computation, as described below. As described above, waves of data are launched into the computational hardware 302 and re-associated with their tags as they return. Therefore, an input tag may be stored in a FIFO as its data is launched, and then retrieved in FIFO order as data waves return from the instantiated sub-graph in the functional units 302. In the CAM architecture, there is no need for tag transformations to take place within the computational hardware 302, whereby some resources can be conserved by keeping them entirely contained with the CAM 310. In other words, there is no need to maintain a hardware path for the tags that parallels the flow of the data; rather, the data can be launched into the system and leave its associated tags behind in the CAM to be rejoined when the data returns.

As generally described above, an operand set is the set of values needed to generate one result. For example, when evaluating 2*(3+7), there are three operands, namely 2, 3 and 7; when all three are available a complete operand set has been assembled. An operand set is specified by the tag or tags associated with the data values. Two methods of specifying and using the tags associated with the data to form an operand set, a fixed prefix model and a functional input tag space model, are described below. Note that these methods are only non-limiting example, and other methods are feasible.

When all the operands for a given operand set have been assembled, that operand set is eligible for emission from the CAM into its corresponding configuration when run. Typically, only complete operand sets are emitted from the CAM.

In accordance with an aspect of the present invention, by using tags to identify unique operand sets, computations can be allowed to proceed out of order, and recollected later for further processing. Out-of-order processing allows greater computational speed in a number of ways, including that multiple parallel processing units can compute a large set of operand sets simultaneously. These may subdivide the tag space into smaller fixed sized regions, or the processing units may opportunistically fetch and execute operand sets as they become available. The opportunistic fetching approach has the advantage of potentially shorter processing time, since no artificial boundaries of computation have been imposed, whereas a subdivided tag space can allow for better cache management.

Non-ordered processing is also advantageous if a computation has variable latency. Such is the case for many iterative algorithms where the exact runtime is different for each operand set. In this situation, a set of processing units that opportunistically reads operand sets from a tag space is particularly advantageous, because the total processing time for any given subset of the data is unknown.

Figure 5:
FIGS. 5 and 6 are representations of various ways to arrange a tag, such as with a fixed prefix, in accordance with various aspects of the present invention.
Figure 6:
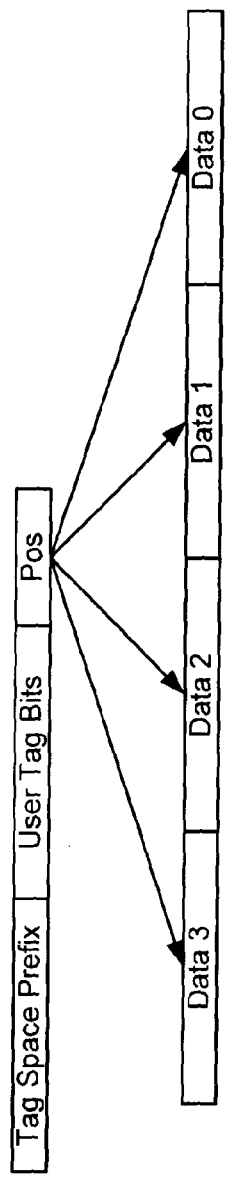

As described above, a tag is used as a unique label or identifier for every data operand in the system. One type of tag uses a fixed prefix input tag space concept of operand set assembly, which is very straightforward. An example of a typical tag in this system is represented in FIGS. 5 and 6. A tag space is defined by a common set of prefix bits in the tags of the data values it contains. Individual operand sets within that tag space are identified by having a common set of midrange bits, in addition to the common prefix. These midrange bits are used to distinguish things like iteration number, vector index and operand number. They can also be used for searching and sorting operations by replacing them with a key value from the data stream. Individual operands of a given operand set thus typically differ only in some of the least significant bits of their respective tags.

In the example of FIG. 5, the upper 16-Bits of the tag specify the tag space to which the tag belongs. Note that each configuration has a unique input tag space and these bits are how uniqueness is distinguished.

Following this are 29-bits of "user space" in the example. These bits do not need to be contiguous, and there are no real restrictions on values used. These bits can be used for any purpose that makes sense for a particular application, however in practice, these bits are used to separate operand sets in the input tag space of a configuration. Because the middle 29-Bits specify the particular operand set to which the tag belongs, any two tags that have the 16-bit prefix and these 29-bits in common will be placed in the same operand set.

The three least significant bits, referred to as Data (or Pos in FIG. 5), are used to indicate which "slot" the data associated with this tag will occupy in the operand set. The slot will be coupled to a particular path into the configuration, such as the right side of a division operator, for example. In the example of FIG. 5, the lower 3-Bits indicate which of eight possible operands within that operand set the associated data is meant to fill.

Note however, that the User bits and the Pos bits can tradeoff to some extent, depending on the size of the operand set for this tag space. Thus, the number of operands in the operand set can be allowed to vary, as shown in FIG. 6 where there are four operands in the operand set. If the tag space uses operand sets of four operands, then there would be thirty user bits and two Pos bits. If the tag space uses operand sets of one operand each, then there would be thirty-one user bits and one Pos bit. Note, however, that the examples of FIGS. 5 and 6 use 48-bit tags, and wider tags are available.

Figure 7:
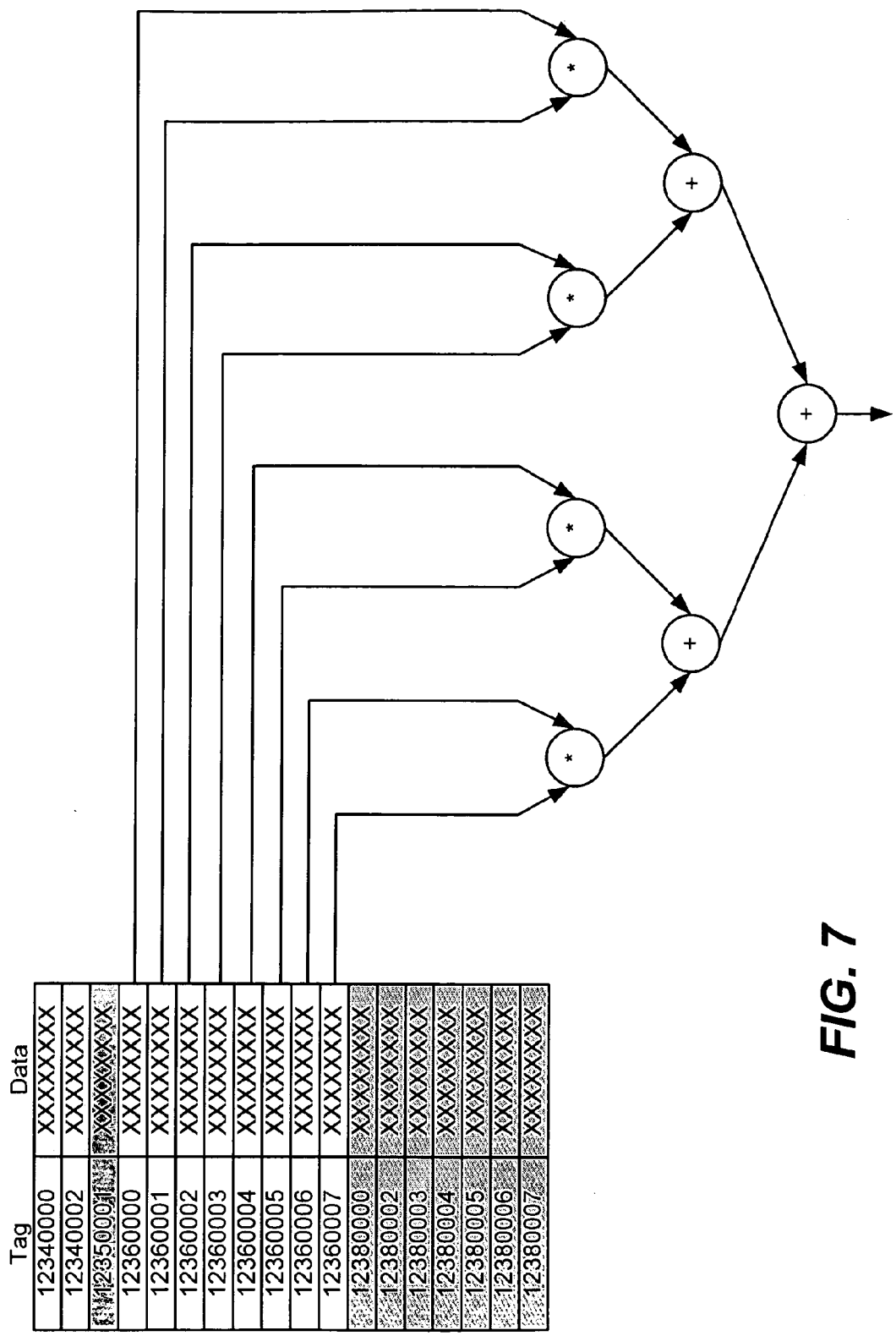
FIG. 7 is a representation of a complete operand set being emitted from a CAM to requesting computational hardware represented by graph nodes, in accordance with various aspects of the present invention.

The fixed prefix input tag space concept is further illustrated in FIG. 7, wherein the CAM contents are represented on the left of the drawing, having several operand sets forming with the common tag prefix 0*1236. Note that eight operands are needed to form a complete operand set in this example (four operators, each needing two operands to fire). The topmost set (prefix 0*1234) has two operands, the next set (prefix 0*1235) has one, the next set (unshaded, prefix 0*1236) has the full eight operands and the lowest set (prefix 0*1238) has seven. Because the unshaded set has the complete amount of operands, eight in this example, the set is sent out to the configuration for processing, as represented by the arrows connecting from the tagged content to the nodes on the right side of the drawing. The remaining operand sets remain idle in the CAM 310 until they have been completed.

An operand set is complete if all of its member operands are valid. Each configuration (computational kernel) of the CAM architecture has a single input tag space specification, namely the common prefix bits. Upon execution, the CAM 310 will begin emitting tags from that space for processing. Generally, the CAM only emits completed operand sets from the input tag space, (although there are exceptions where it is desirable to emit operand sets that are not completed). As the configuration executes, the CAM 310 emits new data values that are associated with new tags that are a function of the input tags. These new tags fall into the input tag space of their consumer configurations for later processing.

In this manner, the generation of tags is "feed forward," essentially meaning that the producers of tags for a given consumer direct their tags into the same tag space. This helps the hardware route the data, and forms it into natural partitions for the system. The tags can be easily arranged in memory so that tags that are adjacent in terms of tag value will also be adjacent in memory. This memory adjacency allows the hardware to use fast RAM burst accesses to stream in complete operand sets that can then be forwarded to the computational hardware 302 for processing.

This model of computation attempts to ensure that values that will be used together in the same computation are physically adjacent to one another in RAM so that they can be quickly retrieved at execution time. Note the contrast to many control driven programs, where data is retrieved from potentially widely-disparate memory locations. Accessing locations that are not proximate in the RAM address space has costs in terms of longer access times from the external RAM, due to the need to initiate extra bus cycles and the potential for RAM page changes, which are very costly. These effects can be mitigated to some extent by caching other data that is proximate to each of the disparate locations, but there are limits to its effectiveness.

Note that in the fixed prefix input tag space concept, the data needs to be shuffled and arranged at some stage of processing, which is essentially during data production. As each data value is produced, an associated tag is generated for it based on programmer-supplied constants and a functional relationship to the input tags. The new tag/data pair is then sent into the CAM 310, where it is routed to the appropriate place in the on chip cache 306 as well as in the external RAM memory system 308.

In this stage, it is possible for the generated tag/data pairs to be sent to widely-disparate memory locations. However, in general, it is easier to deal with write scatter effects than read scatter effects. If a read request is issued that corresponds to too many different locations, the hardware has to access the external memory system and read all of the data, possibly along with extra data from each location, in the expectation that it may be needed later. Write requests to disparate locations can be kept in the cache for a period of time, in the hope that other writes will be issued to other locations that are close to one of the previous writes. In such an event, the hardware can accumulate several writes that can be issued as a unit to a single area of the RAM, without dealing with costly RAM page changes. In a generally worst case occurrence, a particular write may be issued to a location that is alone, with no other writes are issued near it. Nevertheless, this situation is preferable in one implementation, because only a single write needs to be accomplished to the target location, rather than a series of reads that might be performed by a cache hoping to fulfill some future request for data that may never arrive.

An extension to the fixed prefix model comprises a functional input tag space model, which attempts to address problems with the fixed model while also providing enhanced functionality. Note that any fixed prefix input tag space system can be implemented using the functional input tag space model, e.g., with a very simple function. In the functional model, in which one tag is generated as a function of an input tag, the User bits field essentially extends entirely to the left, whereby the prefix has no special meaning, and the operand set concept is handled as an on-chip cache abstraction. Functionally-related tags still may be stored in the same places in physical memory using the same data structures. The Pos bits still indicate the operand number within the operand set, although this can also be one of the calculated bits and thus change from operand to operand. Because one implementation favors indexing across the low order bits of the tag, programmers typically should do the same for maximum efficiency.

One of the issues with the fixed prefix model is the need for data replication in some situations. Consider a normal matrix multiply:

$$\begin{bmatrix} a_{00} & a_{01} & a_{02} \\ a_{10} & a_{11} & a_{12} \\ a_{20} & a_{21} & a_{22} \end{bmatrix} \times \begin{bmatrix} b_{00} & b_{01} & b_{02} \\ b_{10} & b_{11} & b_{12} \\ b_{20} & b_{21} & b_{22} \end{bmatrix}$$

Figure 8:
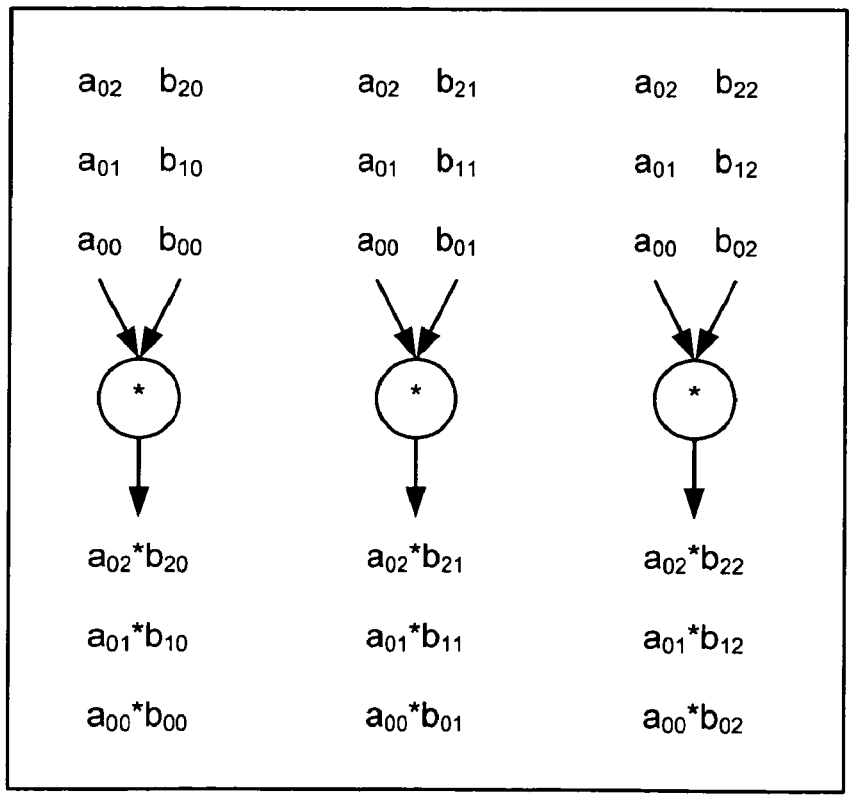
FIG. 8 is an example of handling a matrix multiply via functional input tagging model, with data flowing from a CAM to computational hardware, in accordance with various aspects of the present invention.

Each of the rows of A is multiplied by each of the columns of B in order to obtain a result. The fixed prefix input tag space model requires that each row of A be replicated three times, with each replica then matched to a column of B. This produces nine distinct products that are then summed appropriately, as represented in FIG. 8. Three copies of every element in A are needed so that they can form a unique operand set with the elements of B and produce unique products. These operand sets are placed in the input tag space of the multiplication operator and then processed. In the example of FIG. 8, three multiplication nodes are shown, but the example could have used a single multiplication node as well.

This type of data replication is generally detrimental to on-chip and off-chip bandwidth, since duplicate data is being produced which the system has no choice but to handle as unique data. Since each of the three copies of the data in the example has a unique tag, the system can only assume that the data is unique as well. This excess data causes the requirements in the on-chip cache 306 to unnecessarily increase, which can push its own or other data off-chip. Such a condition is undesirable due to the slow speed of external memory accesses.

Figure 9:
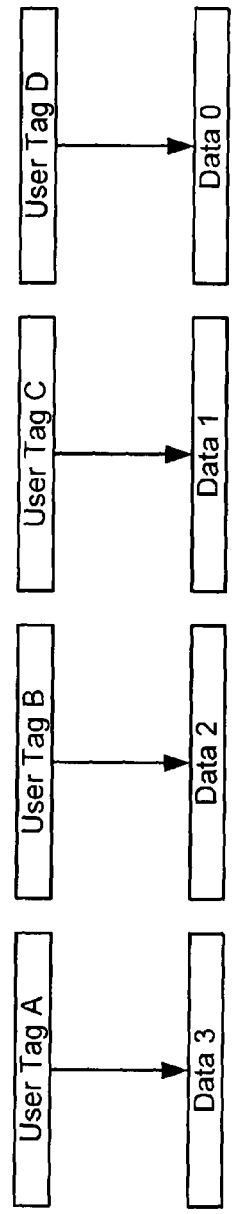
FIG. 9 is an example representation of the concept of a functional input tag space model, in accordance with various aspects of the present invention.

Instead, a better model is achieved by allowing the operand sets to reference the elements of A without actually duplicating the data. This requires a more general specification mechanism for the tags that are allowed to be part of an operand set. One method of building an operand set is approximated in FIG. 9, wherein each position in the operand set has a different input tag specifier, rather than the fixed prefix scheme where all operands in the operand set share the same prefix and user bits, and differ only in position. In a fully-flexible system, arbitrary tag specifiers may be placed in each of the four positions shown, so that the system needs to maintain large data structures in order to keep track of which tags form an operand set for every operator; however, while a flexible design, it likely suffers a performance penalty in order to keep track of the many relationships.

An improved system is one that does not require large relational tables, but yet allows sufficient flexibility of specification to be useful. As can be understood, the fixed prefix input tag specification is perhaps the most inflexible system possible, since it allows only a single implicit relationship between the input tags. For tag manipulation, and hence data steering, the fixed prefix input tag specification relies on the fact that tags can be altered upon output to fall into the destination tag space. However, as shown, it can cause problems of its own as a result. An improved solution uses a functional relationship between the input tags. More particularly, if each tag can be derived from any other using a programmer-specified function, there is no need for a potentially large relational table, and yet valuable manipulations of the input tags to create operand sets is possible.

Figure 10:
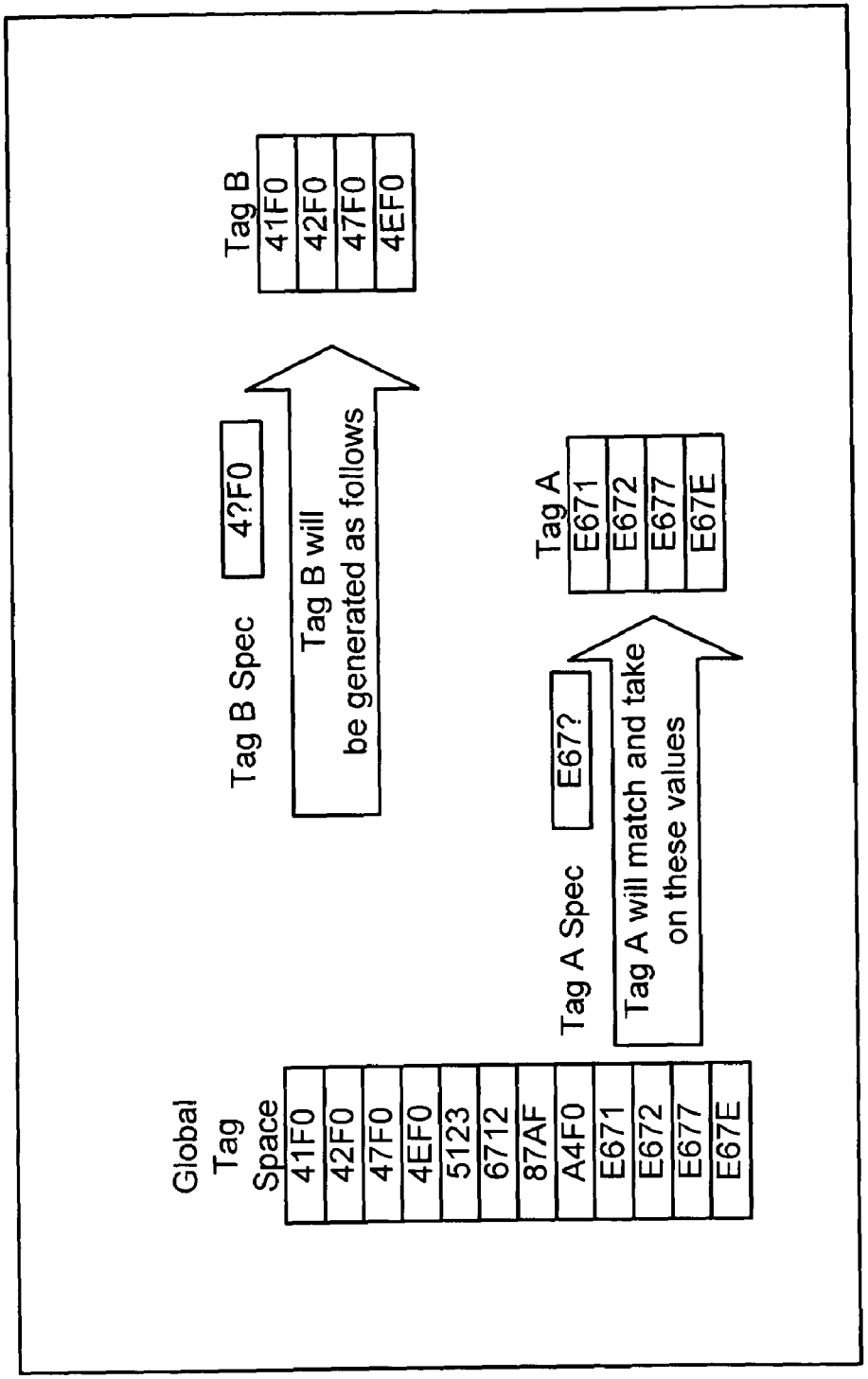
FIG. 10 is an example representation of changing input tags based on a functional relationship, in accordance with various aspects of the present invention.

The desired complexity of the functional relationship between the input tags is something that will depend on particular applications. However, a simple functional input tag space example is represented in FIG. 10, in which wildcards are used in tag generation. In FIG. 10, the specification for input tag A shows a constant prefix of E67 with a wildcard '?' in the lower four bits (nibble). The specification for input tag B has a constant prefix of 4 in the first four bits, a four bit wildcard '?' in the next four bits and a constant of F0 in the lower eight bits. When the machine attempts to construct operand sets, it accesses the CAM system to attempt to find a match for the tag A specification. The first match it finds is E671, which now fixes the wildcard position to be 1. The wildcard value of 1 is substituted into the wildcard position of tag B, resulting in 41F0. The machine will then attempt to retrieve tag 41F0, and in this example that tag is found, completing the operand set. If 41F0 had not existed, the operand set would not have been completed and the machine would move on to the next matching tag A with no emission to the computational hardware. As can be seen in the example of FIG. 10, there are four tags that match the tag A specification, and each one has a matching entry in the CAM for tag B. Any completed operand sets that are found result in the associated data being forwarded into the computational hardware 302 (FIG. 3) for further processing.

In general, the system searches for any entry that matched the specification for one of the tags, and then derives the tags that are related to it by applying the specified transformation function. The functional relationship can be more complex than simple wildcard replacement. Consider the following vectors, along with the examples of FIGS. 11-13, in which the wildcard variables i and x are used:

VectorA [$a_0$ $a_1$ $a_2$ $a_3$] VectorB [$b_0$ $b_1$ $b_2$ $b_3$]

Figure 11:
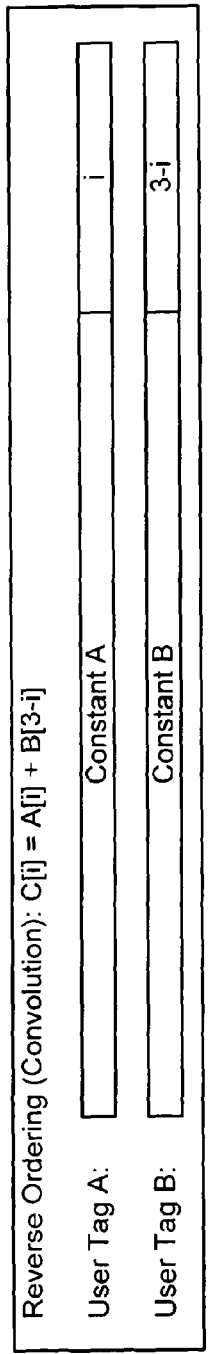
FIGS. 11-13 are representations of some example input tag space functions that are possible in a functional input tag space model, in accordance with various aspects of the present invention.
Figure 12:
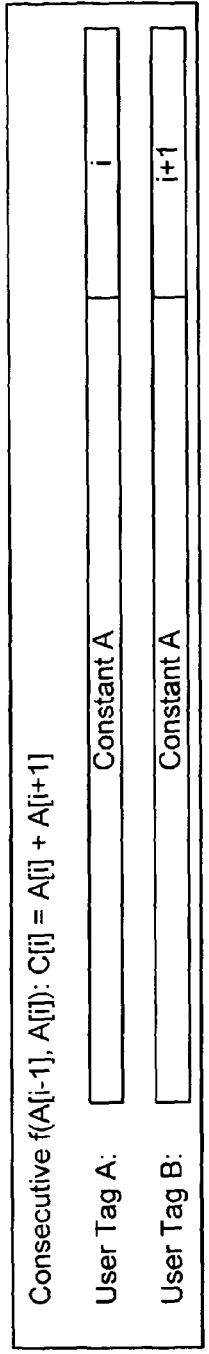
Figure 13:
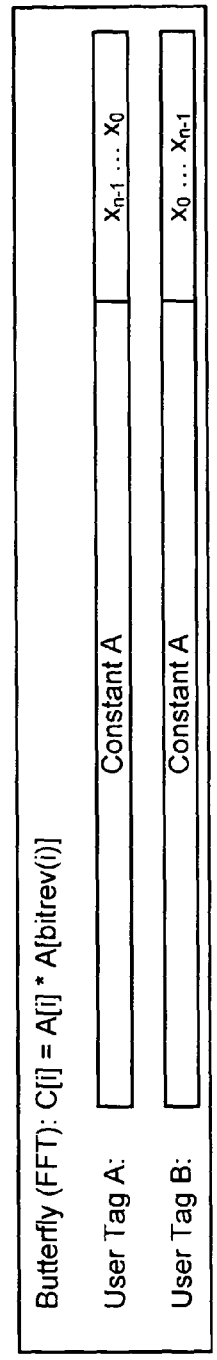

In the example represented in FIG. 11, the elements of A are pair-wise added to the elements of B, however the elements of B are accessed in reverse order. In FIG. 12, a Fibonacci-like sequence of a "consecutive" example shows how values from the same vector can be referenced, as does the "Butterfly" example of FIG. 13. As can be seen, interesting mathematical or bit-swizzling functions may be applied to the wildcard bits to obtain the derivative input tag or tags. These functions are similar to what might be performed on the bits of an output tag, and in fact could be identical in functionality.

Figure 14:
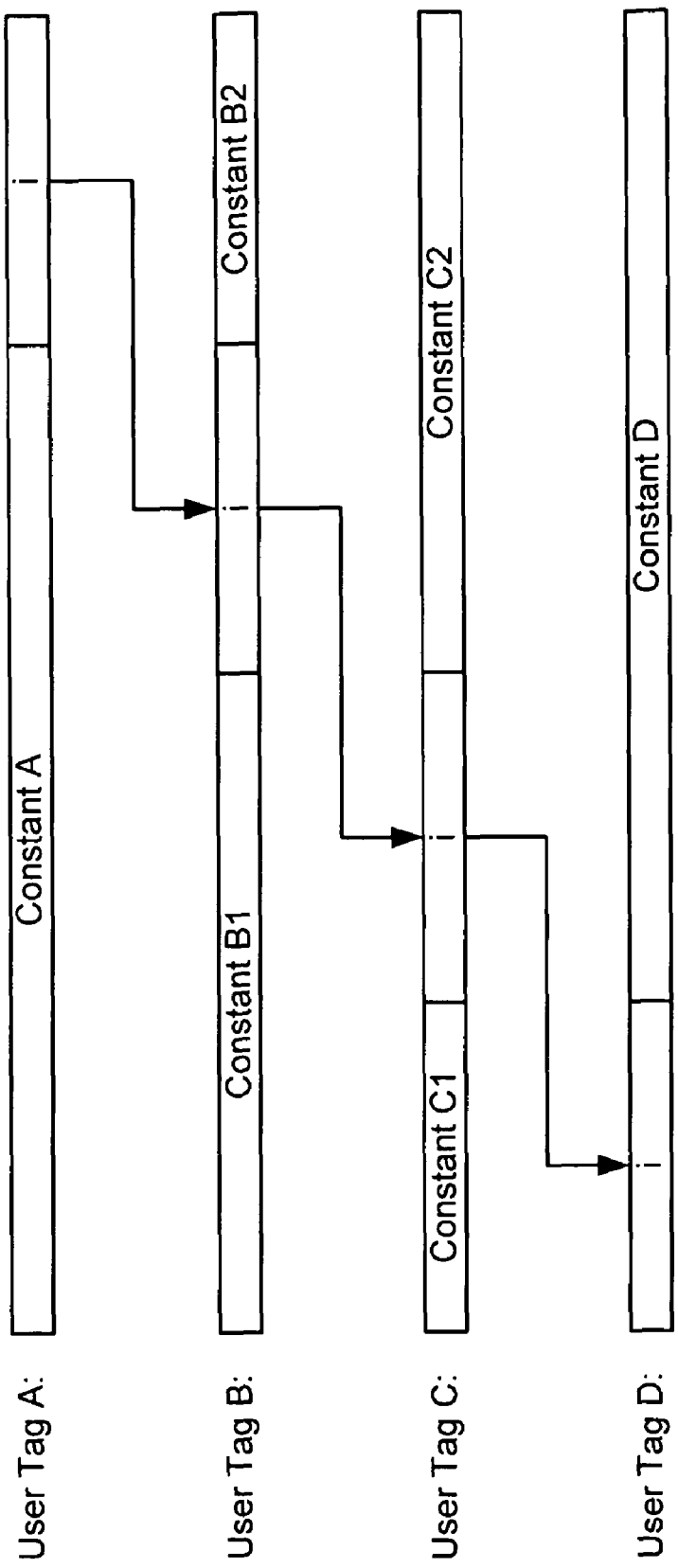
FIG. 14 is a representation of example functional tag space matrix index manipulations that are possible in a functional input tag space model, in accordance with various aspects of the present invention.

An example of index swapping for matrix multiplication is shown in FIG. 14. In FIG. 14, the index i is moved across four fields for four different input tag specifiers, potentially multiplying four different matrices together simultaneously.

The input tag specification can be thought of as an address in a large memory with wildcards that allow it to match multiple memory locations. The wildcards are filled in at runtime with specific bits for each of the memory locations that match the fully specified bits in the address pattern. Although these examples show the wildcard bits to be adjacent in the tag, this need not be the case. For example, the wildcard bits may be perturbed in an arbitrary pattern between the input tag spaces for any traversal relationship between the input tag spaces. Likewise, the bits that are held constant in each input tag space are independent and individually controllable. The concept of a tag space becomes more pliable as it can be redefined by changing the bit pattern and/or functional relationship between the input tag specifiers.

Figure 15:
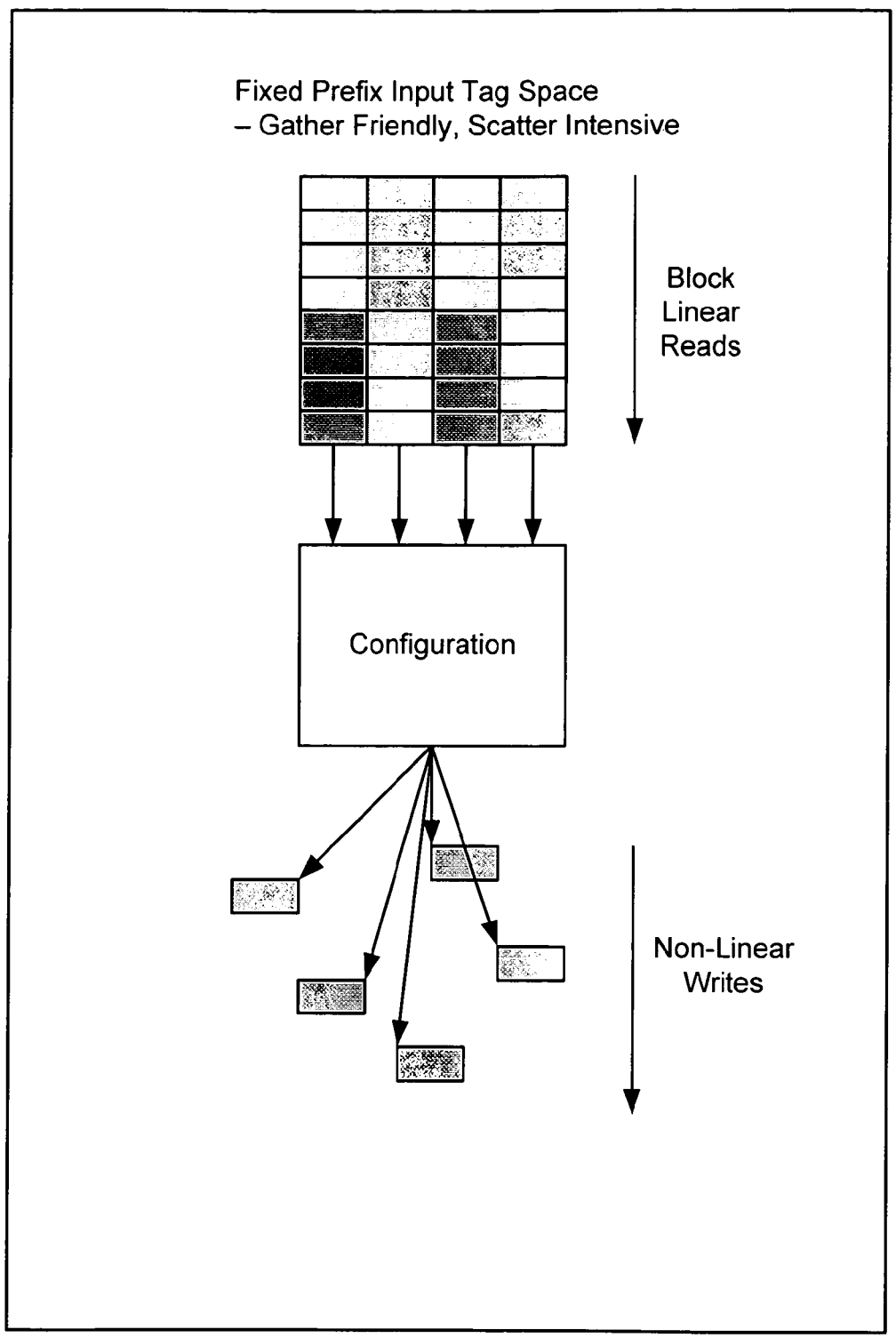
FIGS. 15 and 16 are respective fixed prefix and functional input tag space representations illustrating possible gather and scatter memory access, in accordance with various aspects of the present invention.

While the functional input tag space model adds flexibility to the system and allows an easy solution to the duplicate data problem, it also introduces potential other problems. Consider the data access patterns represented in FIGS. 15 and 16, which represents fixed prefix versus functional input tag space memory access patterns.

The fixed prefix model (FIG. 15) restricts the members of an operand set to having tags that vary only in the two or three least significant bits. Such a restriction makes this model amenable to easy clustering of the members of the operand set in memory so that they can be accessed using fast burst reads from RAM. This is possible because the operand steering happens at the output stage of a cluster, when the tag transformation function is applied and the new resulting tag and its associated data are funneled into the CAM for sorting. Once in the CAM 310 the tag/data pair is guided into the proper location in memory which is conveniently placed immediately adjacent to the other members of its operand set. Ultimately, the access pattern can be visualized as shown, with linear gather memory accesses on the input side of the configuration and a potential "shotgun" pattern of scattered memory accesses on the output side.

Figure 16:
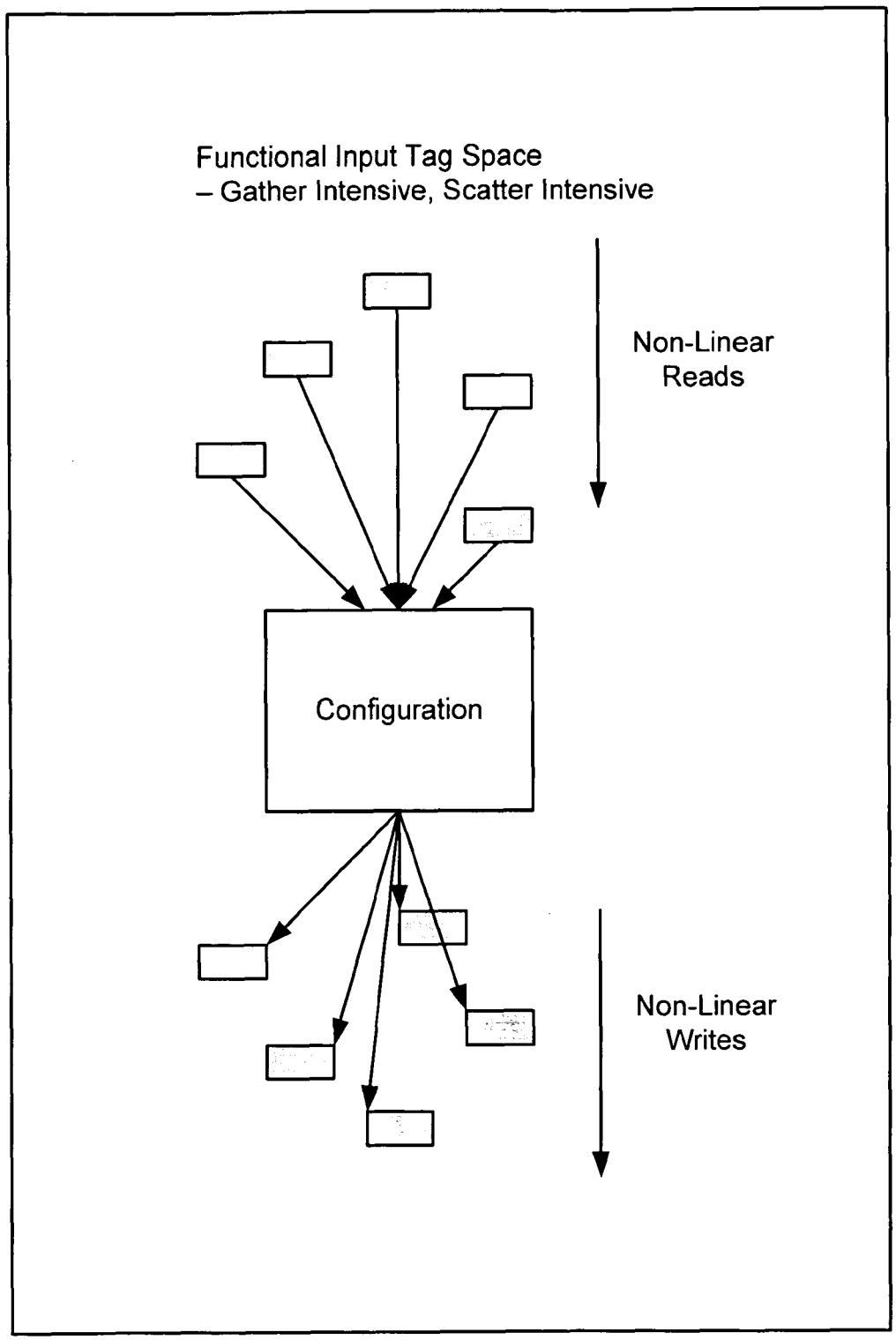

Conversely, the functional input tag space model of FIG. 16 allows more freedom in the specification of what constitutes an operand set. The functional relationship between the input operands can result in randomized read patterns on the input to the configuration, and may also exhibit random write patterns as well.

As described above, linear accesses allow fast external RAM burst modes. This is what the fixed prefix model allows on the input side of the configuration, although the output side of the configuration may still be quite random. Random write accesses are somewhat better to deal with than random read accesses, however, because the normal solution to random reads is to burst in a cache line of values near the actual read target in the hope that another value will be needed in the same vicinity. This is very speculative, and consumes external bus bandwidth, internal cache resources, and may or may not provide benefits in terms of a cache hit in the future. Random writes, on the other hand, can be cached internally for a time in the hope that another write will be performed in the near future to a location that is adjacent, or very close to, the previous write. When the time comes to evict the write data from the cache, the data in the vicinity of that first write can be burst out to memory as a block. Thus for writes, the cache can be used to buffer up known valid data for a time before it is streamed out to memory, whereas for reads, the cache is forced to do speculative reads of potentially useless data in the hope that it will be accessed in the future.

Ideally, there would be no randomness to the data access patterns, but that would be an overly-restrictive requirement that would disallow a large number of potential applications. Thus it is often necessary to access data in interesting ways, such as for FFT (fast Fourier transform) operations. In one implementation, random writes are chosen, whereby where possible, the tag manipulation is done at the output of the configuration rather than the input, even using the functional input tag space model.

However, there are times when disallowing input side tag manipulation results in large amounts of data replication that can adversely impact off-chip bandwidth to an even larger extent than do speculative reads by the cache. For example, a matrix that is small enough to fit entirely inside the cache allows any input side traversal pattern, or multiple accesses to the same elements, to be accommodated with no external memory accesses. If data replication were forced by the input tag space model, multiple (e.g., eight or more) copies of the same matrix may be forced into the cache, which may overflow the cache, or at the least force other data out of the cache, thus generating external memory accesses. In one implementation, the software is thus provided with the flexibility of a functional input tag space model, since it can also be arranged to act as a fixed prefix model, yet it should be understood that this can cause problems if used incorrectly.

There are ways of mitigating the inherent gather problems of the functional input tag space model, including providing programmers with some knowledge of the underlying hardware architecture so that they can optimize the software for it. However, while not entirely desirable, basic knowledge may be provided, such as recognizing that a particular dataset will fit into the cache and/or subdividing it so that it will fit into the cache, which is conducive to either repetitive or random accesses to that dataset. It can also be beneficial to maintain some concept of data locality, e.g., if it is known that two different objects will be used together in some future operation, it may be beneficial to interleave their tag spaces, such as in FIG. 17, which shows interleaved tag spaces for functional input tag specifications.

Figure 17:
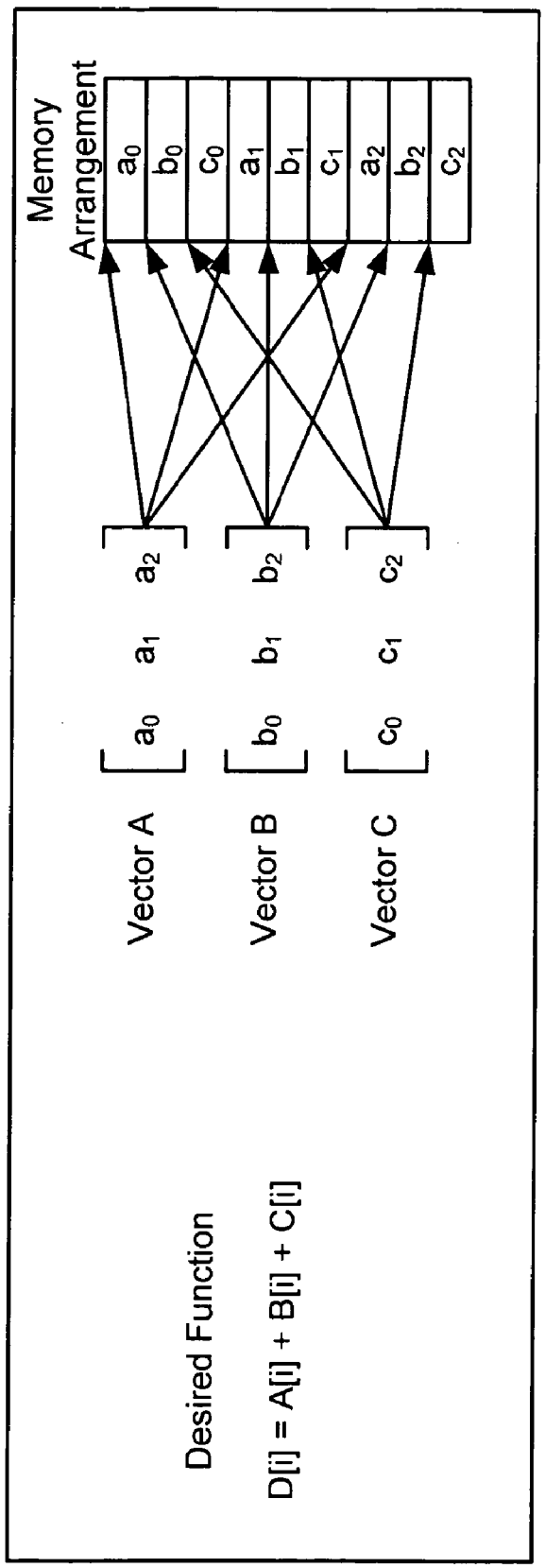
FIG. 17 is a representation of a vector-based function illustrating interleaved tag spaces for a functional input tag specification, in accordance with various aspects of the present invention.

In FIG. 17, the vectors A, B and C have been arranged with interleaved tag spaces so that they will be arranged in an interleaved pattern in memory. The software provides the hardware with a cue through configuration settings, to indicate that the elements of the operand set are interleaved. This takes advantage of fast external RAM burst accesses to read in entire operand sets in a single burst, rather than having to perform three different bursts from potentially different RAM pages to read in the same data.

Figure 18:
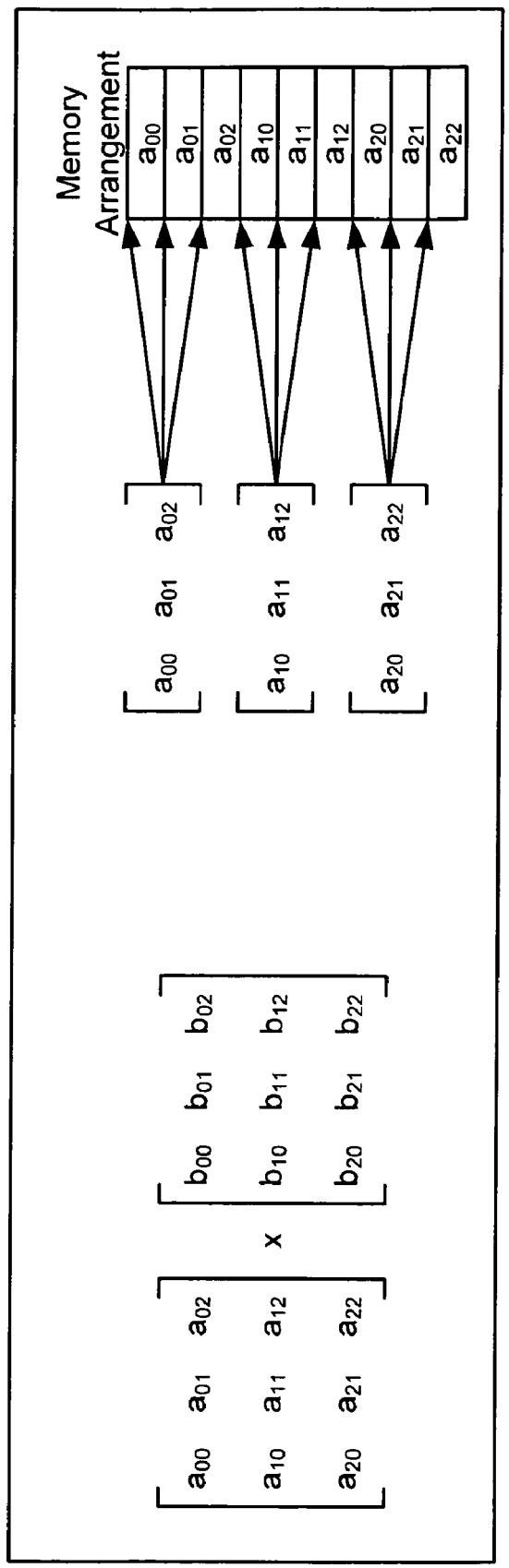
FIG. 18 is a representation of a matrix multiply operation illustrating compact tag space for a functional input tag specification, in accordance with various aspects of the present invention.

Conversely, if there is a large amount of data replication, or if the same object is used in many different locations, it may still be beneficial to pack the object so that it occupies consecutive tag locations. For example, in FIG. 18, this may be the situation if the matrix A were used in multiple calculations. In that event, its representation in tag space, and hence memory, may be packed, as in FIG. 18, which shows compact tag space for a functional input tag specification The alternatives may need to be decided based on program analysis. However, any required analysis should be simplified by the fact that the program is written in a dataflow format, which makes such dependencies explicit. This type of optimization relies on the assumption that consecutive tags will occupy consecutive memory locations, as in the model CAM architecture that encourages a stream data model.

Figure 19:
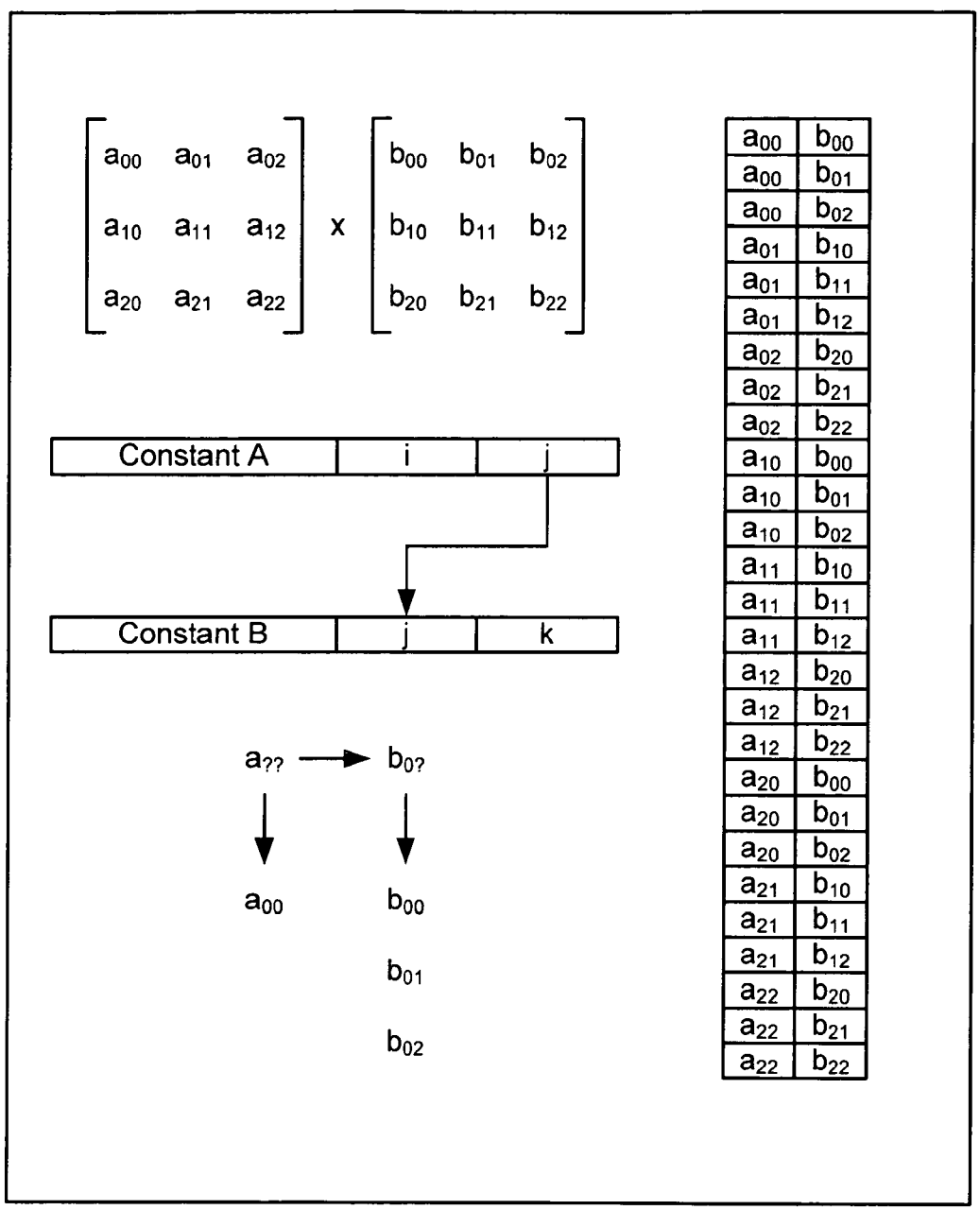
FIG. 19 is a representation of a matrix multiply operation illustrating one-to-many functional input tag space relationships, in accordance with various aspects of the present invention.

Turning to the concept of one-to-many mappings between the input tag specifiers, it will be seen that among other aspects, this leads to a more compact representation of matrix multiply. Consider the following matrix multiply of FIG. 19, which shows a one-to-many functional input tag space relationship. In FIG. 19, the input tag specifier for A has two wildcard fields, i and j. These can match any element of the A matrix. Upon finding a match, only the j field is propagated to the input tag specifier for the B matrix as shown. That leaves the k field of the B specifier as a second wildcard, which is then free to match any of the elements of B that match the j field. In the lower left portion of FIG. 19, this process is shown as the i and j fields of A bind to 0, 0, which then fixes the j field of B to be 0, but allows the k field to bind to 0, 1 and 2. In this way, the element permutations required to perform the matrix multiply are generated as shown by the column of pairs on the right. A consequence of this mapping scheme is that each of the elements of A will be fetched into the cache and can be used for all possible permutations with the elements of B, and then can be discarded. This promotes locality of reference for each of the data subspaces defined by the tag space relationships, conserving bandwidth to off-chip memory.

This extension of the wildcard concept provides a number of potential uses beyond data organization, including that the relationships between tags that are created through the propagation of wildcards through the input operands may be used to construct relational databases in the tag space. These relationships may also be viewed as a transitive property of a logic system, which could be used in a number of different applications such as artificial intelligence, mathematical manipulations, automated proof systems, and so forth. Further, Prolog and Lisp-like languages may be easily implemented using a system like this, because both languages are (in some sense) database constructs that do searches across the state space, based on some constraints.

As can be seen, the functional input tag space specification model allows powerful data manipulation while also offering performance optimizations in the presence of replicated data over the fixed prefix model. The input gather problem can be minimized through planned definition and construction of the input tag spaces, and a prefix model may still be implemented within the functional input tag space specification model.

One further use of the functional input tag space model comprises cache management. More particularly, by carefully selecting the tag patterns that are used within a configuration, it is possible to guarantee that the amount of data that is referenced by those patterns fits within the cache in order to avoid overflow. For example, consider the example of a 4*4 matrix multiply set forth below:

$$\begin{bmatrix} a_{00} & a_{01} & a_{02} & a_{03} \\ a_{10} & a_{11} & a_{12} & a_{13} \\ a_{20} & a_{21} & a_{22} & a_{23} \\ a_{30} & a_{31} & a_{32} & a_{33} \end{bmatrix} \times \begin{bmatrix} b_{00} & b_{01} & b_{02} & b_{03} \\ b_{10} & b_{11} & b_{12} & b_{13} \\ b_{20} & b_{21} & b_{22} & b_{23} \\ b_{30} & b_{31} & b_{32} & b_{33} \end{bmatrix}$$

Figure 20:
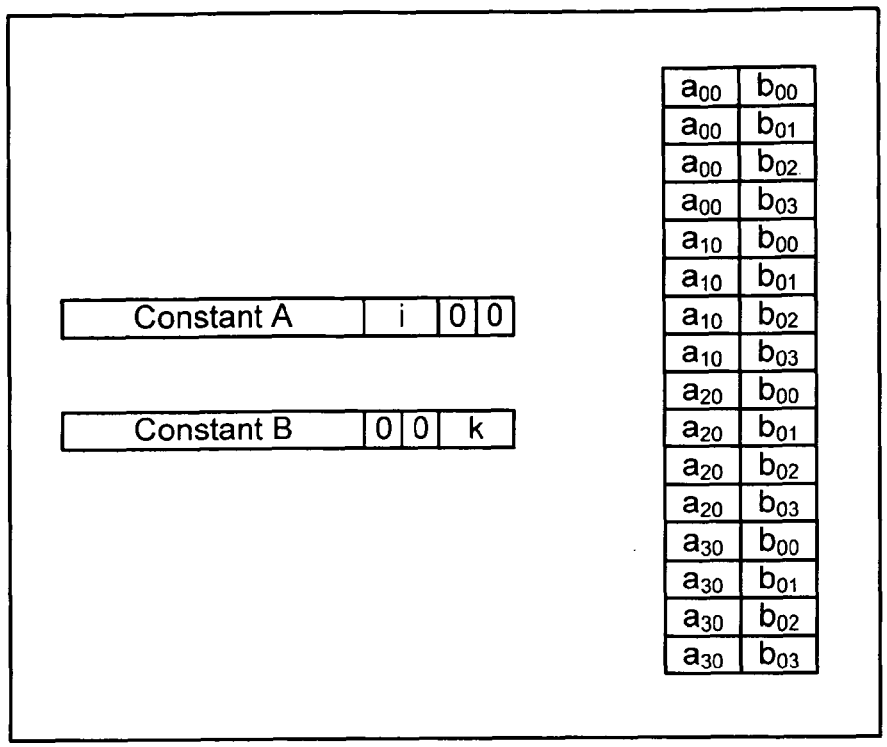

In order to perform this operation, a total of 16*4=64 element-wise multiplications need to be performed. It is desirable for the CAM cache 306 to contain all of the sixty-four (64) output operands, as well as the thirty-two (32) input operands, so that the various traversals across the elements can be performed without the penalty of going to the external RAM 308. By way of example, consider a cache that is not large enough to contain this data, and needs to be split into fourths before it will fit. The functional input tag space model allows the input data to be easily subdivided as represented in FIG. 20, showing a Matrix A Column 0, Matrix B Row 0 example.

By placing constants in the j wildcard fields, the number of elements that are involved in this stage of the multiplication has been reduced to eight (8) and the number of outputs has been reduced to sixteen (16). Notice that the tag masks have been chosen so that every reference to column zero (0) of A and row zero (0) of B will be covered by this computation. Therefore, after this input tag set is exhausted, there will be no further need for any of the input values in the cache and no further cache misses will be incurred by successive input tag sets referencing the same input operands for this calculation.

Figure 21:
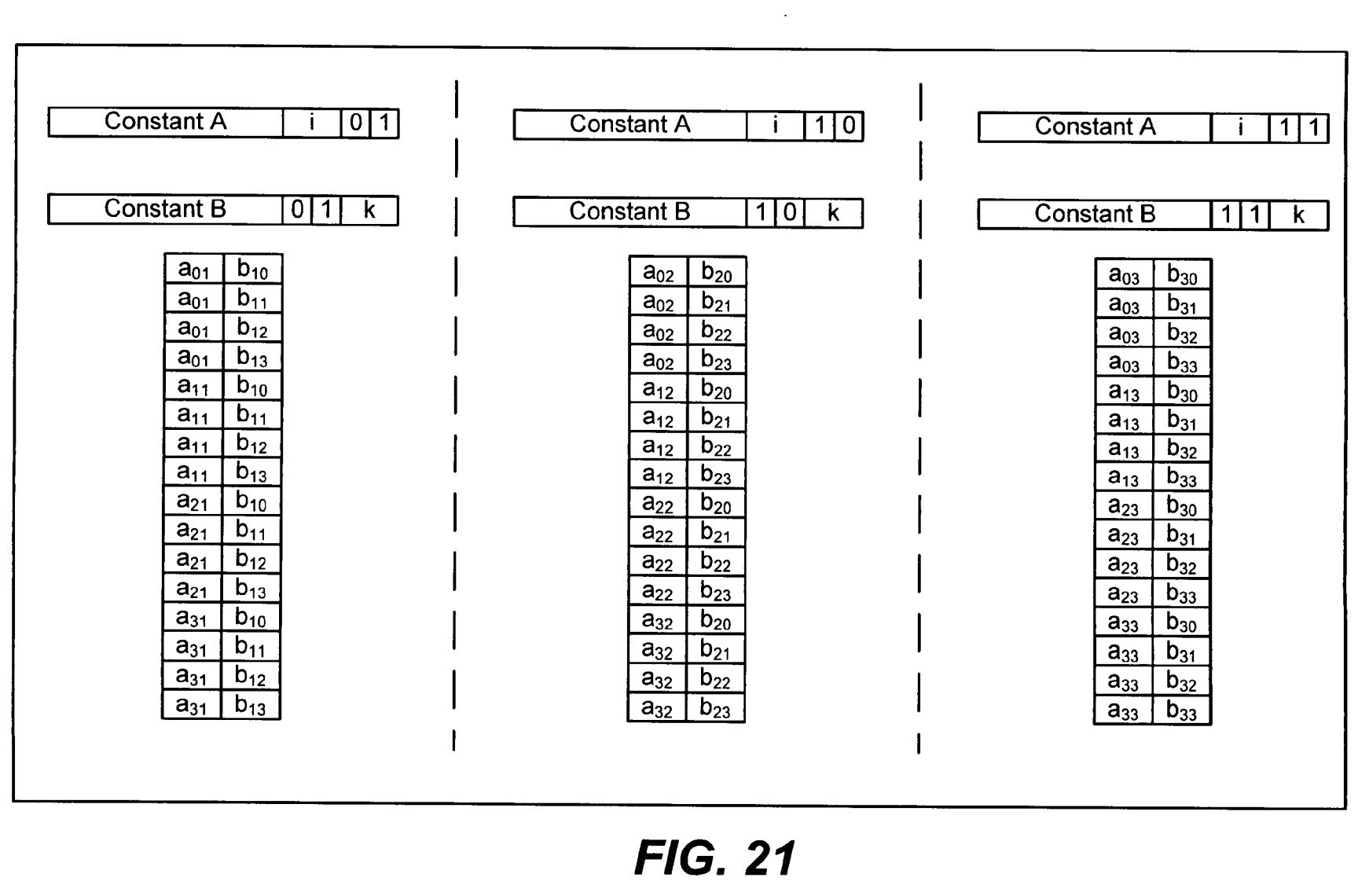

Note that only one fourth of the work has been done at this point, whereby three more input tag spaces need to be processed. FIG. 21 is a representation of processing the remaining tag spaces in the above cache management example.

Each of these input specifications covers the products to the elements that they reference, thus avoiding future cache misses for this input data. Once the product pairs have been computed, one or more input tag sets is defined that takes care of the sums to produce the final outputs of the matrix multiplication. However, it can be seen that using the functional input tag space model in this way allows the programmer to partition the data, whereby efficient use of the cache can be guaranteed for large datasets.

Figure 22:
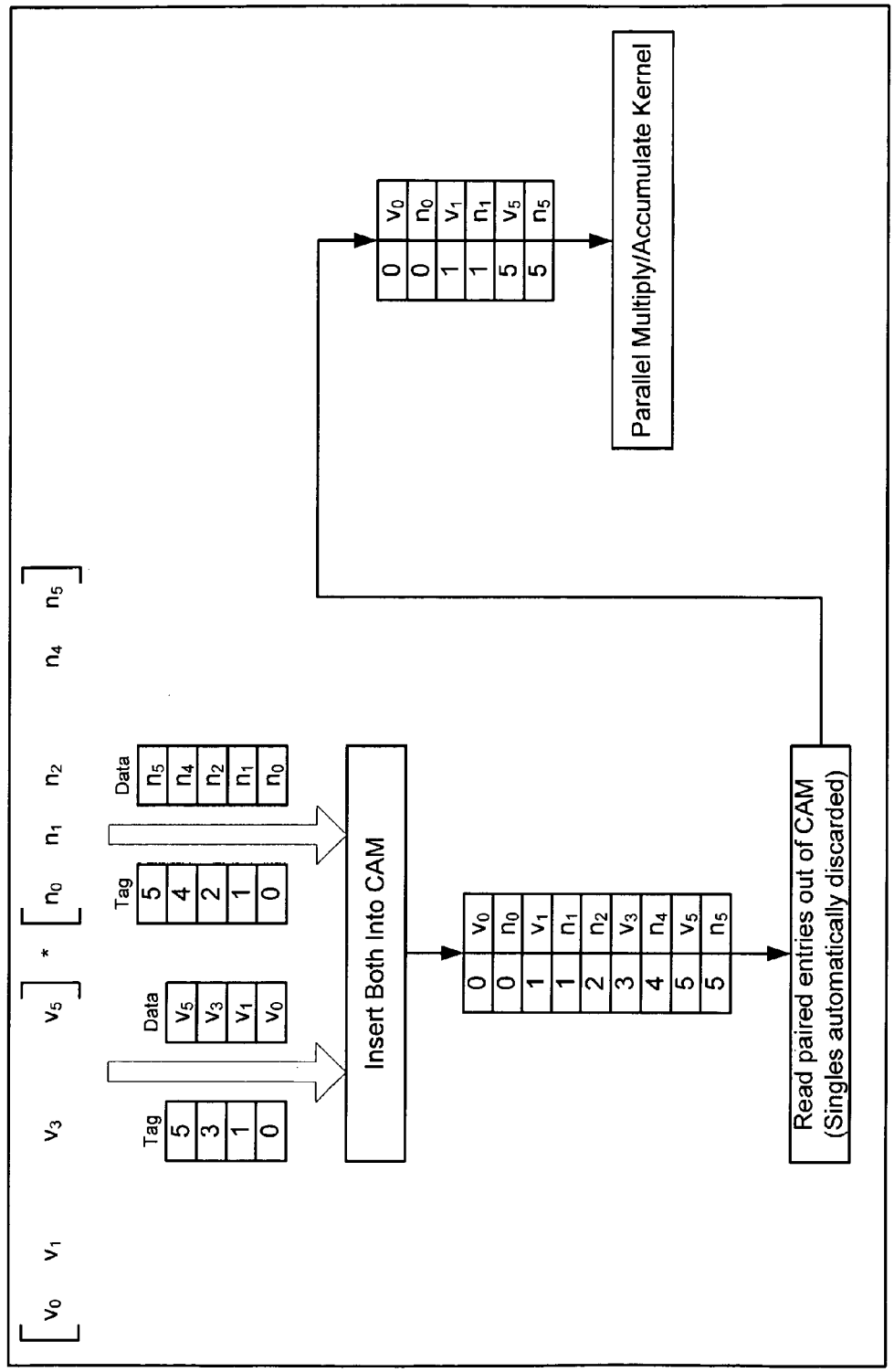
FIG. 22 is an example representation of handling a sparse vector/matrix via a CAM, in accordance with various aspects of the present invention.

The operand set concept can be further advantageous when processing sparse vectors and matrices. Two sparse vectors can be assembled into operand sets, on an element-by-element basis. The variable bits are devoted to the index position of each element in the vector. A vector dot product operation for such a sparse vector/matrix handling example is depicted in FIG. 22. As can be seen in FIG. 22, the vector v and the vector n are to be dotted together in a dot product. First both vectors are inserted into the CAM, element-by-element, using the element indices as the variable tag bits. The CAM arranges the elements so that equal element indices are adjacent to one another. Any set of elements having a counterpart set form a completed operand set, and are emitted from the CAM. The completed operand sets are forwarded to a multiply accumulate configuration, while any "single" elements ($n_2$, $v_3$ and $n_4$) are not emitted. The single elements are later deleted from the CAM because they are not needed, having been effectively multiplied by zero because they have no matching element in the other vector. Note however that the CAM eliminated them, rather than having these non-paired elements actually multiplied by zero in the computational hardware.

The same type of process is useful for any operation that typically requires zero padding. For example, image processing applications often need zero padding at the edges of an image, and FFT (fast Fourier transform) operations often need padding out to a power of two boundary. If the single elements are needed, as is the case for a vector addition operation, the single elements would be retrieved from the CAM by another configuration and later merged back in with the summed pairs.

Execution Model

Ideally, the entire dataflow graph would be instantiated in the machine and data could flow through it as operand sets complete, e.g., in waves of data. However, given existing hardware, most graphs of interest are too large to fit into the machine, so it is necessary to split the graph into more manageable pieces, or sub-graphs. These sub-graphs are called configurations. The configurations are non-overlapping, and form a complete covering set for the original dataflow graph.

Figure 23:
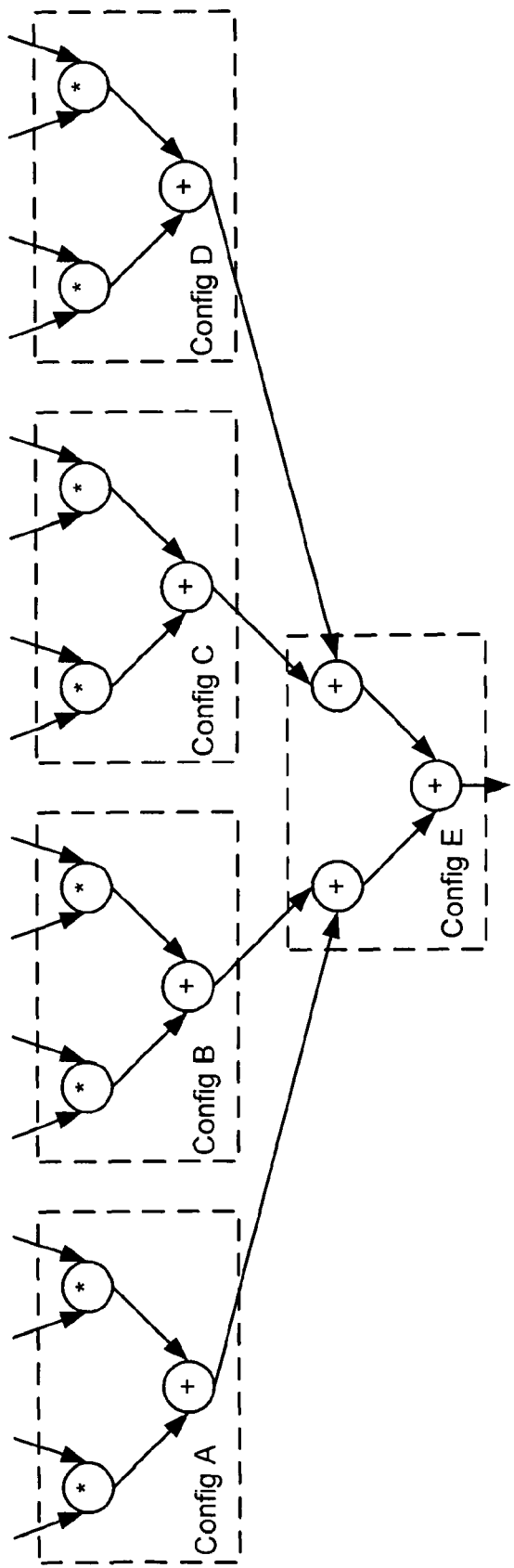
FIG. 23 is an example representation of configurations of computational hardware represented by nodes, in accordance with various aspects of the present invention.

An example group of configurations is represented in FIG. 23, in which each of the dashed boxes represents a different configuration (Config A-Config E).

As described above, a configuration accepts complete operand sets from the CAM as inputs, and produces outputs that are sent back to the CAM where they are associated with one or more output tag spaces. A configuration will continue to execute by consuming completed operand sets from its designated input tag space until the operand sets are exhausted. At that point, that configuration will be replaced by another configuration, after some possible cleanup operations. Depending on the exact function being performed, these cleanup operations may include the deletion of any partially-filled operand sets that remain in the tag space. Note however that occasionally incomplete operand sets may be used as inputs, as in the example of sparse vector addition, described above.

The separation of the dataflow graph into a dynamically executed set of static sub-graphs may be facilitated by runtime reconfigurable hardware, as described above. In general, the process of programming a configuration into the runtime reconfigurable hardware is analogous to an op-code fetch in a control driven machine. It represents overhead that only indirectly contributes to the speedup of the machine. Therefore, it is advantageous to make reconfiguration as fast as possible and/or use latency hiding techniques to minimize its contribution to the execution time of the machine. This is accomplished in two primary ways in the CAM architecture.

First, the number of clock cycles needed to process the operands in a tag space is assumed to be large compared to the number of clock cycles needed to program a configuration into the hardware. In effect, this assumes that the datasets that are being processed are large, which, for many interesting parallel applications, is a true assumption. This is an assumption of many runtime reconfigurable systems, though it can be more or less reasonable depending on the actual number of clock cycles needed to program a configuration. In some architectures, the configuration channel can be as narrow as a single bit, which obviously tends to slow the configuration process. The CAM architecture uses a reasonably wide configuration channel in order to speed the process.

A second latency hiding technique is the use of a bank of shadow control registers in the runtime reconfigurable hardware. More particularly, the next configuration is written into the shadow hardware control registers, while an active set of registers are processing data for another configuration. Essentially, the next configuration is written into a background "page" of control registers while data is running through the same hardware, whereby the active configuration is rapidly changeable when the previous configuration completes.

The use or execution of a configuration may be triggered by a number of system events. In one straightforward example, a configuration may be triggered for execution by the completion of one or more other configurations. Each configuration has a list of inputs that it depends on to form complete operand sets. As each of the configurations that provide an input completes, a list of its dependent configurations is loaded and a dependency flag is set in each. As each dependency flag is set, the complete set of flags is checked for that configuration. If all the input status flags for any configuration are set, then that configuration is scheduled for execution.

Figure 24:
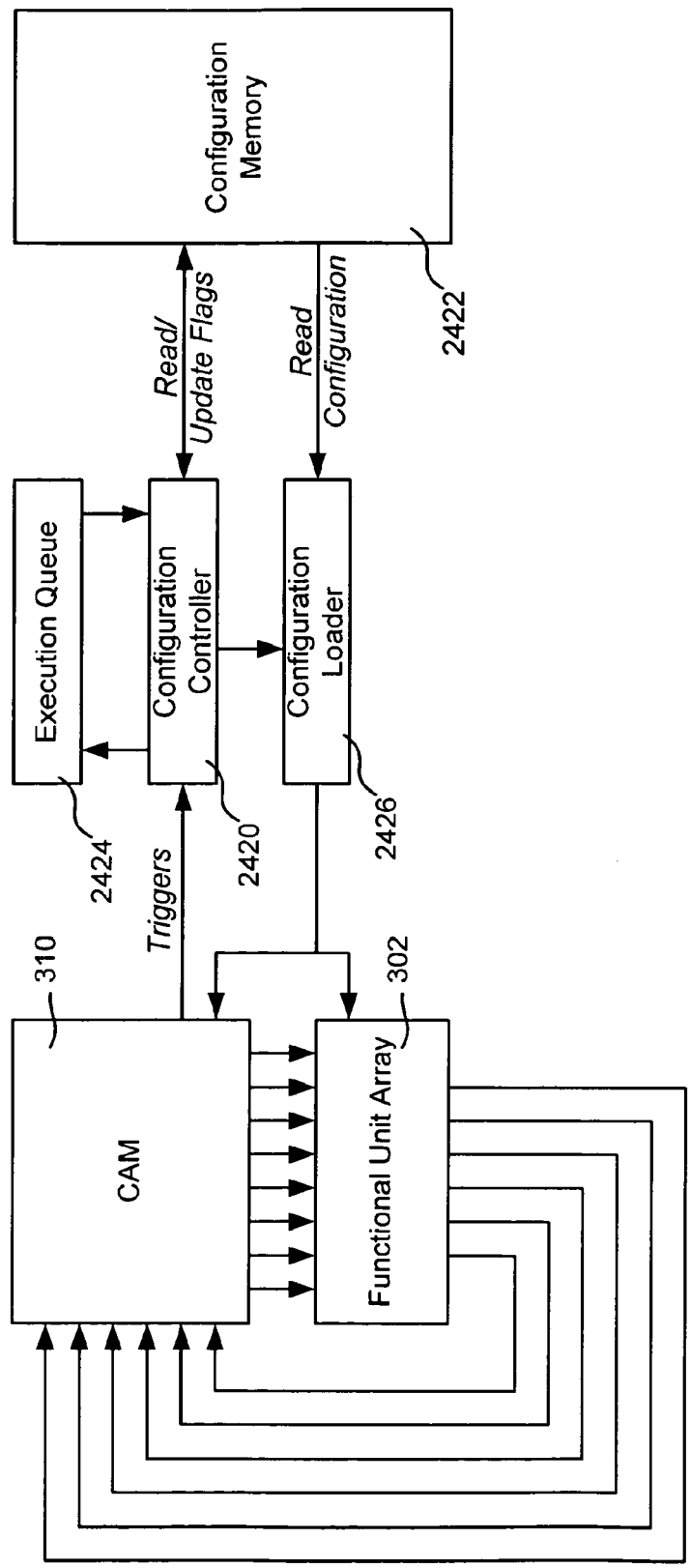
FIG. 24 is a block diagram representing an example state machine for managing configurations of functional units (of computational hardware), in accordance with various aspects of the present invention.

An example conceptual diagram of such an execution state machine mechanism is represented in FIG. 24, where as can be seen, a feedback loop is formed. The CAM 310 and/or functional unit array 302 generate triggers which go to a configuration control unit 2420. The configuration control unit (controller) 2420 updates flags in a configuration memory 2422, eventually indicating that the current configuration has completed execution and that its resultant data has been deposited into one or more output tag spaces. If all the flags for any of the dependent configurations are set, the dependent configuration is placed in an execution queue 2424 for scheduling.

Also, e.g., essentially simultaneously, the configuration controller 2420 will remove a pending configuration from the execution queue 2424 and configure the shadow registers of the runtime reconfigurable hardware with its configuration data from the configuration memory 2422. As soon as the current configuration completes, the shadow registers will be made active via a configuration loader 2426, and the functional unit hardware 302 will begin processing data through the new configuration. Note that a pending configuration can be de-queued and programmed into the shadow registers as soon as the previous configuration has transitioned from the shadow registers to the active hardware. This enables background reconfiguration and effectively pipelines (or hides) the configuration time as a background operation to actual data processing.

As can be seen, an execution loop is formed, as configurations complete they update input status (ready) flags for the next set of configurations, which are scheduled for execution, which then execute and update input status flags for configurations that are dependent on them.

Figure 25:
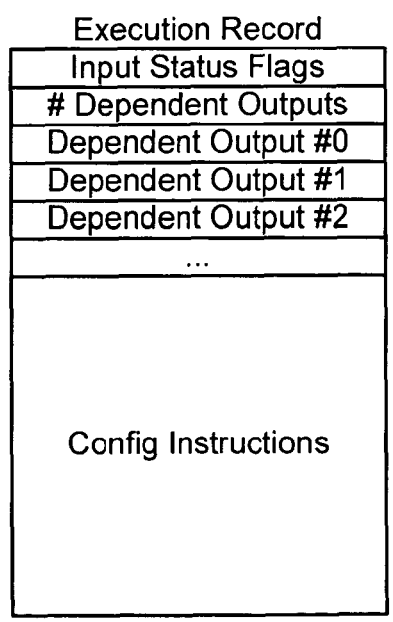
FIG. 25 is a representation of an execution record used in managing configurations, in accordance with various aspects of the present invention.
Figure 26A:
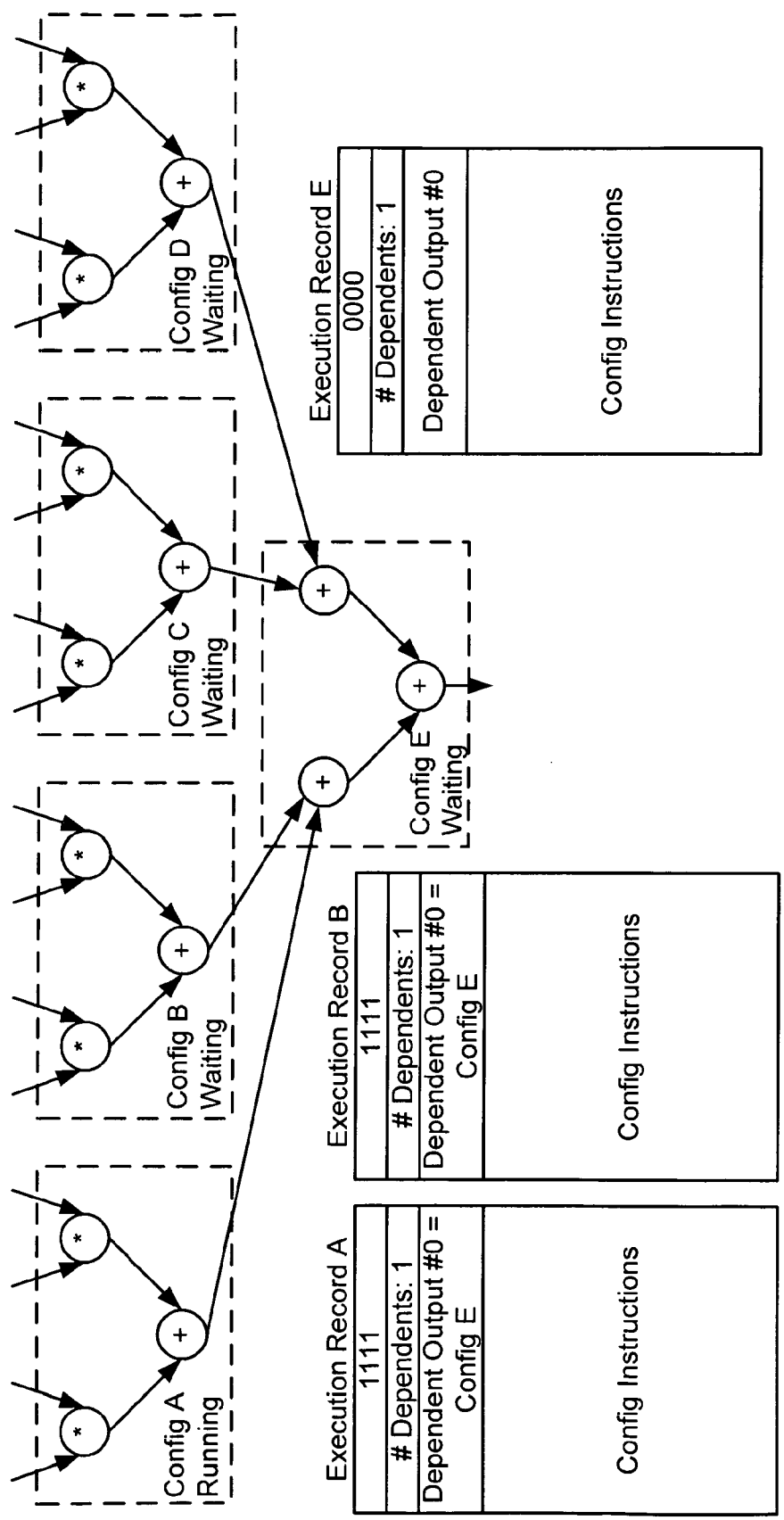
FIGS. 26A and 26B are diagrams representing configurations and corresponding execution records over time as operand sets are completed and configurations executed, in accordance with various aspects of the present invention.

A model of an execution record is represented in FIG. 25, with FIG. 26A showing various configurations along with the execution records for configurations A, B and E. As can be seen via the data in the execution records, at the point in time represented by FIG. 26A, configuration A is running, pulling complete operand sets from its input tag space, processing them and producing outputs that fall into the input tag space of configuration E. Note that all four of the input status flags (as indicated by the 1111 binary value) for configuration block A have been set, which was the triggering condition to schedule it for execution. Also note that all the input status flags for configuration block B have been set, but it is still in the execution queue 2424 waiting to be configured onto the machine. It is possible that while configuration A is executing, configuration B is being programmed into the shadow control registers of the same hardware. Note that it is also possible to have configuration B loaded and running at the same time as configuration A, however for purposes of this example it can be assumed that only one configuration may be loaded at a time due to limited computational resources. While configuration A runs, it consumes operand sets received from the CAM, e.g., specified as any operand sets within an input tag space.

Figure 26B:
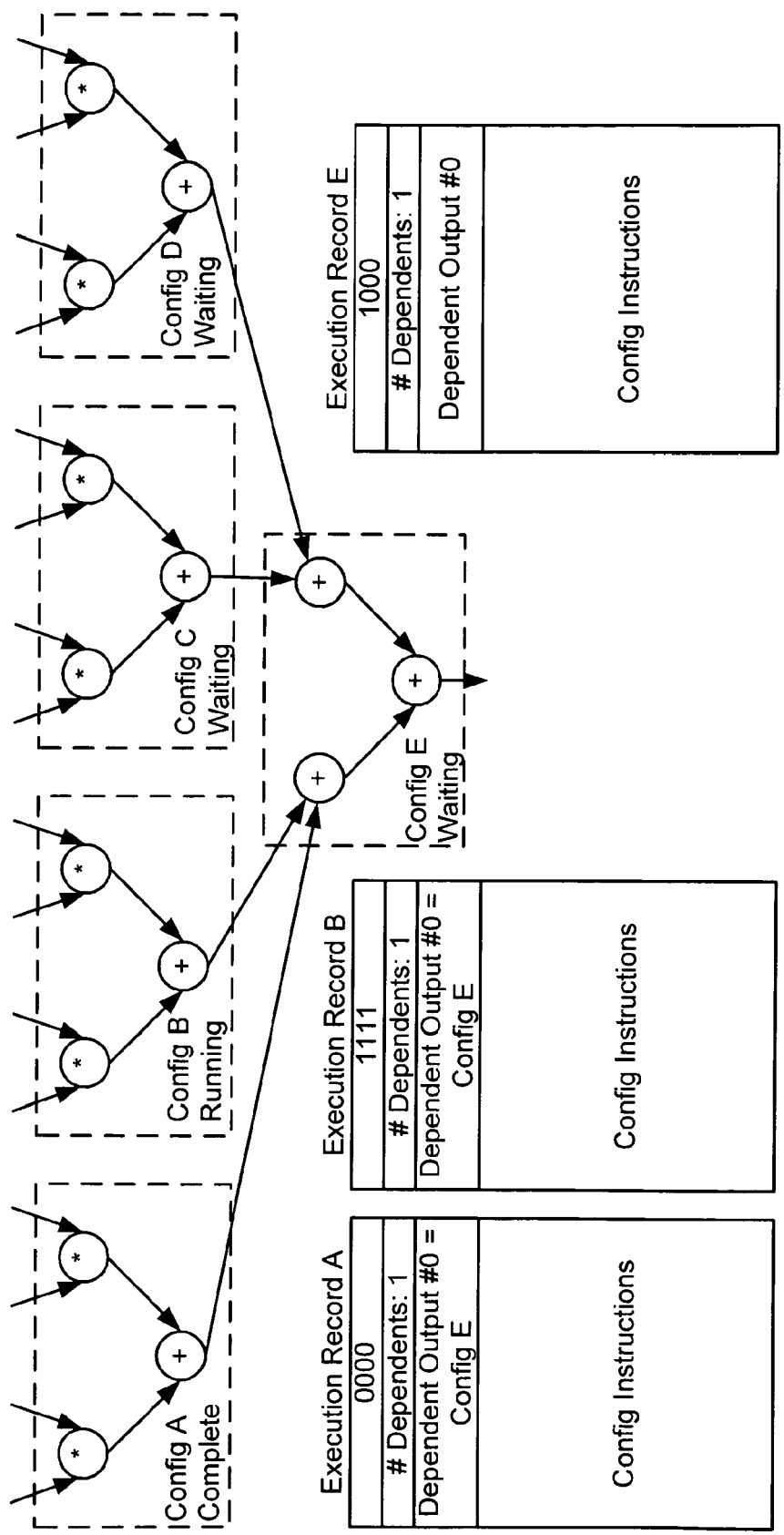

FIG. 26B represents the records A, B and E after configuration A has exhausted the completed operand sets from its input tag space, and when configuration B begins execution. Note that upon completion of configuration A, the input status flags for its execution record have been reset to 0, ready to receive a new wave of operand sets, (if any). Also note that the first bit of the input status flags for configuration E's execution record has been set, indicating that the first set of operands has been produced by configuration A's completion.

When configuration B completes execution, execution proceeds with configurations C and D (their records are not separately shown and described herein for purpose of brevity) until all four input dependencies for configuration E have been satisfied. At this point, configuration E would be put into the execution queue 2424 for scheduling.

Note that it is feasible to have a system in which rather than wait for a configuration to fully complete, a new configuration may be loaded, such as if it was known (e.g., from historical analysis) that the other configuration would be waiting a while to complete. For example, configuration A may execute for some time, but be waiting for an operand set that is not ready. At such a time, configuration B may be loaded and executed, and complete its operand sets, such that work is performed rather than simply waiting for configuration A to complete, which can occur later. While feasible, this is not likely in many types of data processing applications, and may be more time-consuming because of extra reconfigurations and/or flushing the data that A already has in the on-chip cache, only to reload both configuration A and its needed data.

Conditional Execution

In the CAM architecture, conditional execution, such as an if-then statement or a while loop, is handled using the operand set concept, essentially by not completing an operand set until a condition is met. Conditional execution is a somewhat difficult issue in runtime reconfigurable machines because of the need to steer data through different hardware paths on an operand-by-operand basis, depending on the evaluation of a conditional function.

If/Then statements are implemented by using the CAM feature of emitting only complete operand sets from the CAM for processing. Because the two branches of the conditional will generally require different code to be executed, each branch of the conditional has a distinct input tag space of its own, with distinct operand sets. During execution, values that are needed for either branch may be generated and will be tagged so that they fall into the input tag space of the appropriate branch The following code provides a conditional example:

```
if (A<B)
    C=D1+D2;
else
    C=E1-E2;
```

Figure 27:
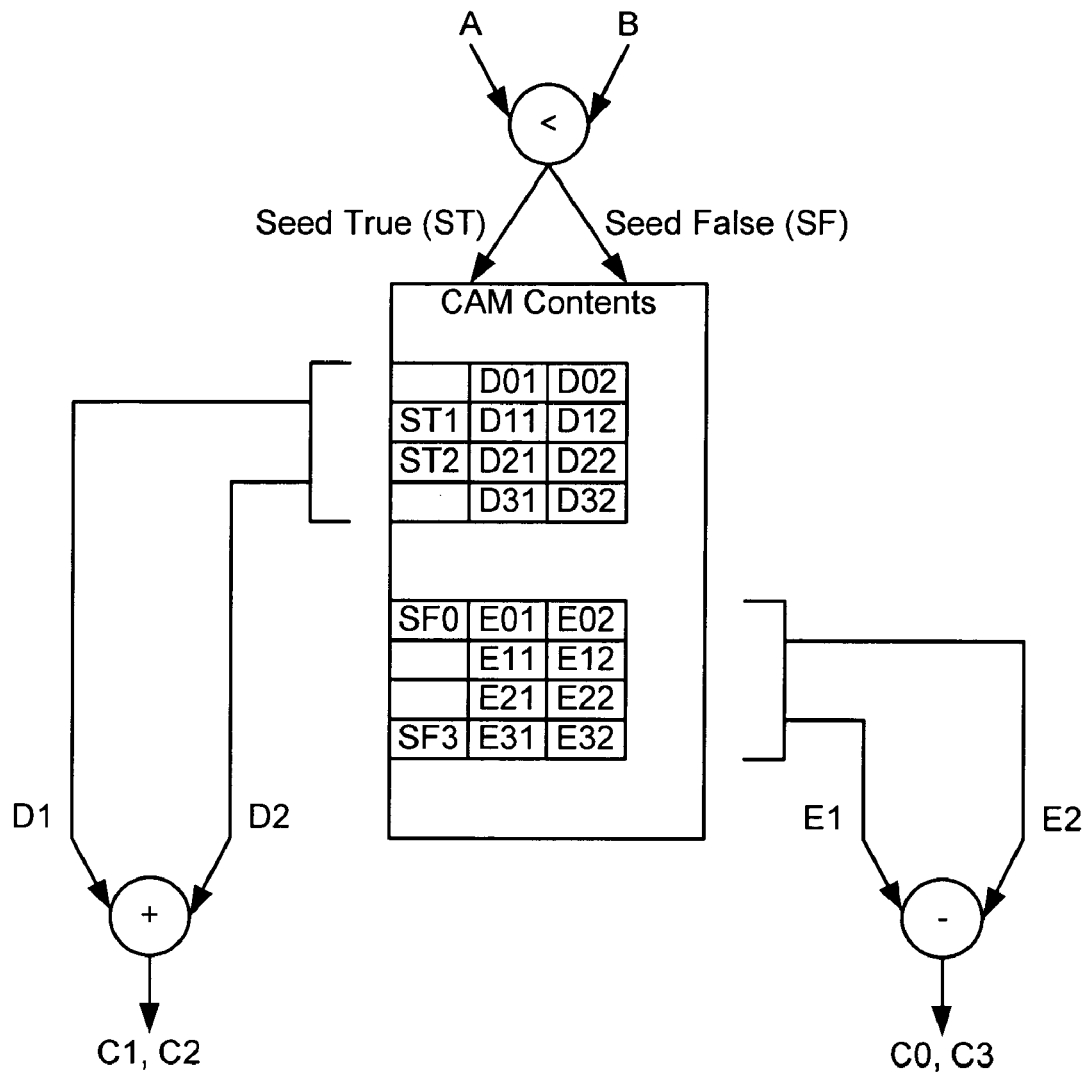
FIG. 27 is a representation of how CAM operands are used to execute a conditional if-then statement, in accordance with various aspects of the present invention.

As generally represented in FIG. 27, to handle the branches, an additional seed token is also specified to be part of the operand set on either side of the branch, whereby an operand set is not emitted from the CAM unless and until the seed token is available. This seed token is generated by the conditional node in the graph when the operands (prior to the branch) are evaluated for the given test condition. Note that the node in FIG. 27 is a simple example, and a conditional node may actually be a complex conditional configuration.

As the conditional node is evaluated for each test condition, it generates the seed token for either the true or the false branch of the conditional. Thus, in the example of FIG. 27, given an $A_0$ and $B_0$ operand set, it is seen that $A_0$ is not less than $B_0$, whereby a seed false token SF0 is generated for E01 and E02, but not D01 or D02. For $A_1$ and $B_1$ and $A_2$ and $B_2$ operand sets, the true seed tokens ST1 and ST2 are generated to complete the {D11, D12} and {D21, D22} operand sets based on their respective evaluations. A seed false token SF3 is generated to complete operand set {E31, E32} for an $A_3$ and $B_3$ operand set fed into the conditional node.

The seed token thus completes the operand set for the correct branch of the conditional, while the opposite branch is left uncompleted. As a result, downstream operators will only retrieve the completed operand sets and the uncompleted sets will be discarded. As described above, (for i=0 to 3) the first and fourth evaluations of $A_i < B_i$ are false, and the second and third evaluations are true. The conditional node thus emitted true seed tokens ST1 and ST2, completing those operand sets, whereby the CAM will emit (ST1, D11, D12} and {ST2, D21, D22} to the true branch, and the addition node will evaluate both C1=D11+D12 and C2=D21+D22. False seed tokens have been emitted for SF0 and SF3, causing the CAM to emit {SF0, E01, E02} and {SF3, E31, E32} to the false branch which will execute C0=E01-E02 and C3=E31-E32. Note that the true and false branches will have two distinct input tag spaces for purposes of separation, but that the outputs of these branches are merged by emitting tokens that are in the "C" input tag space (C0-C3) for subsequent computations.

Note that some "short-circuit evaluation" is possible, as these seed tokens can be emitted and used as soon as the A and B values are ready for use. As a result, the conditional evaluation can effectively short circuit (exit) any computation that would be needed for the unused branch. For example, consider that the D1 values are computed solely for the use of this conditional branch. In such a situation, the seed token from the conditional may be used as a gating function for the computation of D1, allowing only the values of D1 that will be necessary to be computed. Conversely, if the D2 values are used in this conditional as well as some part of the graph other than the conditional, the short circuit would not save anything; the D2 values can be used in both the input tag space of the true branch here as well as the other location, preventing a potentially redundant computation of D2.

Further, the execution model described so far flows from configuration to configuration regardless of what may be happening with the data stream. It is possible that a conditional branch may be encountered in the graph in which all of the data flows down one arm of the branch and none of the data flows down the opposite arm. Since both arms are dependent upon the branch point, both may be scheduled for execution. However, it is possible to use tag detection hardware to determine whether any tags were indeed generated for a given branch of execution. If no tags where generated, then that entire arm of execution (that sub-graph) could be essentially "short circuited" by leaving the input status flag for that arm unset.

Figure 28:
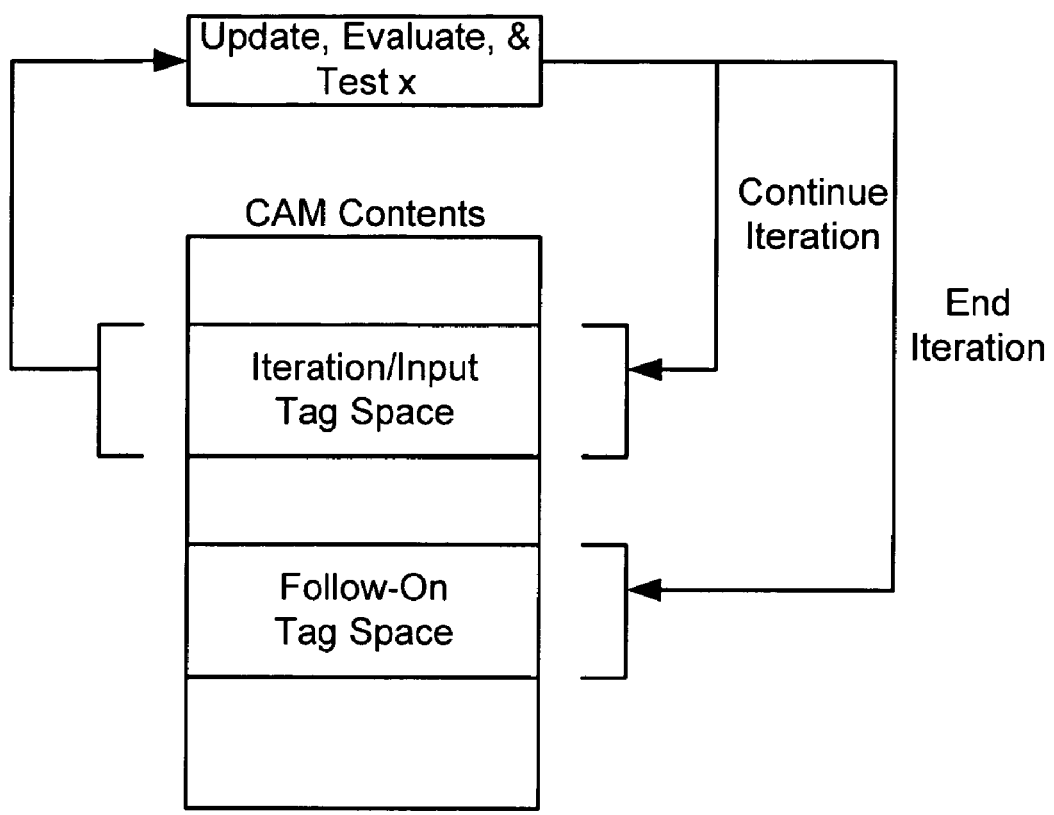
FIGS. 28 and 29 are representations of how CAM operands are used to execute and implement while loops, in accordance with various aspects of the present invention.
Figure 29:
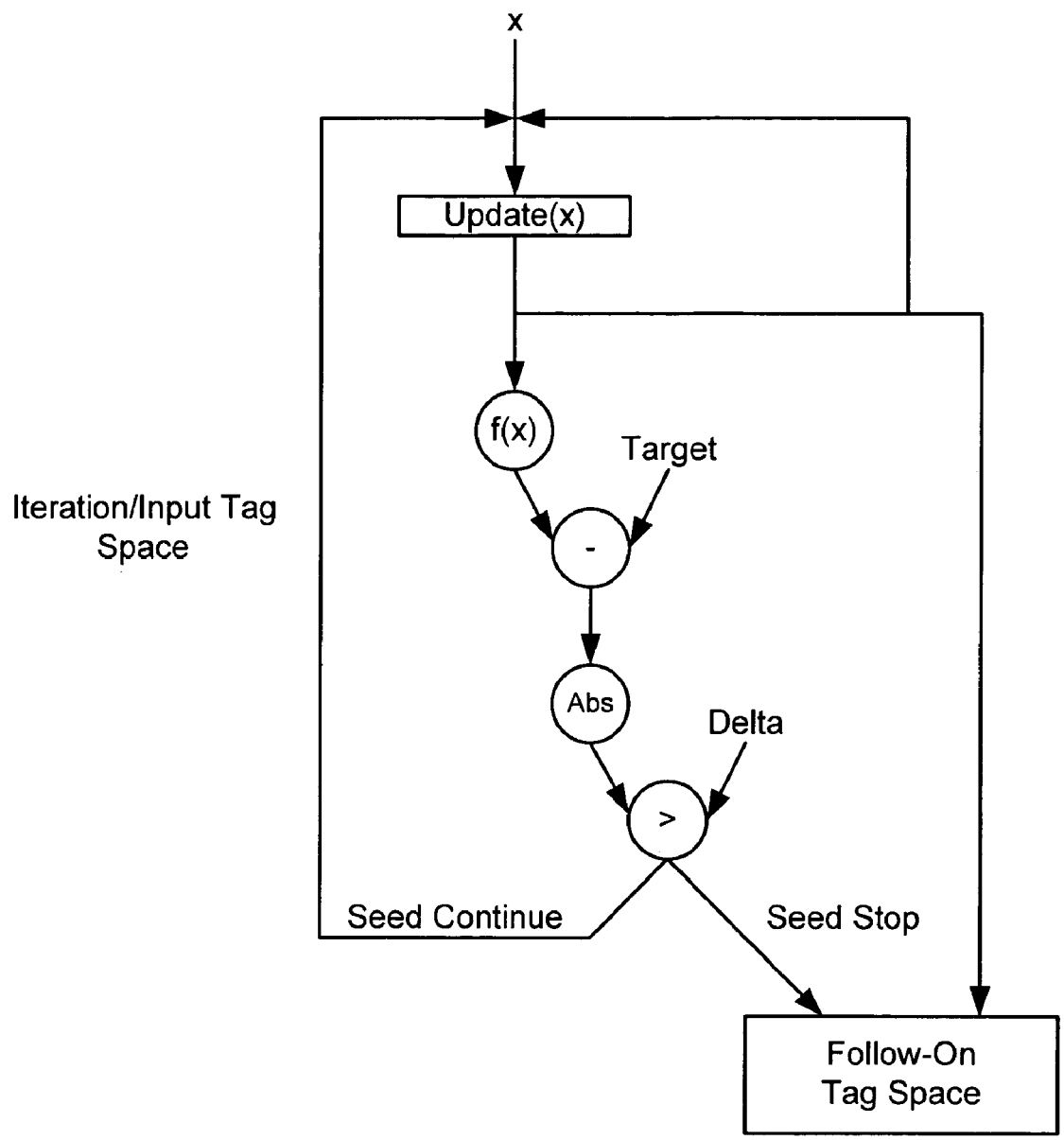

While loops take on a similar form to the if/Then statement, again making use of the operand set concept. Conceptually, the while loop is created as represented in FIG. 28. Two tag spaces are used, one being the input to the while loop, and the other belonging to the following configuration in the dataflow graph. A conditional operator is used to generate seed tokens that either cause the loop to continue the iteration, or stop the iteration and allow the computation to continue. As an example, consider the following loop, such as used in a root finding problem:

while (abs($f(x)$−Target)>Delta)

x=Update(x);

One dataflow representation of such a while loop implementation is represented in FIG. 29, in which the greater than ">" comparison operator emits one of two seed tokens. If the iteration is to continue, then a seed continue token is emitted back into the input tag space of the while loop. If the iteration is to stop, then a seed stop token is emitted into the follow-on tag space.

Thus, in this example, an input x value (which may be updated) is output as one operand to the follow-on tag space. The function and target subtraction is then applied to the updated x value, followed by the absolute value function, and then this modified value is compared to the delta. If less than delta, the seed stop is emitted, completing the follow-on tag space operand set, whereby that configuration will execute. Otherwise, x will continue to be updated by generating a seed continue operand, completing the input operand set to the update x loop, which will update x until the delta criterion is met.

Note that the updated value of x is used both in the input tag space of the loop, as well as the input tag space of the next graph; the seed token and the updated x value form the operand set for either the while loop or the follow-on graph. As long as there are complete operand sets in the input tag space of the loop, it will continue to execute, so that emitting a seed token to the input tag space of the loop will cause the x value to run through the loop again until the condition is met.

The unexecuted arm of execution may leave uncompleted operand sets in the CAM, since other configurations may have contributed to its tag space. Likewise, a sparse vector dot product may also leave partial operand sets in the CAM. These are purged from the CAM with a delete operation at a later node in the dataflow graph, such as where the two arms of execution are re-merged.

Figure 30:
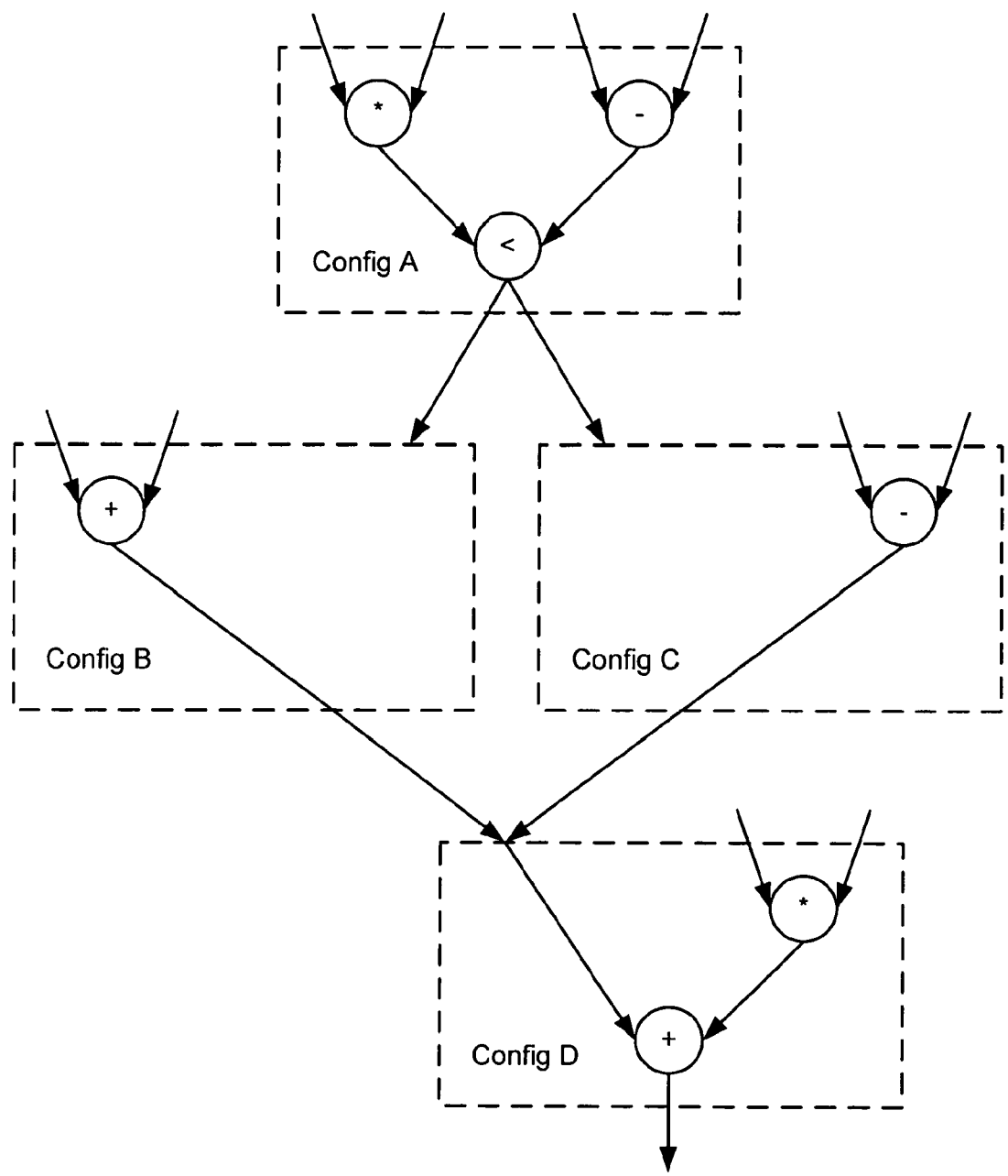
FIG. 30 is an example representing of how and when tag cleanup may be performed upon merging of configuration outputs, in accordance with various aspects of the present invention.

Such a tag cleanup example is depicted in FIG. 30, where a conditional node is contained in configuration A, which produces seed tokens for configurations B and C as appropriate. Configurations B and C will only retrieve complete operand sets from the CAM, and will both produce outputs and tags that fall within the tag space of configuration D, which is the above-implied "merge" operation. The input tag space specification system used will determine when it is safe to delete any uncompleted operand sets.

If fixed prefix input tag specifications are used, then any uncompleted operand sets in configuration B's input tag space may be deleted any time after configuration B has retrieved all of the completed operand sets. Likewise, any time after configuration C has retrieved all of the complete operand sets from the CAM, the uncompleted operand sets from its input tag space can be deleted.

Alternatively, if functional input tag space specifications are used, then it is possible that some data will be common between configuration B and C. In such an event, it is necessary to wait until the completion of both configurations B and C before deleting that data from the CAM. A convenient time to do that is after configuration D has completed, since then no additional AND logic is needed to control the issuance of deletion commands.

Turning to another aspect of conditional execution, there are situations in the execution engine where it is necessary to block the flow of input data for a time until data further down in the graph has been processed. Such a situation may arise in the processing of a while loop, for example, where it is necessary to guarantee that an input set fully completes execution through the loop before new data is admitted into the loop. This allows multiple "$x_i$" inputs to be streamed through the same while loop, continuing or exiting as it iterates and achieves a condition. Blocking can also occur with primary inputs to the graph if it is necessary to guarantee that input data is processed in sets rather than as a free flowing stream.

This type of synchronization can be accomplished by making use of the input status flags in the execution records. In general, an input status flag is added that acts as a barrier that new inputs cannot cross. This barrier flag is dependent upon the completion of the configuration that signals the end of the blocking period.

Figure 31:
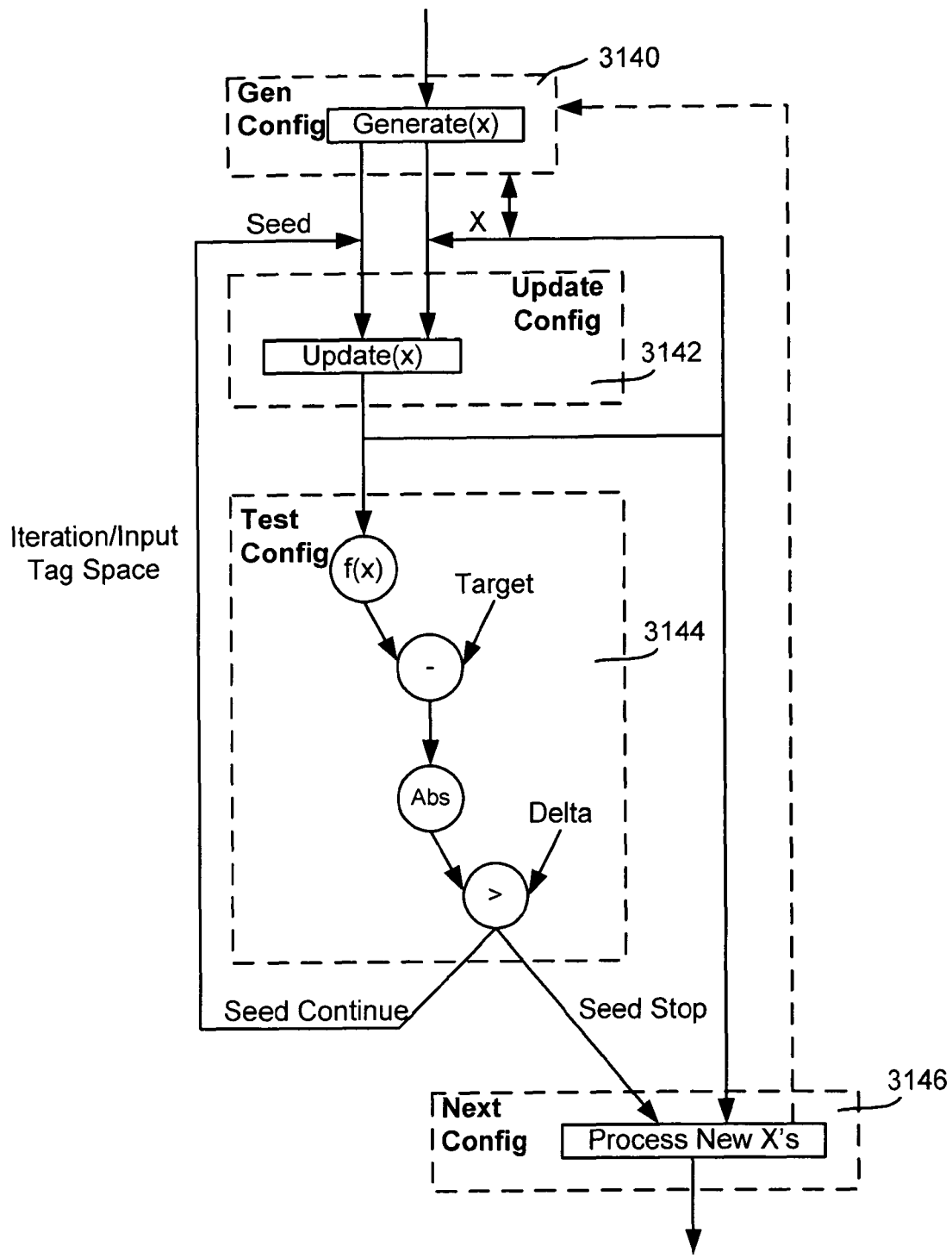

To exemplify a data blocking implementation, the above example "root finding" while loop is shown in FIG. 31, split up into four different configuration blocks, comprising a generation configuration block 3140, an update configuration block 3142, a test configuration block 3144 and a next configuration block 3146. In FIG. 31, the solid line arcs between configurations shown on the graph are data paths as well as dependencies in the execution records. The one dashed arc running from the next configuration block 3146 to the generation configuration block 3140 is the barrier arc. No data flows across this arc. Note that in FIG. 31, the contents of the generation configuration block 3140, the update configuration block 3142, and the next configuration block 3146 are not shown, since they do not matter for the sake of this example. They themselves may comprise more than one configuration each, but the same synchronization techniques remain applicable.

Figure 32:
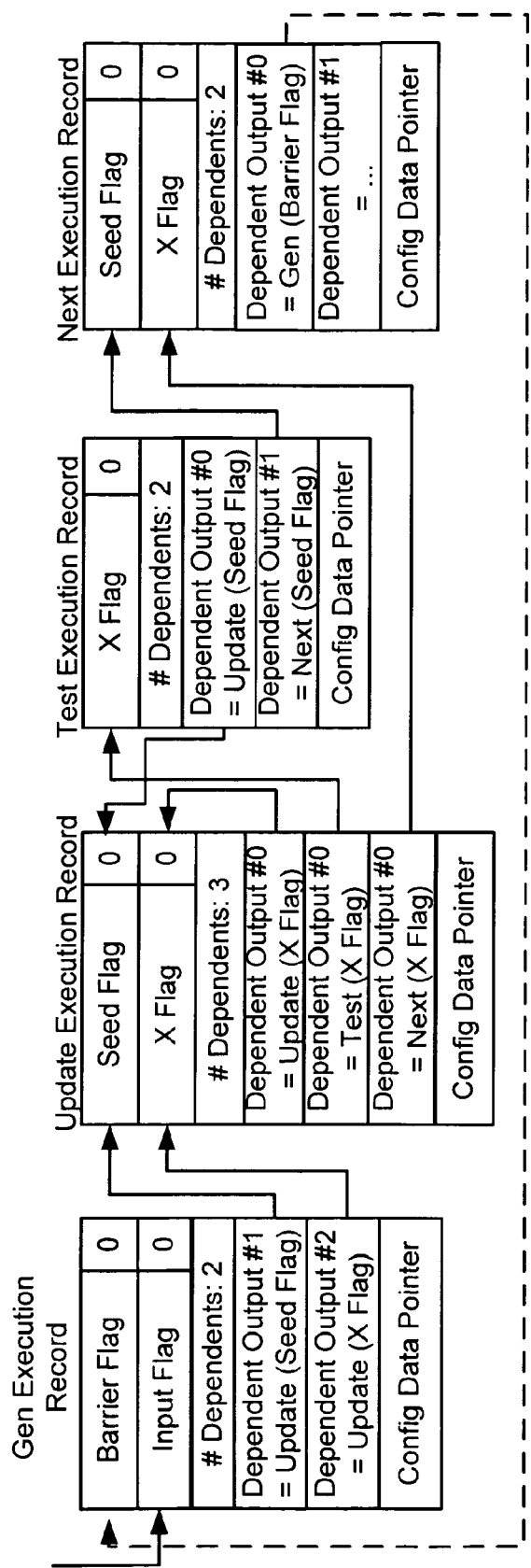

The dependencies between the execution records for this graph are represented in FIG. 32. The execution record dependencies, along with the input status flags for each, form an execution state machine that the CAM architecture traverses.

Figure 33:
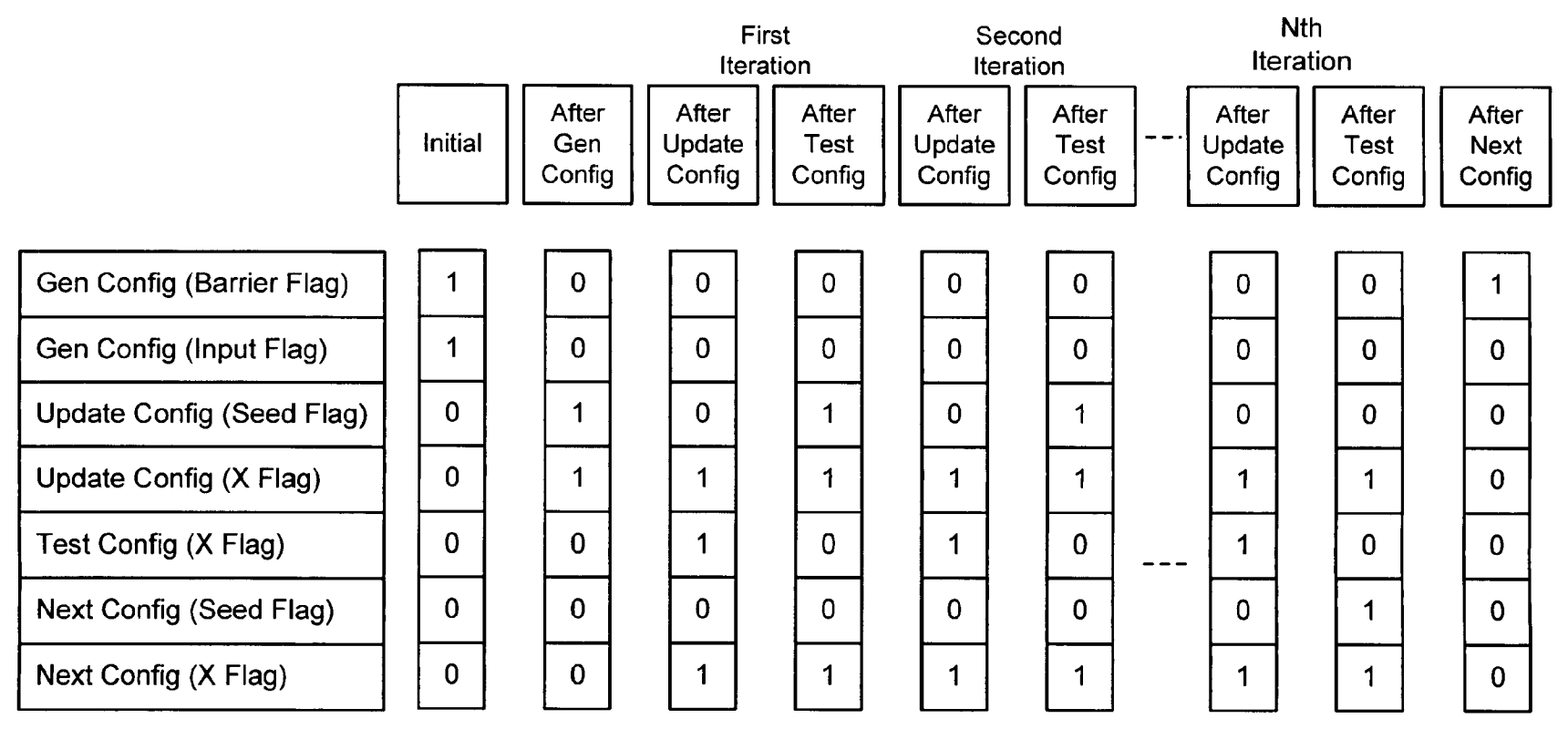

The state transitions for the input status flags in the data blocking example are represented in FIG. 33. As described above, whenever all the input status flags for a configuration are set, that configuration is scheduled to execute. Throughout execution, new X values that are generated into a given input tag space will overwrite the older values. An exemplary series of events represented in FIG. 33 proceeds as follows:

1. The starting condition for the graph, showing the flags under the "Initial" block, shows Gen Config ready for execution, since its barrier flag and the input flag are both set, indicating that the loop is not busy, and that new data has been placed in the CAM for retrieval, respectively.

2. Gen Config is configured for execution and both of its input status flags are cleared. This configuration creates X values for the loop to process, along with seed values for each X. Since Gen Config generates complete operand sets {seed value, X value}, every X value will be run through the loop evaluation. When Gen Config has exhausted all of the starting inputs from the CAM, it will set both of the input status flags for Update Config, namely the seed flag and X flag. This final state is shown in the "After Gen Config" column of the state table.

3. Since both input status flags for Update Config are set, it is executed next and its input status flags will be cleared. Update Config will compute updated values for X that will be used by three dependent configurations: itself, Test Config and Next Config. After it has exhausted all complete operand sets from its input tag space, it will set the "X Flag" input status flags for all three dependent configurations.

4. The Test Config is loaded next since its sole input status flag is now set. Its input status flag is immediately cleared. This configuration will compare all the X values against a tolerance specification and then produce seed tags that will indicate on a value by value basis whether the loop should continue or end. If a given value of X is not close enough, a continuation seed will be generated, which will be paired up with the matching X value in the input tag space of the Update Config. If a given value of X is close enough, then a stop seed will be generated, which will be paired up with the matching X value in the Next Config. When all of the X values have been tested, one of the dependent execution records will be updated. If any X values continue to iterate, then the Seed Flag of the Update Config execution record will be set. Otherwise, the Seed Flag of the Next Config execution record will be set. Thus, only one or the other execution path will be allowed to continue.

5. In this example, iteration continues for N times, each time re-invoking the Update Config until every X value is within the allowed tolerance. On the last iteration, when all X values are within tolerance, the Seed Flag for the Next Config is set, and the Seed flag for Update Config is left clear.

6. The Next Config is therefore scheduled for configuration and it immediately clears its input status flags. The X values continue on through to the next stage of calculation. However, there is cleanup to be done, since there are some number of uncompleted operand sets at the inputs to the Update Config and Test Config. These are automatically deleted when Next Config completes. Because the while loop has now been purged of extraneous data, the Next Config also sets the Barrier Flag of the Gen Config, effectively priming it to receive a new input set.

This mechanism allows the CAM architecture to guarantee that data will flow through the graph in complete sets through iteration operators and other branching structures. Blocking operands essentially works by detecting the generation of seed values at the conditional operator, and then setting the input status flag only for the branch that should be allowed to continue. Seeds for individual data values may themselves be produced along both branches of the conditional as appropriate, and these will complete operand sets along each arc so that the operand set mechanism can be used to retrieve and process only those data values that are needed.

Note that it is not necessary to produce individual stop seeds when X values have fallen within tolerance. In such an event, it is sufficient to use the Next Config Seed Flag to block the continuation of execution until all x values have fallen through the loop. The per-operand seeds were included for purposes of clarity of explanation, though in practice removing this arc would reduce the bandwidth requirements of the program.

Turning to caching and configuration scheduling considerations, in order to conserve the off-chip bandwidth, it is desirable to attempt to make maximal use of the data that has already been moved on-chip. In a control driven architecture, the cache serves this purpose via a least-recently-used cache policy, by keeping data on the chip that has been recently accessed for as long as possible; data is usually only evicted from the on chip cache when newer data must be retrieved and there is no more free cache available. At such a time, the conventional cache manager will look for the data that has been sitting idle the longest, and send it off-chip to main memory.

In the CAM architecture, the hardware has the advantage of cues from the dataflow graph that tell it what data will be needed by any given configuration. Since a configuration needs to pre-specify its input tag space, the hardware can know exactly what data it will require, (unlike having to deal with the seemingly-random access patterns of a control driven program). This information can be used to advantage in several ways. For example, when a configuration completes, the execution record informs the hardware as to what configurations are waiting to consume the data that was just produced. It is then possible to schedule one of those dependent configurations to immediately consume the new data, while it is still in on-chip memory.

Figure 34:
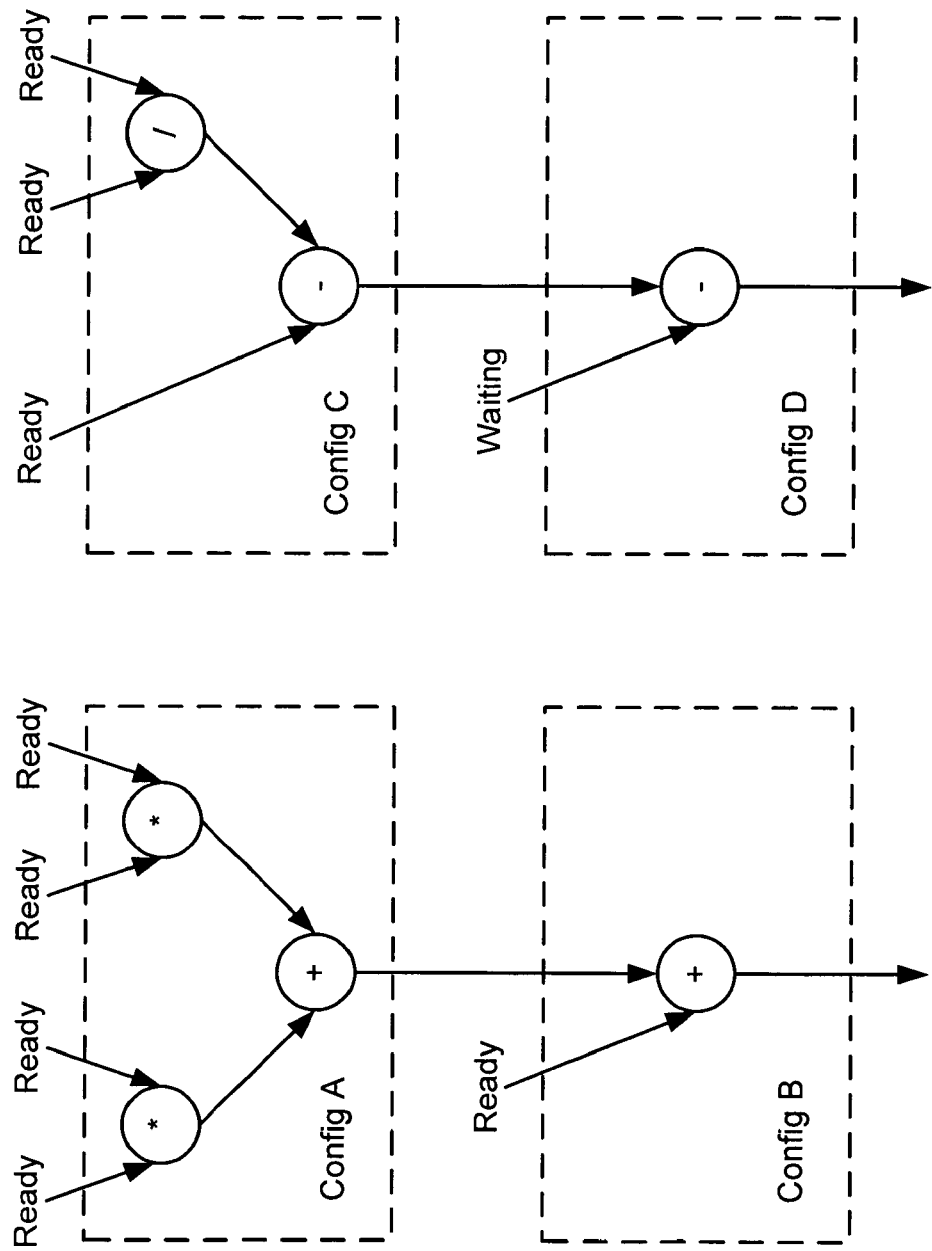
FIG. 34 is a representation exemplifying the optimizing of scheduling of configuration loading, in accordance with various aspects of the present invention.

Moreover, it is possible to analyze the dataflow graph in order to guarantee the presence of on chip data for certain configurations. For example, in the representative graph of FIG. 34, it is possible to do some predictive scheduling for optimization. The configuration controller 2420 (FIG. 24) has the option of scheduling either configuration A or configuration C since both configurations should have been placed in the execution queue 2424. However, one dependency further down the graph, it can be seen that configuration B is ready to go, except for the data that it needs from configuration A. On the other hand, configuration D would still be waiting for data even if configuration C were to execute immediately. Choosing to schedule configuration A instead of configuration C, has the desirable result that configuration A's output will be generated and immediately enable configuration B for execution. Since configuration A has just completed, it is likely that at least some of its outputs are still present in the on-chip CAM cache 306 (FIG. 3) as well, saving the memory system from retrieving them from the off-chip memory 308. If instead configuration C was scheduled for execution before configuration A, configuration C's outputs will be generated with no immediate consumer, whereby there is a greater likelihood that they will need to be moved to the off-chip memory 308. Further, whatever configuration is scheduled after configuration C would then potentially need to bring all of its inputs back in from off-chip main memory 308.

In such a situation, it is clear that it is more advantageous to schedule configuration A, whereby configuration B is immediately ready for execution, likely with the advantage of having on-chip data waiting for it. Using this type of predictive scheduling, bandwidth savings, and hence execution efficiency, can be improved. This may be done in advance to some extent by the program compiler, if it has knowledge of the architecture's scheduling policies and order. Guiding the execution pattern of the architecture may be as simple as arranging the order that the dependencies are listed in an execution record. Such static optimization works as long as the data arrival patterns are known in advance.

In cases where the data arrival patterns are not known, particularly in conditional execution, the hardware may still perform some useful analysis. This may be as straightforward as observing which tag spaces are currently in the on-chip cache and giving execution preference to the configurations that make use of that data. It may be more complex, such as dynamically analyzing the dataflow graph at runtime in the hope of finding an optimal execution path. A full implementation of the dynamic analysis may be a particularly complicated task, although a more limited version of it may be useful. Such an implementation may be based on "parent" pointers in the execution records of the dataflow graph.

Recursion is another concept in a dataflow computer, which is generally equivalent to dynamically growing the graph and then collapsing it on itself. There is also an issue of creating the equivalent of a stack in an inherently functional programming architecture. The same problems occur on a lesser scale with function calls in general.

Function calls in general are handled by the CAM architecture, by placing the return tag of the function as an operand, along with function parameter data, into the input tag space of the function when a function call is needed. The return tag is passed through the function call until the output of the function has been computed. The output data is tagged with the return tag and the function call ends. The return tag is designed to fall back into the input tag space of the configuration following the caller, and the call is complete. Function calls are thus fairly straightforward, and this mechanism is also sufficient to handle tail recursion as well, since that amounts to essentially a while loop with an embedded function call.

True recursion is handled by manipulating the tags so that they will fall back into the input tag space of their recursive parent. In order to do this, the recursive function is split into two halves, a pre-recursive half and a post-recursive half. Everything up to the point of the recursive call itself is in the pre-recursive half. In terms of execution pattern, the same division is made. First, all of the recursive calls are performed, up to the point that the terminating condition is hit. Each of these is also executed up to, and including, the point of the recursive call itself. When the terminating condition is hit, and all of the pre-recursive calls have finished execution, then the second half of each of the function calls is executed in reverse call order to finish the function evaluation.

Figure 35A:
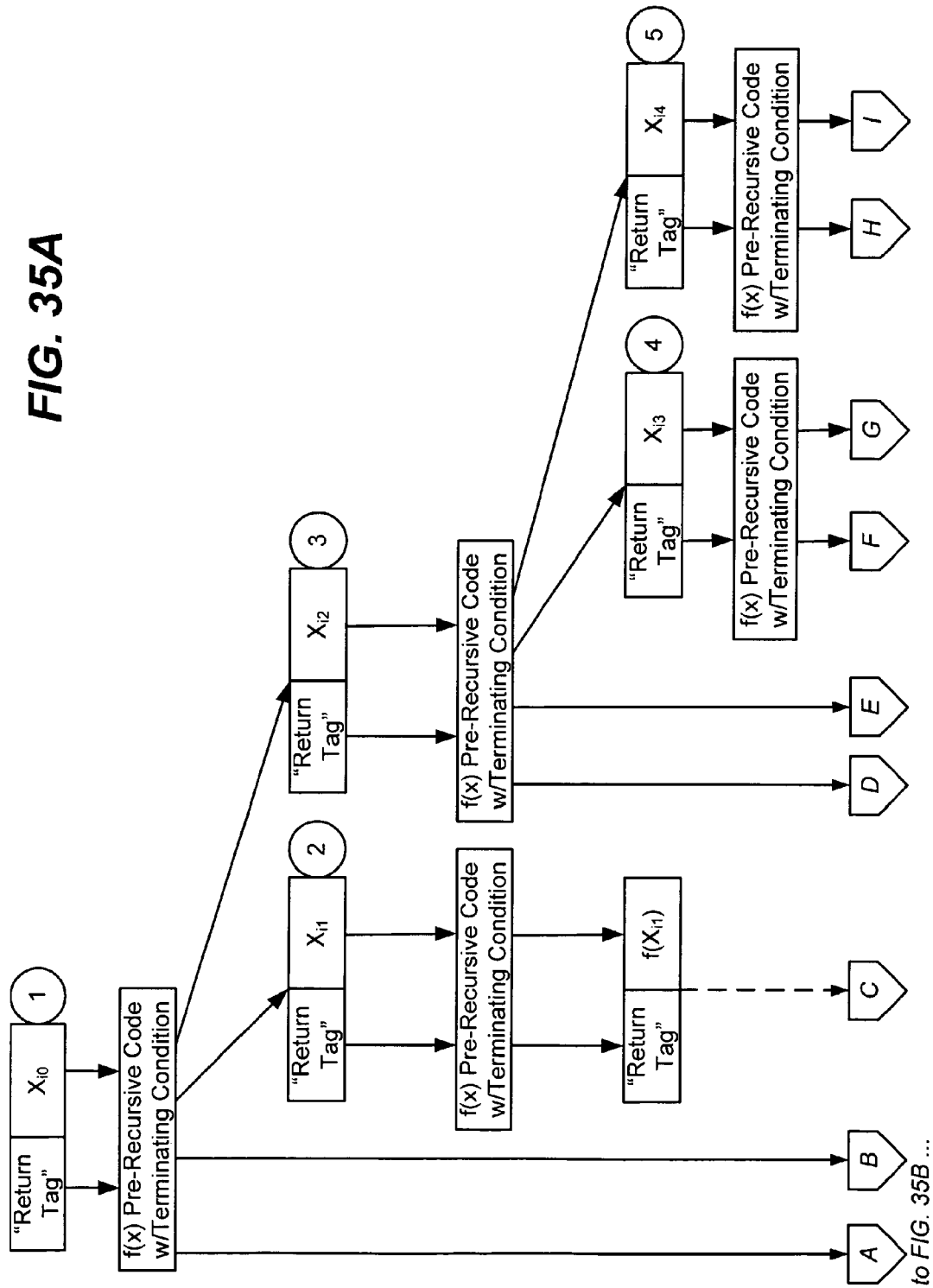
FIGS. 35A and 35B comprise diagrams representing the use of return tags for handling recursive functions, in accordance with various aspects of the present invention.
Figure 35B:
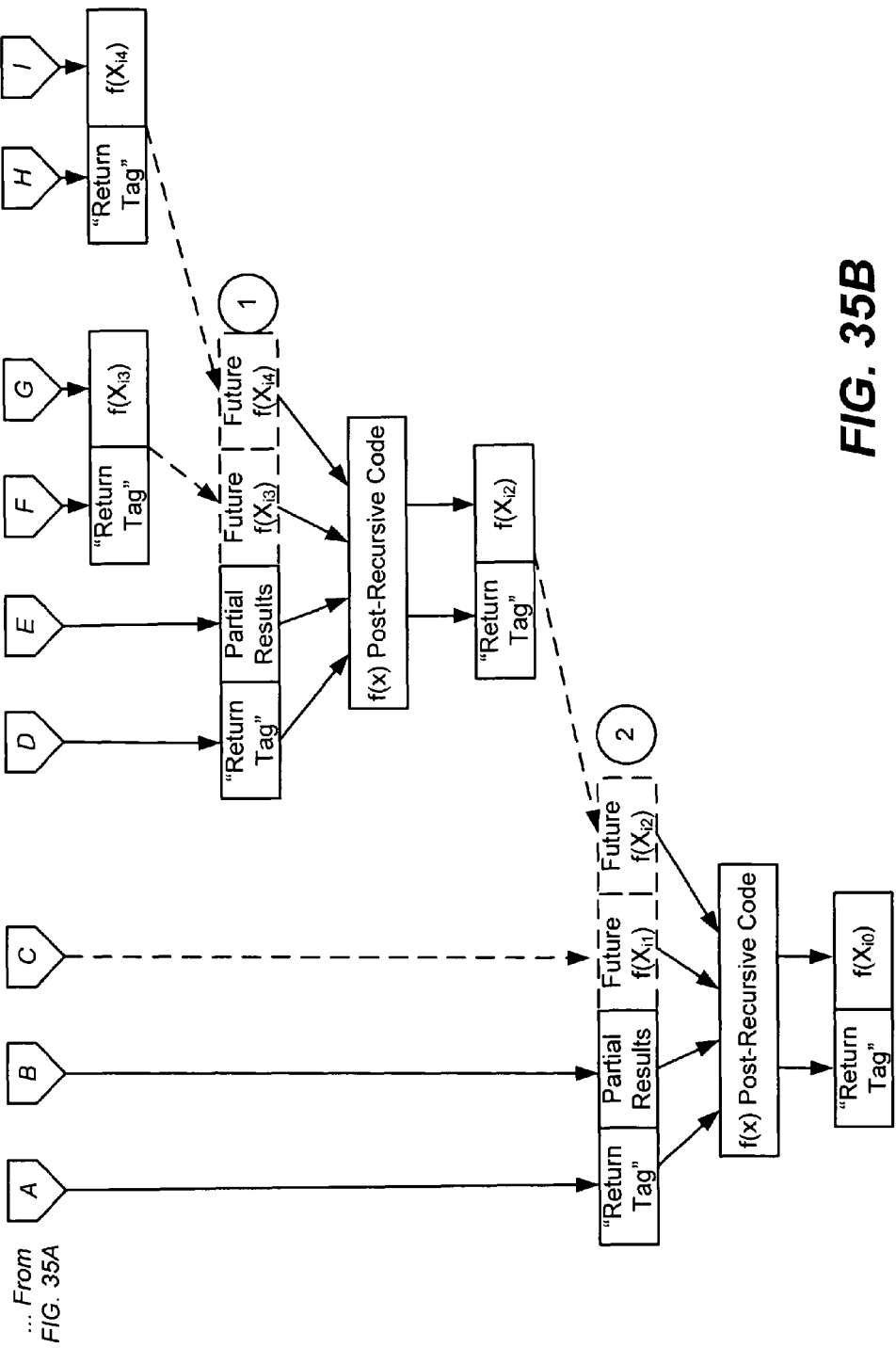
Figure 37:
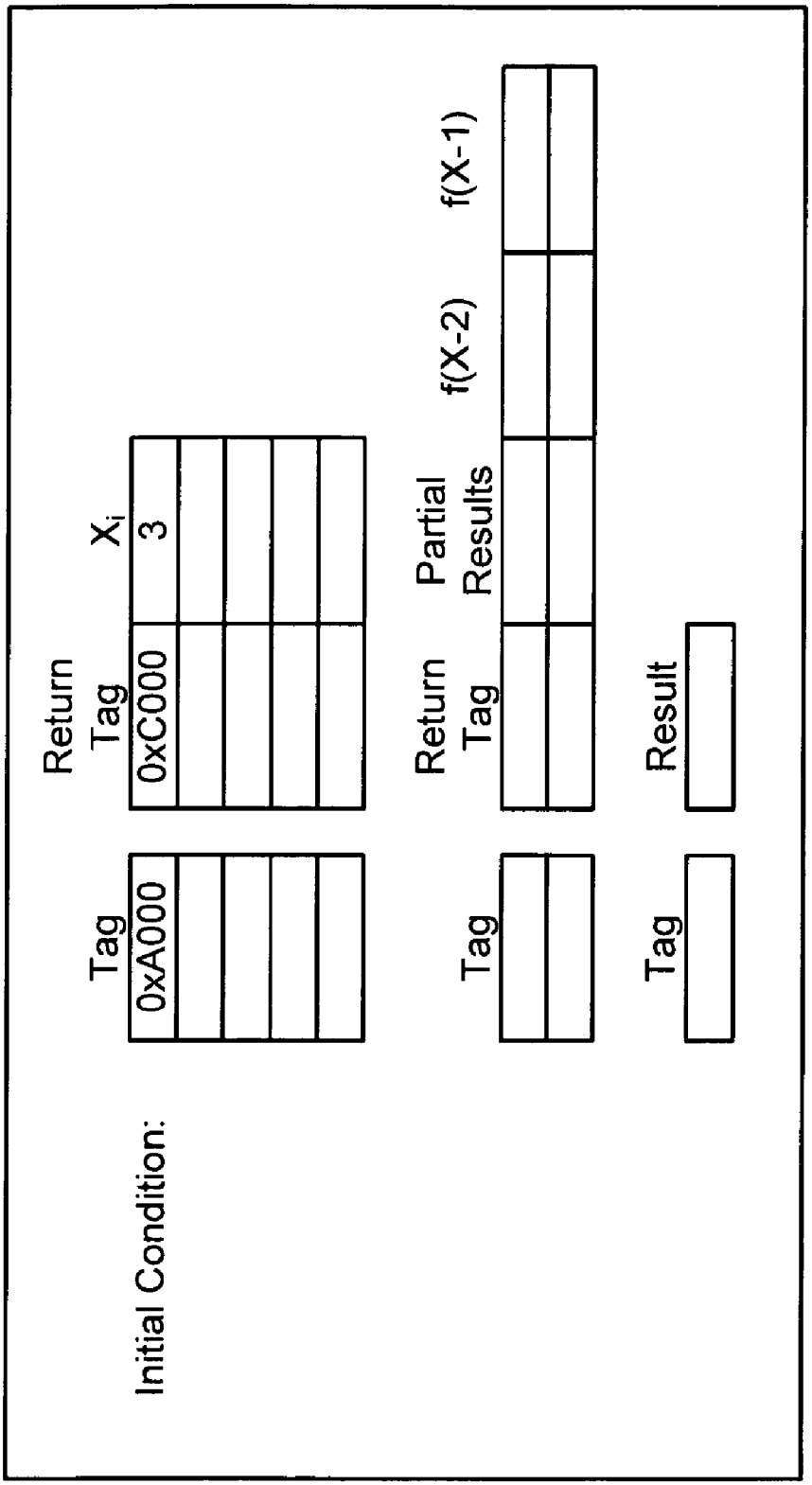
FIGS. 37-44 are repetitions of generated tags and results when handling the example recursive functions of FIGS. 35A and 35B, in accordance with various aspects of the present invention.
Figure 38:
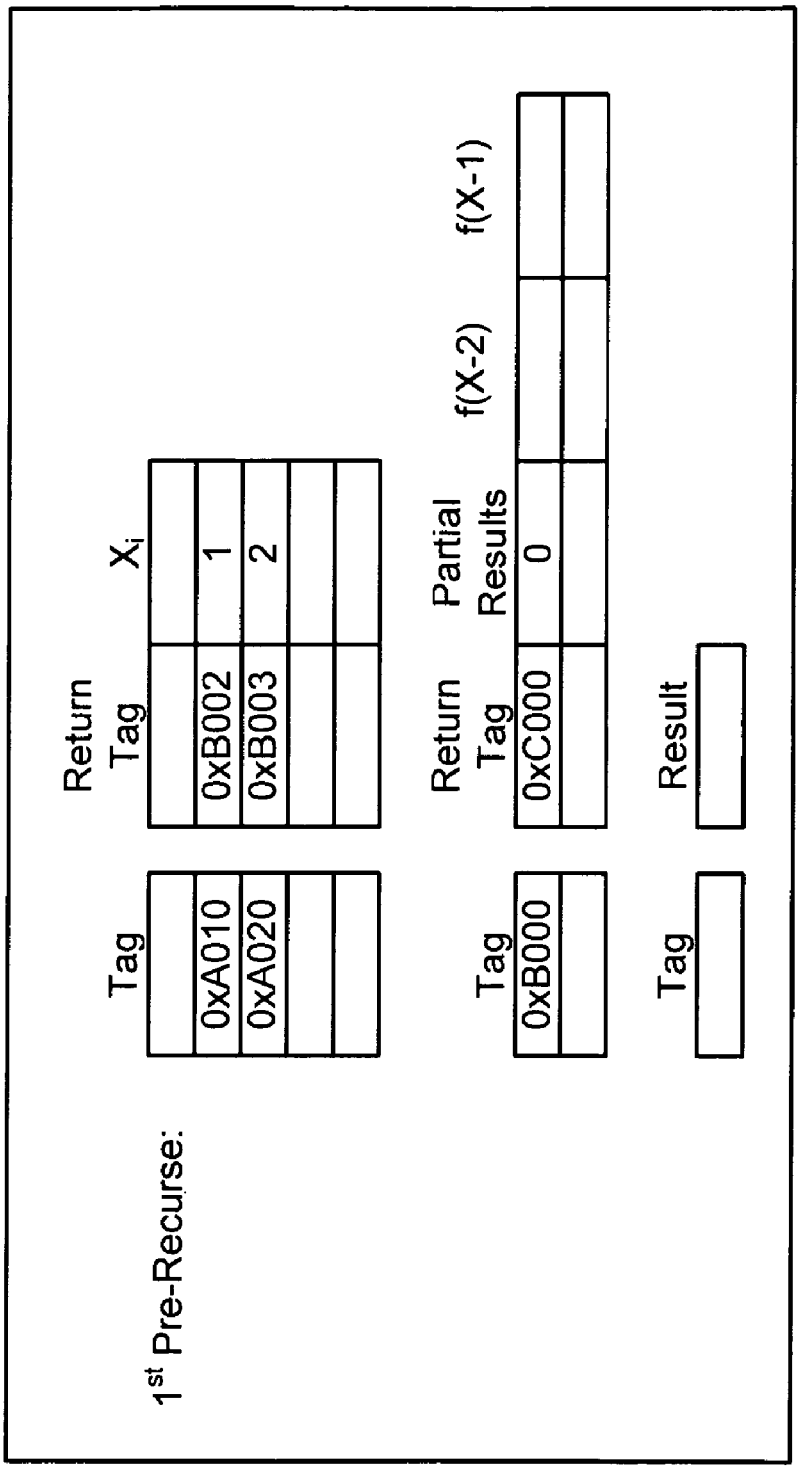

FIGS. 35A and 35B provide a conceptual example representation of recursion and sub-graph calls for a process function f(x) that can be used to calculate the Fibonacci value of a particular number recursively, as shown in the code below:

```
int f(int x) {
    if (x < 2)
        return x;
    else
        return f(x-2) + f(x-1);
}
```

Note that in FIGS. 35A and 35B, $X_{ij}$ equals a value used for instance i of X on recursive call j; also a solid line represents immediate results, while a dashed line represents delayed results. FIGS. 35A and 35B shows a call tree of the dataflow recursive calls, while FIG. 36 shows the format of the tags that are used for the pre-recursive and post-recursive calls, respectively.

As represented in FIG. 36, the pre-recursive call operand sets comprise two operands, namely the return tag and the current X value. The tag itself is split into four fields, comprising a common tag prefix specifying the tag space to which these belong, an instance value that is shared for a single X value, an iteration value j that is used to distinguish between separate recursive calls for the same X value, and a data or operand number that indicates whether this is the first or second operand in the operand set. Essentially, the i, j, and k values are manipulated (e.g., incremented) to remain in the correct tag space and avoid collisions within that tag space. Note that in this example only four nibbles are used for the tag; in practicality, a wider tag space may be necessary to avoid collisions.

The post-recursive call operand sets comprise four operands, namely a return tag, a partial results operand (unused in this example), the value of f(X-2) and the value of f(X-1). The tag field for these sets is also split into the same fields, except that the tag prefix used causes these tags to fall into the input tag space of the post-recursive half of the graph, and there are four different operand position indicator values.

Returning to FIG. 35A and by way of example of the iterative operation, input values are deposited into the input tag space of the pre-recursive half and scheduled for execution. The j iteration value for the input operands (represented in FIG. 36) is set to zero (0). The pre-recursive half begins reading in complete operand sets from the CAM 310. For every set it reads, it will check to see if the termination condition has been met. If it has, the appropriate value with the "Return Tag" is emitted as its tag value, and this recursive call is ended. Otherwise this call has not hit the terminating condition, and the process continues. Thus, an input value of one or zero would end, while an input value of two or above would continue, since the terminating condition is whether x is less than two. The following example uses f(3), and is also described with reference to FIGS. 37-44.

When continuing, three new operand sets are created, two for the new recursive calls f(X-2) and f(X-1), and one for the post-recursive code of this call. The operand set for the post-recursive code will contain the same "Return Tag" that was passed to it, any partial results that the pre-recursive code calculated, and two unknown (future) values corresponding to the two unresolved recursive calls. These unknown values are not immediately filled in and will be resolved after the two recursive calls have completed. The tag for this operand set will fall into the post-recursive code input tag space, denoted Y Tag Prefix in the diagram. The k parameter (FIG. 36) will be incremented once as the tags for the new operand set are emitted.

For each of the two new recursive calls, a return tag that falls into the correct unknown value slot from above is emitted, along with the updated function parameter value. The tags for these two new calls falls back within the input tag space of the pre-recursive code, except that the j value will be incremented once for each. These will be read back in by the same pre-recursive configuration since they are in the same input tag space and then processed as a new function call.

When the pre-recursive code has exhausted all of the operand sets in its input tag space, each of the initial X values should have hit their respective terminating conditions, although none of the function values are yet resolved. The only function values that could be resolved are those that immediately terminated with no recursive calls. At this point, the post-recursive code is configured for execution.

The post-recursive code begins retrieving completed operand sets from its input tag space. At first, there should be many uncompleted operand sets in its input tag space, and possibly one completed set corresponding to recursive calls where both of the child calls hit the terminating condition. As the completed operand sets are retrieved, the partial results, f(X-2) and f(X-1) values are added together to form a result. This result is then written back into the CAM using the associated "Result Tag" that was passed in as an operand. This action will complete a function evaluation, potentially completing another operand set in the CAM, which will trigger the completion of another function evaluation, and so on. The post-recursive code will continue executing until all completed operand sets have been exhausted from the CAM. When all operand sets have been exhausted, all of the recursive calls will have been evaluated.

This process has been further illustrated in a series of CAM snapshots, shown in FIGS. 37-44. The example evaluates the case where a single call is made to f(3), which matches the example illustrated in the call graph above. In this example, the input tag space of the pre-recursive code has the common prefix 0*A000, the post-recursive code as the common prefix 0*B000 and the output or ultimate return tag space is 0*C000. The algorithm begins at an initial time T1 when the caller writes a return tag value (in this case 0*C000) and an X value (3), into the input tag space of the pre-recursive code (0*A000), represented in FIG. 37.

The pre-recursive configuration is loaded and it reads in the only complete operand set in its input tag space (0*A000). With an argument of 3, the pre-recursive code does not hit the termination condition, so it creates three new operand sets. The first is for the post-recursive code so it is written into the 0*B000 tag space with both the return tag and the partial results field which is zero for sake of this example. At this time T2, represented in FIG. 38, two other operand sets are also created by writing out tags and operands for f(X−2) and f(X−1) to tags 0*A010 and 0*A020. Note that the return tag associated with these is designed to complete the missing operands from the newly created post-recursive operand set.

Figure 39:
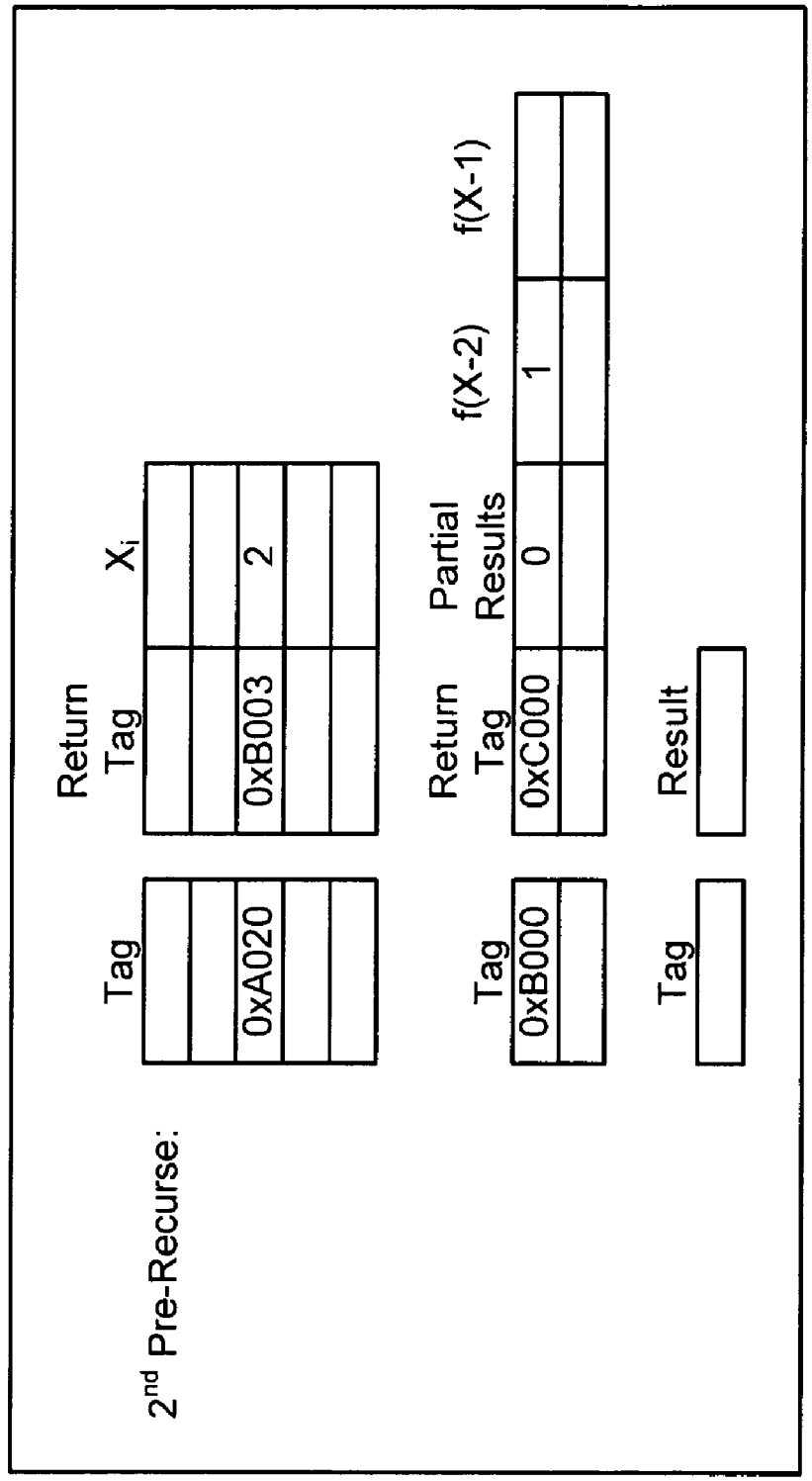

The pre-recursive code continues to retrieve completed operand sets from its input tag space and it pulls out the 0*A010 tag. The termination condition is hit for this one since X=1, whereby the appropriate return value is calculated (just 1 in this case) and it is output to the specified return tag of 0*B002, which puts it into one of the missing operand positions of the post-recursive operand set. This second pre-recursion operation, snapshot time T3, is shown in FIG. 39.

Figure 40:
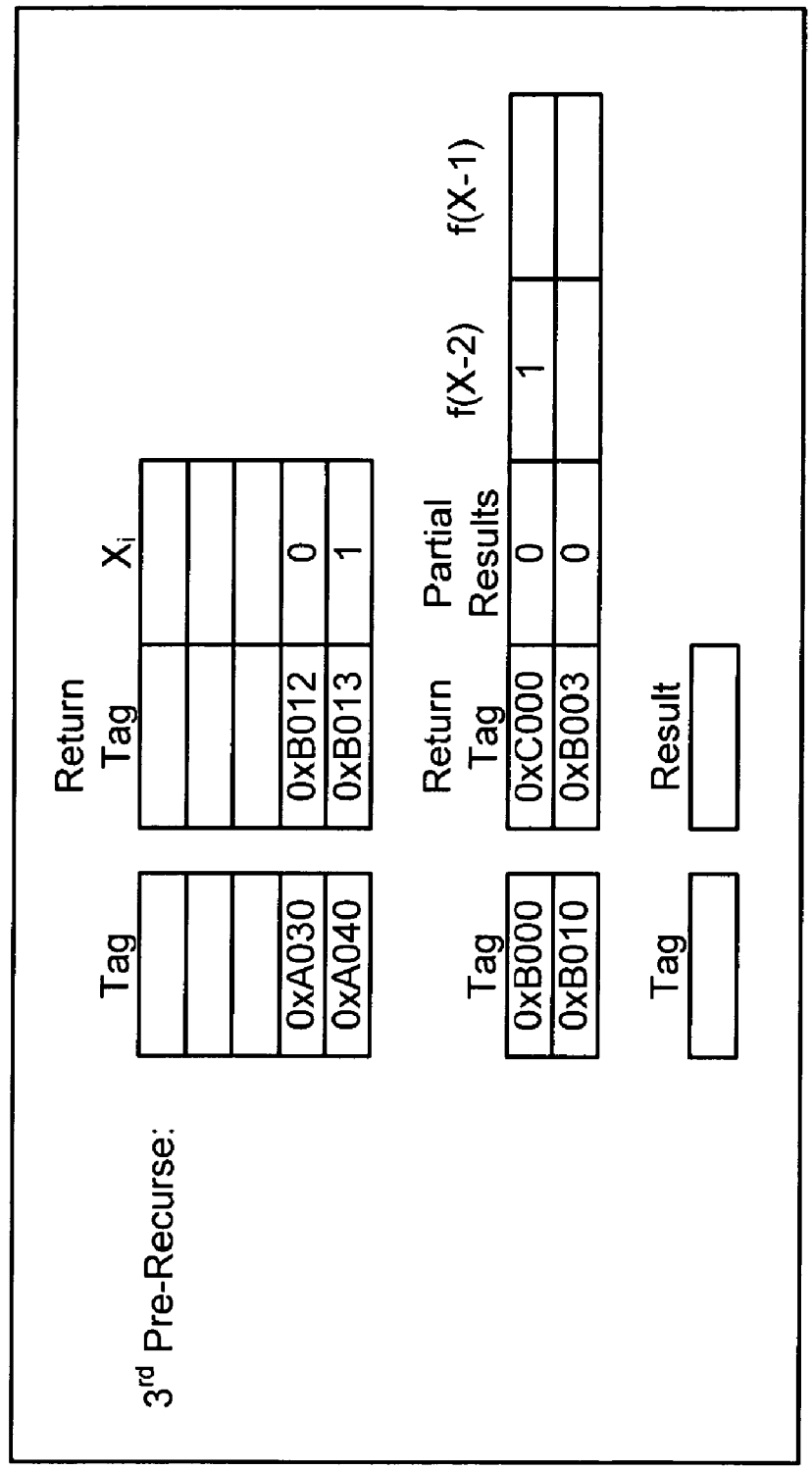

At time T4, the pre-recursive code then retrieves the 0*A020 line. This line does not yet meet the termination condition of X<2, and so it likewise spawns three new operand sets, one post-recursive set and two new pre-recursive sets, written to 0*B010, 0*A030 and 0*A040, respectively. This state is represented in FIG. 40.

Figure 41:
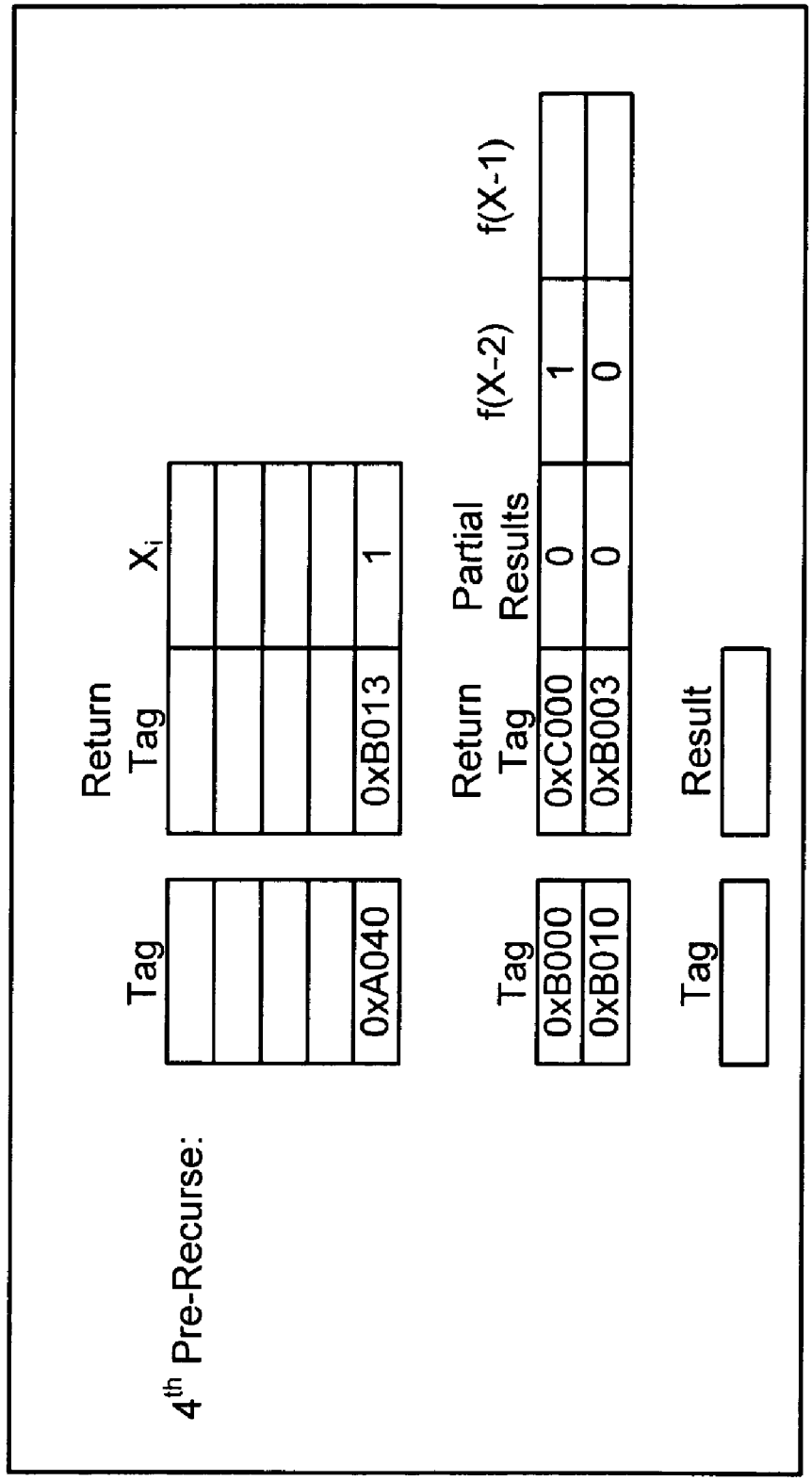

Thereafter, pre-recursive code fetches 0*A030, determines that the value of X=0 satisfies the termination condition and writes this value out with a return tag value of 0*B012, which fills in the first missing position of the 0*B010 post-recursive operand set. This state at snapshot time T5 is represented in FIG. 41.

Figure 42:
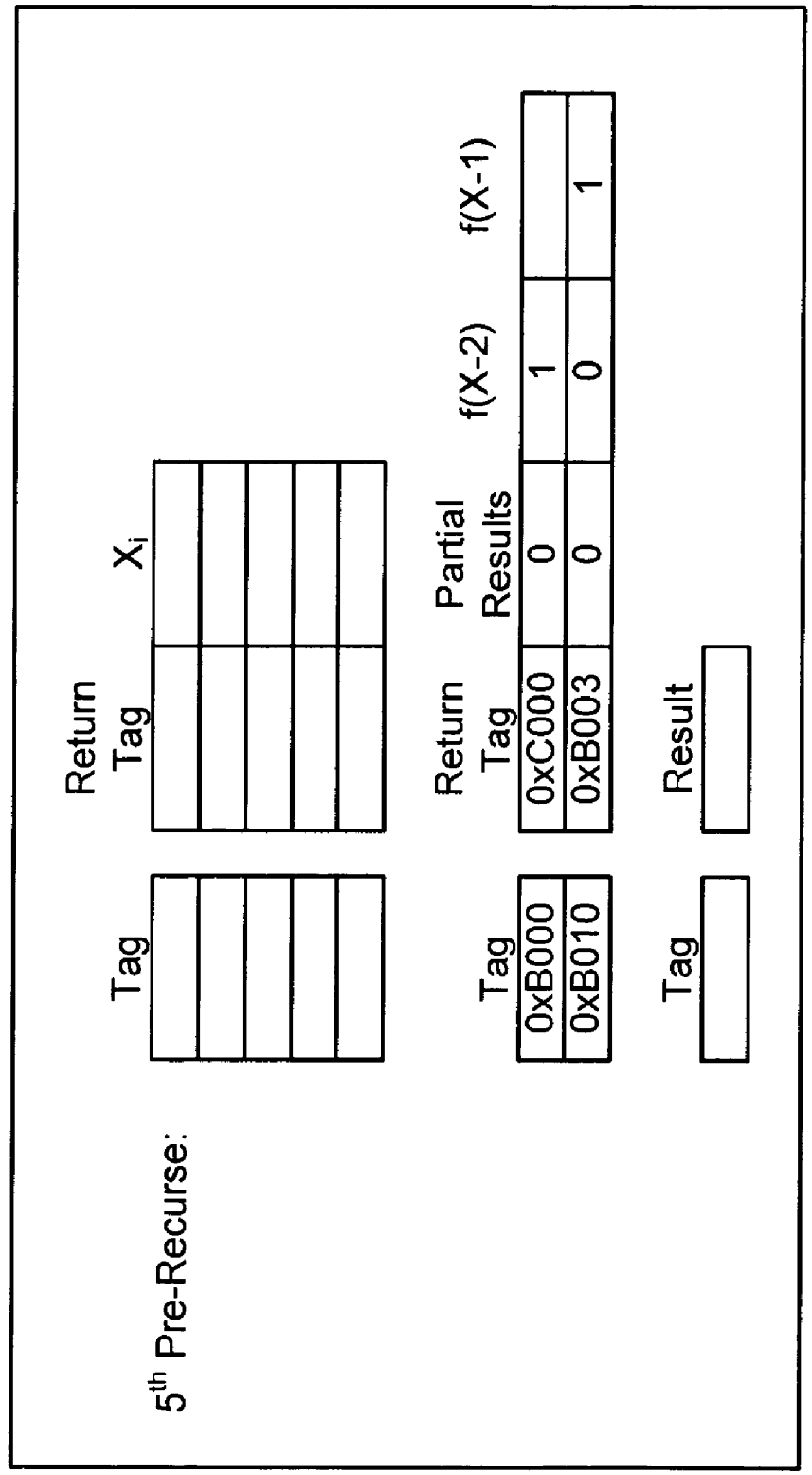

At time T6 of the recursion example, the pre-recursive code fetches the 0*A040 operand set from its input tag space, finds that X=1 satisfies the termination condition, and writes out a 1 with tag value 0*B013, completing the 0*B010 operand set. This state is represented in FIG. 42.

Figure 43:
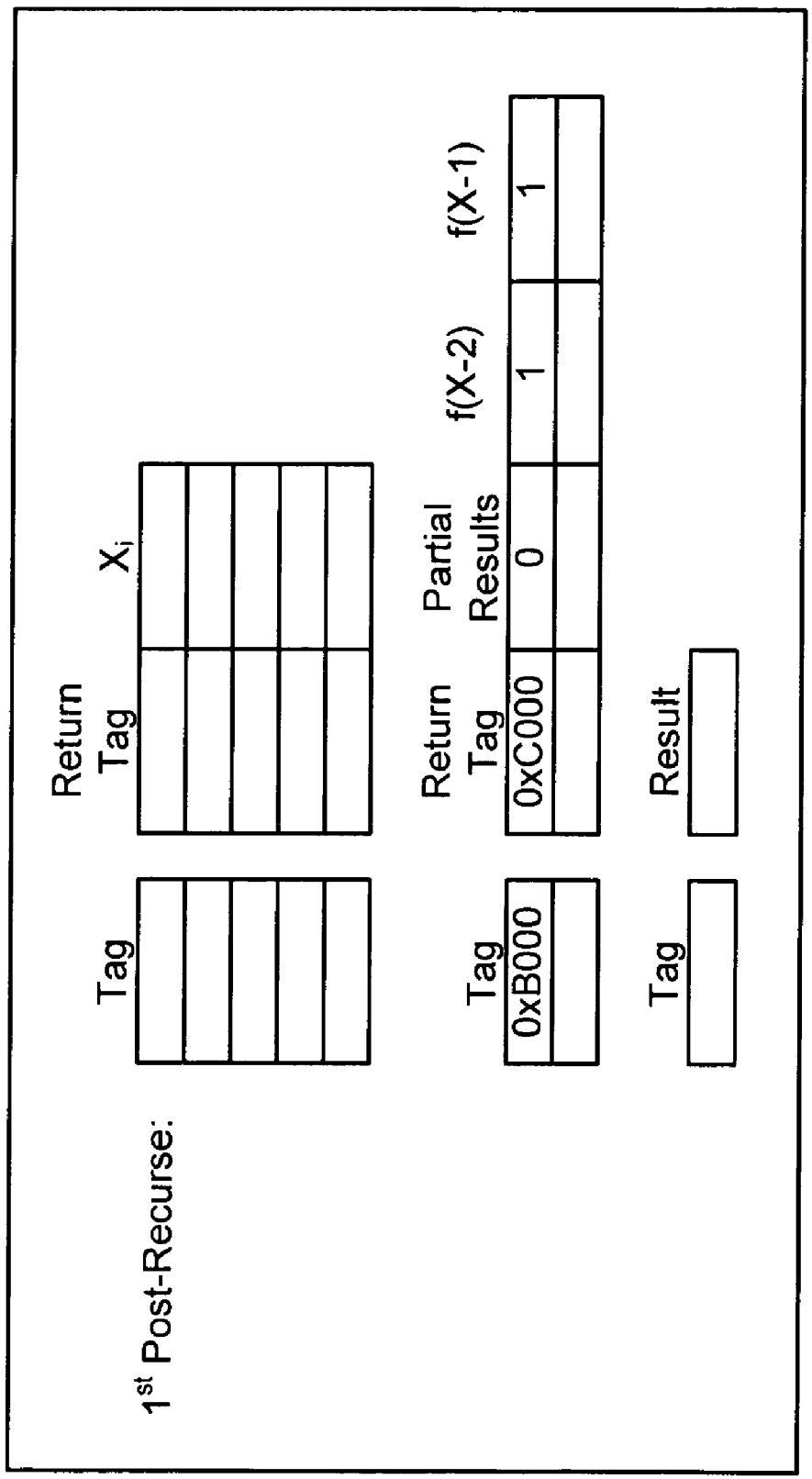

The pre-recursive input tag space is now empty, so that configuration terminates. However, the post-recursive code has operands, and thus the post-recursive code is scheduled and loaded. When the post-recursive code searches for completed operand sets, it finds the 0*B010 set in its input tag space. As per the code, it adds f(X−2)+f(X−1) to get 1, and writes that out with its return tag of 0*B003. This action completes the 0*B00 operand set, as represented in FIG. 43, snapshot time T7.

Figure 44:
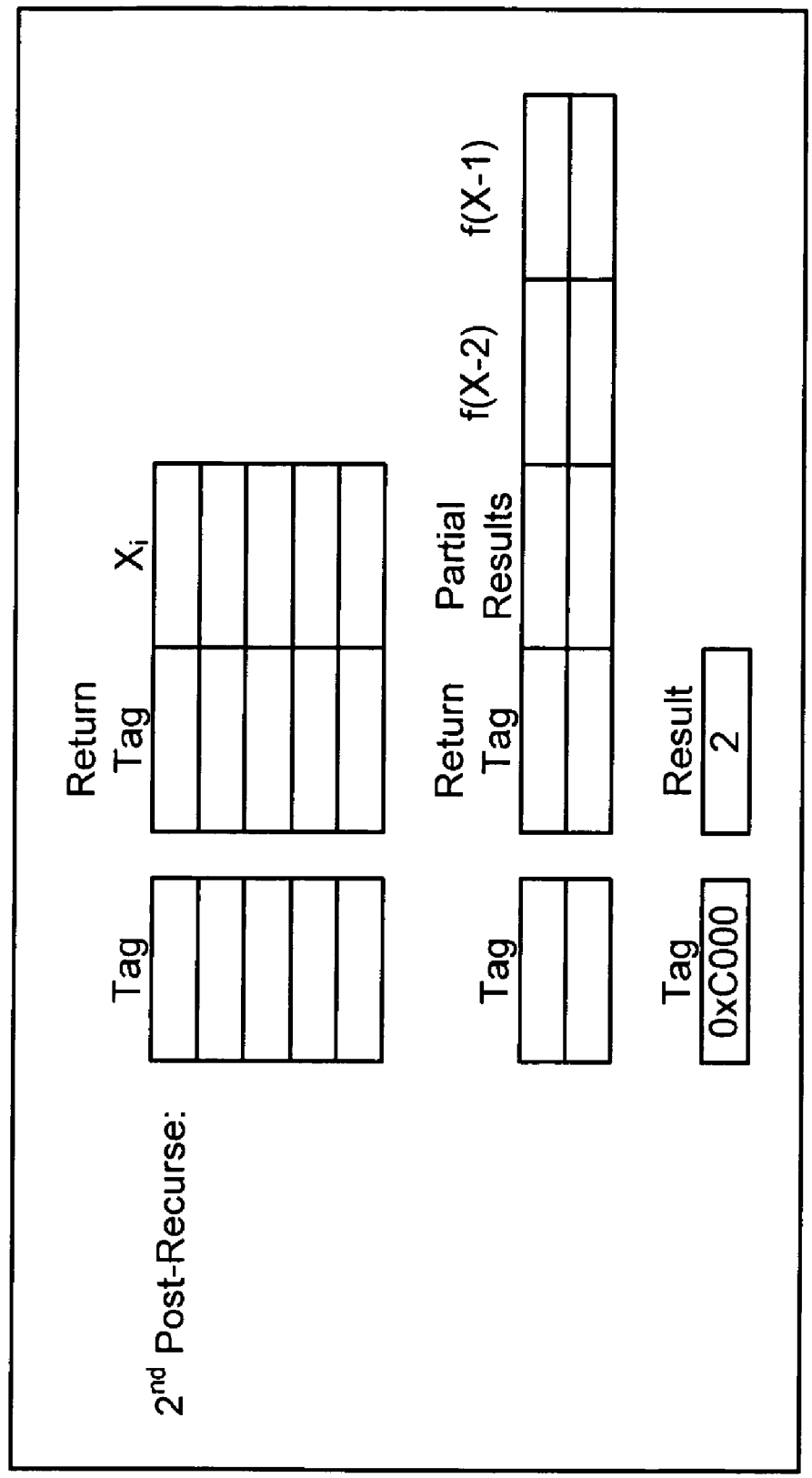

Because the 0*B000 operand set is now completed, the post-recursive code retrieves it, and performs f(X−2)+f(X−1)=1+1=2. This which is written to its return tag of 0*C000, which completes the recursive evaluation, as represented in FIG. 44, snapshot time T8.

As can be seen, using this method, there is no toggling or thrashing between configurations in order to execute the recursion. The pre-recursive half is loaded and executed once, and the post-recursive half is loaded and executed once. This is beneficial, because the overhead of performing a configuration operation should be avoided when possible. Instead, in keeping with the present invention, CAM space is used to store intermediate results until those results can be completely evaluated. It is quite possible that more than one configuration would be needed to realize either the pre-recursive or post-recursive code, but there is a clean split between the end of the pre-recursive code execution and the beginning of post-recursive code execution.

Since CAM space is used to store results, the depth of the recursion is limited by the size of the CAM and also by the width of the j or k iteration fields in the tag. For this particular example, j grows twice as fast as k, so it will be the limiting factor. If the j field "rolls over," problems (collisions) will ensue.

The recursive calculations do not suffer from the overhead of subroutine calls and returns that would need to be present in a control-driven system. Further, the structure and separation of the tags allows many different X values to be evaluated in a parallel and/or pipelined manner. It would be possible, for example, to have two or more instances of the pre-recursive code operating in parallel and likewise with the post-recursive code. Moreover, it can be observed that for any single X value, it is necessary to return values to the CAM and then retrieve them before execution can continue. This may add latency to the calculation, however this may be hidden by pipelining if there is more than one initial X value undergoing simultaneous evaluation.

Turning to a consideration of constants, constants in a dataflow graph provide interesting problems. Generally, every operand set that goes through a configuration with a constant needs to have that constant available. It is not desirable to replicate the constant as part of every operand set, since this would consume on and off chip bandwidth, resources and clock cycles. For example, if a node is created that adds ten (10) to every operand that flows through it, it is desirable to avoid having to steer the value ten through the architecture for every matching operand. Further, the constant may need to periodically change under program control. The solution to these problems depends on the input tag space model that is used.

Using a fixed prefix input tag space model, one solution is to supply the functional units in the CAM architecture with a set of shadow value registers. When the functional unit detects that a new operand is starting, the functional unit can load the value of the constant or constants from the shadow registers and work with those for the duration of that operand. When a new operand is started, the shadow registers are loaded again. Updates to the constant may be handled by storing the constant or constants in special fields in the configuration header that uses them. At configuration time, the constants are loaded from these fields, and updates to the constants are written to these fields.

The situation is improved if the functional input tag space model is used. In that case, the constant to be used can be given a single fixed tag that is referenced by all the operand sets in the configuration. Every configuration references the same piece of data, which means that it will only occupy a single cache line and it does not need to be read from off-chip, saving both on-chip resources as well as off-chip bandwidth. The update mechanism for changing the constant is to simply write a new value to this fixed tag location.

Digit serial arithmetic also is considered, since values are represented as a string of digits that move through the machine in serial fashion. The same solutions can be applied by making the observation that digit serial computations maintain some notion of arithmetic state in the node. This state can be thought of as an arithmetic residue that needs to be tabulated, and may be represented by two or more integers representing a rational expression of the node's current value.

For the fixed prefix input tag space model, shadow registers may be used to preload the internal state of the node when a new string of input digits begins. In that way, the desired constant is preloaded and will be emitted as part of the arithmetic process. Depending on the structure of the digit serial implementation, this method can also be used to multiply or divide by constants as well as adding and subtracting them. Arbitrary linear combinations of the input values may also be possible.

If the functional input tag space model is used with digit serial arithmetic, the solution is to assign the constant to a fixed tag position and read it as any other operand. However, it may still be beneficial to be able to perform some of the constant scaling or offset operations described herein, and for that reason it may be desirable to include shadow registers.

Hardware Constructs:

Turning to a consideration of various practical examples of how constructs may be built in real hardware, in one implementation, the external memory structure of the system is designed with conservation of chip bandwidth being a primary consideration, due to the differential between the speed of on-chip memory and off-chip memory. On a clock-for-clock basis, data can be accessed on chip significantly (e.g., at least four times) faster on-chip than off-chip, even assuming that the exact location of the external data is known; further, the differential between on-chip memory access times and off-chip access times tends to increase. In general for a tagged data system, the exact location of the data is not known in advance as it would be for a typical control-driven processor, and so the problem is exacerbated. The problem can be aided if the tags exactly correspond to physical RAM addresses, but this limits the size of the tags.

It should be noted that the differential in speed between on-chip memory and off-chip memory can be likened to the speed differential between main memory and a hard disk drive. As a result, many external memory algorithms that have been used by software to handle large databases are applicable.

In general, the data structures used by the CAM architecture need to be online in the sense of external memory operations, whereby individual data items will be inserted and deleted (essentially database-like) while maintaining the integrity of the CAM at runtime. The data structures also need to support fast searching for a particular entry in the CAM for the sake of token matching. When a new data value is written out from a configuration, its associated tag needs to be sent to the CAM and stored in the correct position for fast retrieval later.

The CAM is generally configured to support streaming range queries based on a common tag prefix. This will be needed when a configuration begins running and requests completed operand sets as input. While other dataflow architectures have used hashing as a viable tag matching strategy, hashing is not particularly amenable to this requirement.

Because the structures are implemented in hardware, the data structures need to be relatively easy to maintain, since maintenance will be performed by state machines on the chip. Further, easy to maintain generally implies fewer memory accesses for the sake of housekeeping, which will help reduce the amount of overhead cutting into the off-chip bandwidth. This constraint can come at the expense of some wasted external RAM, since it can be observed that RAM sizes continue to follow a quite exponential trend in growth. Certain properties of modern synchronous RAM must be observed and accommodated. For example, there are speed benefits to being able to access data in contiguous bursts of eight words. Also, there are penalties for moving between RAM banks, while moving within the same bank is almost free.

Figures 45, 46:
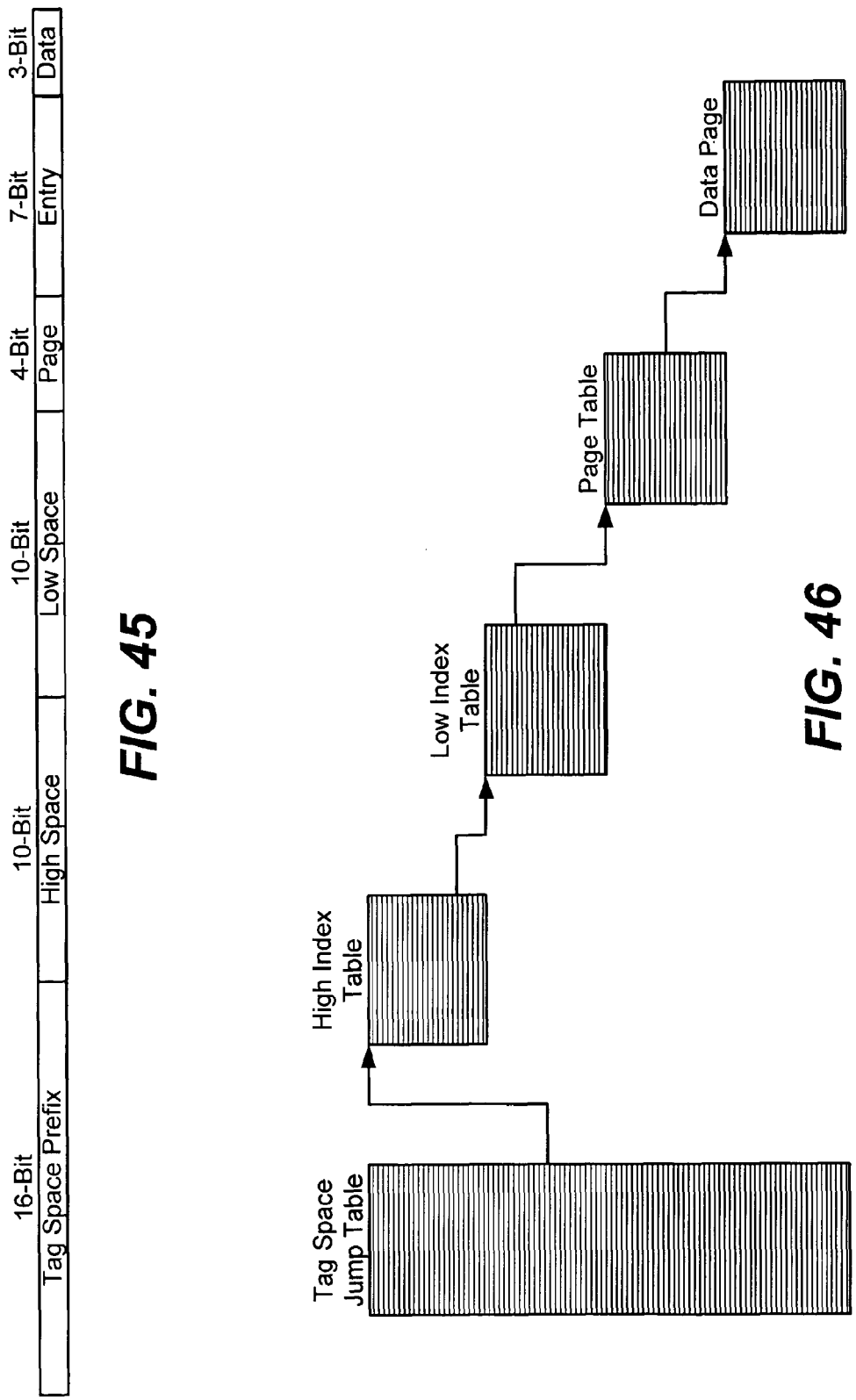
FIG. 45 is a representation of how a tag is partitioned in an external memory, in accordance with various aspects of the present invention.
FIG. 46 is a representation of an example external memory data structure hierarchy, in the form of an example multi-level TRIE implementation, in accordance with various aspects of the present invention.

These constraints lead to the selection of a multi-level TRIE as one suitable data structure. To support this, in one implementation, the tags are sub-divided as represented in FIG. 45, showing external memory partitioning of the tag. In FIG. 45, the fields are used to index pointers in a hierarchy of tables to access the tag/data of interest. In memory this appears as an external memory data structure hierarchy, as represented in FIG. 46. Note that the external memory organization shown herein is only one example concept of an efficient implementation, and other organizations and/or implementations are feasible. Another implementation of the external memory organization has been illustrated in FIG. 53.

Figure 47:
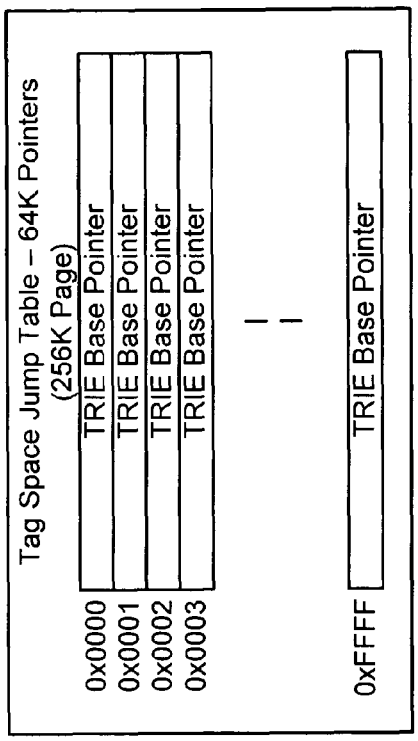
Figure 48:
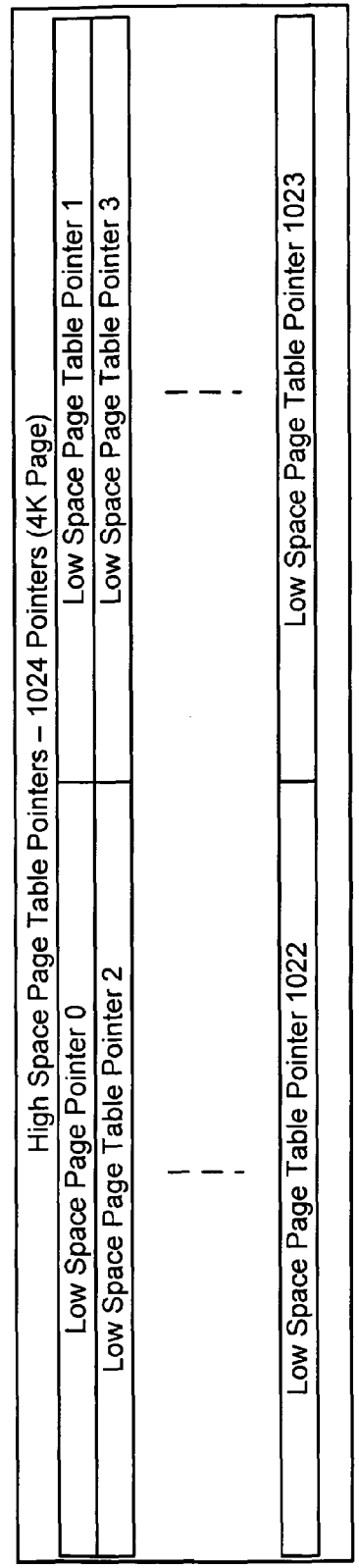

The tag prefix is used to index into a jump table, which may have a format such as shown in the external memory tag space jump table of FIG. 47. This table contains the base address of separate TRIEs for each of the tag spaces. If a pointer is NULL, then that tag space is not currently in use. The root of each TRIE takes the External Memory High Index Table form shown in FIG. 48. This table is indexed by the High Space field shown above in the tag, in order to derive a pointer to another table, which is essentially identical, as represented in the external memory low index table of FIG. 49. This external memory low index table is then indexed by the Low Space field above, and gives a pointer to a page table.

The page table, however, is different. The page table is indexed by the Page field from the tag, and each entry contains a pointer to a page of real data values, but it also contains status bits for every operand of every operand set contained in the target data table. FIG. 50, as continued on FIG. 51, shows an external memory page table with 128 operand sets per page pointer, and 16 page pointers with operand set status bits.

The page table is separated into 16 regions (page pointers 0 to 15), each of which contains a pointer to the associated data page, as well as presence flags for each of the operands. If a data page is empty, the pointer will be set to NULL. As shown, there is one byte of presence information for each operand set, and one bit of every byte is associated with one of the eight possible operands in that set.

The data page itself conceptually appears as represented in FIG. 52, as a data page having 128 operand sets, with 8 operands per operand set. Because presence flags are maintained for every word of data in the system, storing those flags requires consideration. In typical use patterns, the CAM controller 2420 (FIG. 24) will either be attempting to find a particular entry and write in a new value, in which case the appropriate presence bit will need to be set. Or, the CAM controller will be performing a read operation, in which it may wish to pull out only complete operand sets. Particularly in the read scenario, it is advantageous to store the presence bits for the data page at least one level higher in the hierarchy than the actual data itself, since that information can then be used to guide future burst reads from the data page itself in a streaming pipelined fashion. Further, it may well happen that there is a page that consists entirely of uncompleted operand sets, and having access to the presence bits at this level will allow the entire page to be skipped while avoiding the potential of a wasted RAM bank switch. Note that each of the page table entries include empty space by design, in the anticipation that more flags will be needed over time.

After the initial tag space jump table, the other sub-tables are the same size, which are shown here as being nominally 4 K bytes. The advantage of having the tables as the same size is that the memory allocation scheme is simplified and there are no fragmentation concerns that may develop if different size tables were used at each level of the hierarchy. The disadvantage of this approach is potentially wasted space for sparse tag sets. For example, if a tag space were created such that only one operand set of any given data page were occupied, there is potentially a large percentage of waste. As shown, the memory allocator can maintain a single linked list of the available pages and dole them out indiscriminately to any level of the hierarchy. Of course, there is an advantage to allocating all nodes within a given TRIE memory from the same RAM bank since the bank switch penalty can then be avoided.

The design also lends itself to a bursting RAM architecture, since relevant data is placed in consecutive memory locations. For example, all of the operands for an eight operand set may be read in a burst of four reads from the data page. Also, all of the presence bits for a data page may be read from the page table in two bursts of eight reads.

Note that the data structure design degenerates to support operand sets that are smaller than eight operands, (even though eight have been used in the example). The presence detect bit fields, as well as the data page itself can easily be sub-divided to support 8, 4, 2, or 1 operands per operand set, by changing to a narrower interpretation of those fields. Likewise, operand sets of size 7, 6, 5 or 3 can also be easily accommodated with little or no waste. The exact size needed can be specified at run-time by the configuration data.

It is advantageous to cache some of the higher level tables on chip, in order to avoid having to reread those as a tag space read operation scans the data structure in order to feed a configuration. A 4K page size is generally amenable to that, although no particular size is required. In present implementations, the main tag space jump table is too large to cache on-chip, though it is possible to cache the pointers for active tag spaces.

Figure 53:
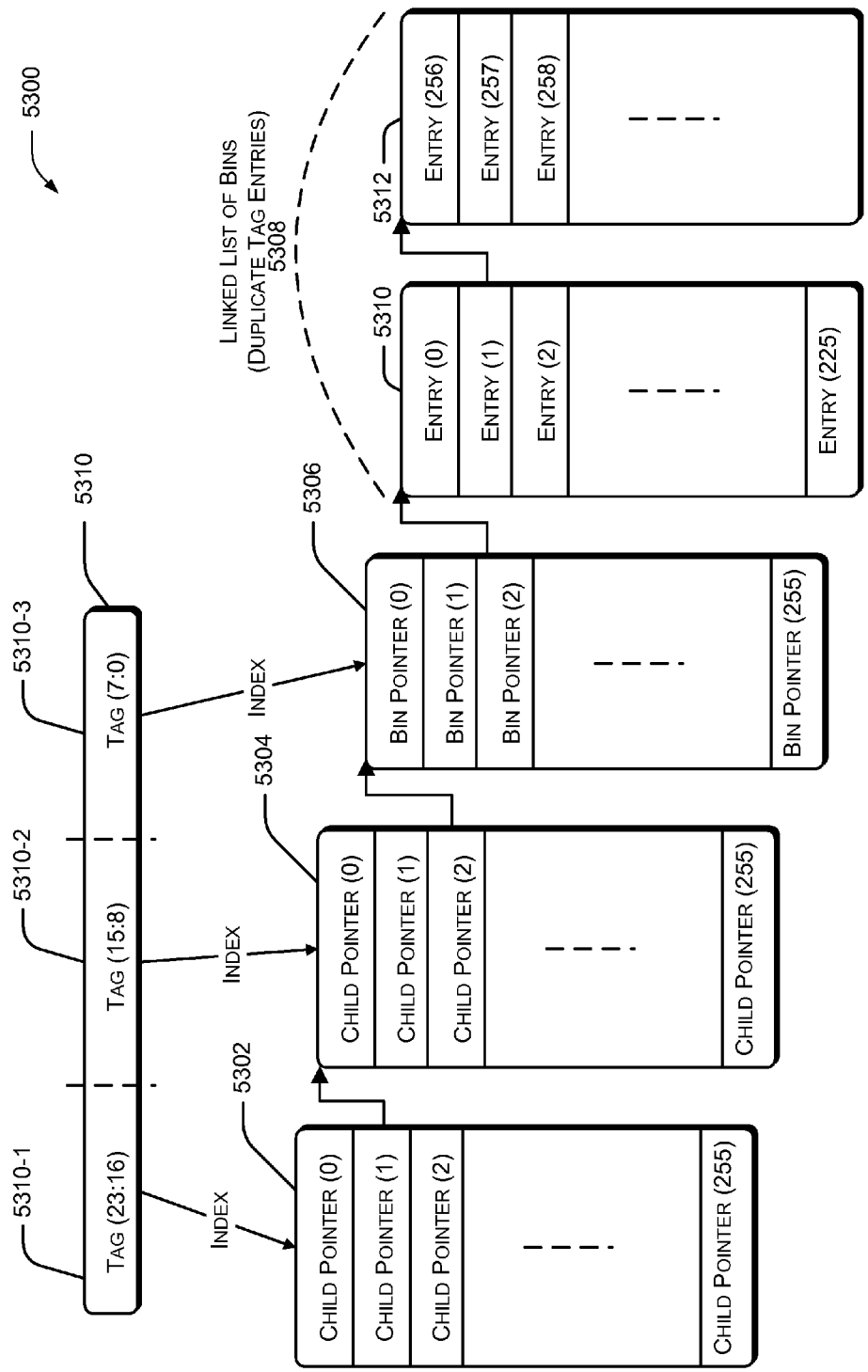
FIG. 53 illustrates an exemplary CAM implementation that allows usage of identical tags to refer to multiple entries stored in a RAM or other memory device.

In another example implementation, shown in FIG. 53, the CAM memory architecture is implemented utilizing TRIE data structures, which may include multiple binary TRIE data structures. Such a CAM architecture can be implemented using commercial RAM by super-imposing the data structure over the RAM. A hardware memory manager, such as memory manager 115 in FIG. 1, maintains the data structure in the RAM utilizing one or more look-up tables.

In an exemplary embodiment, the CAM architecture supports data structures to allow multiple identical tags (or duplicate tags), each with different data values, to be stored in a memory, such as a RAM. To this end, the CAM architecture uses tags for data identification that are sub-divided into bit fields in a manner similar to that explained earlier. Each of the bit fields may be of the same width, such as 8 bits each, or of different widths. In addition, any number of bit fields may be included in the tag. The CAM architecture allows optimization of the width of a bit-field and the number of bit fields in a tag based on factors, such as number and type of computations performed, extent of memory utilization, actual access time, etc.

The CAM architecture utilizes the bit fields to index pointers in a hierarchy of look-up tables to eventually access the tag and data value of interest. To support duplicate tag entries, each entry in the look-up table for the last bit field in the tag has a pointer to a linked list of bins instead of a pointer to a page of data values as discussed earlier. Each entry in a given bin or location is assigned an identical tag for identification or retrieval of data value associated with duplicate tag entries. Thus, a bin is capable of holding more than one data value at one location, without overwriting any previously stored value.

According to this exemplary embodiment, when a query requests retrieval of a value stored in a bin, the CAM architecture may provide for one or more values (duplicate values) stored at that particular location in response to the query. Access overheads for retrieving multiple entries (duplicate entries) are minimized using a hardware memory manager, e.g., memory manager 115, to ensure that the multiple entries in a bin reside in consecutive physical RAM locations. Such a memory organization facilitates a fast burst mode of read operations in the memory.

FIG. 53 illustrates an exemplary CAM implementation 5300 that allows usage of identical tags to refer to multiple entries stored in a RAM or other memory device. To this end, the CAM architecture 5300 includes a hierarchy of look-up tables 5302, 5304, and 5306, and so forth. Each entry in each table is associated with a pointer to another look-up table. For example, an entry at child Pointer (1) in table 5302 includes a pointer to table 5304. Similarly, an entry at child Pointer (2) in table 5304 includes a pointer to the look-up table 5306. Each entry in the table 5306, which represents the table associated with the last bit field, is associated with a pointer to a linked list of bins 5308. For example, an entry at Bin Pointer (2) includes a pointer to a linked list of bins 5308 that stores multiple data entries. All the data entries in the linked list of bins 5308 are referenced by the same tag and therefore may be referred to as duplicate tag entries. However, each of the duplicate data entries correspond to unique values associated with each duplicate tag.

In operation, retrieval of data from the CAM architecture 5300 is performed using a query tag associated with the data, such as tag 5310 shown in FIG. 53. In an exemplary scenario, the query tag 5310 includes 3 bit fields, 5310-1, 5310-2, and 5310-3. Although the bit fields 5310-1, 5310-2, and 5310-3 are shown to be 8 bits wide each, it may be appreciated that the bit fields can be of variable width as discussed earlier. Furthermore, the number of bit field may be "n", where n denotes a positive integer.

Each of the bit fields 5310-1, 5310-2, and 5310-3 correspond respectively to a portion of the tag 5310 that is utilized as an index into a look-up table. For example, bit field 5310-1 provides for an index into look-up table 5302, bit field 5310-2 can be used as an index into look-up table 5304 and bit field 5310-3 can be used as an index into look-up table 5306.

To access, or read, data corresponding to the query tag 5310, the CAM architecture first searches table 5302 for the tag portion associated with a first bit field, e.g., bit field 5310-1. When the tag portion is found as an entry in table 5302, the CAM moves on to another table referred to by a pointer associated with the entry. For example, if the tag portion associated with the field 5310-1 is found as an entry that is associated with the child pointer (1) in the table 5302, the CAM moves on to the table 5304 addressed by the child pointer (1).

In a successive progression, the CAM then searches for the tag portion associated with a second bit field, e.g., bit field 5310-2 in table 5304, and similarly moves on to another table referred to by a pointer associated with a matching entry. For example, if the matching entry is found to be associated with the child pointer (2) in table 5304, the CAM moves on to table 5306 as directed by the child pointer (2).

Successively, the CAM then searches for the tag portion associated with the next bit field 5310-3 in table 5306. Since the field 5310-3 is the last field in the tag 5310, table 5306 corresponding to the field 5310-3 includes entries that are associated with pointers to a linked list of bins. When the tag portion associated with the bit field 5310-3 is found as an entry in the table 5306, the CAM moves on to the linked list of bins addressed by the entry. For example, if the tag portion is found as an entry associated with the bin pointer (2) in the table 5306, the CAM moves on to the linked list of bins 5308 as pointed to by the bin pointer (2). An entry in a bin 5310 in the linked list of bins 5308 may point to another bin 5312 and so on. The CAM then retrieves one or more data entries in the linked list of bins 5308 in response to the query 5310. Thus, a single query tag may facilitate referencing and retrieving of multiple data entries in a RAM. A so-called carry chain algorithm may be implemented to traverse the lookup tables when multiple tags are queried.

If duplicate tag entries are not supported, the table associated with the last bit field in the tag may contain a value table rather than bin pointers, such as the bin pointers in look-up table 5306 of FIG. 53. Thus, for example, look-up table 5306 indexed by the bit field 5310-3 may contain a table of data values instead of bin pointers.

The CAM architecture may also support early termination of non-existent tags by providing the equivalent of a null pointer in a look-up table at the earliest possible level of a search or a retrieval operation. The null pointer indicates the absence of a data value in the look-up table. Thus, the memory resources are optimally utilized by avoiding pursuit of data corresponding to a query tag when it is determined that an entry in a look-up table includes a null pointer. To use an example with reference to FIG. 53, when an entry indexed by the first bit field 5310-1 is not found, the search operation is terminated and the tag is declared to be non-existent in the memory.

The CAM architecture may support a caching scheme to cache the look-up tables that are frequently used. In such a configuration, the look-up tables, e.g., look-up tables 5302, 5304, and 5306, may be stored on an on-chip memory or cache memory when those look up tables are accessed frequently. Other criteria may be employed to determine priority of look-up tables while caching. There may also be a case when the cache memory has reached its maximum storage capacity. In such a case, the CAM architecture supports eviction of the cache memory based on various parameters like the frequency of usage of a particular look-up table, for example. The caching may also be partial, with only portions of the look-up tables being cached. For example, the CAM architecture may be configured to cache only the first look-up table or root table, e.g. 5302, of each of the CAMs implemented in the RAM. It may be appreciated that various algorithms known in the art may be employed to implement the caching, management, and eviction of the lookup tables and other data from the cache to optimize system characteristics, such as access efficiency.

As mentioned above, the tags and/or look-up tables may be arranged in an adjacent manner in the RAM and/or cache memory. For example, lookup tables that will be accessed in sequence may be stored adjacent to each other. This memory adjacency allows the hardware to use fast RAM burst accesses to stream in lookup tables as well as data to form complete operand sets that can then be forwarded to computational hardware, such as hardware 302, for processing. This model of computation attempts to ensure that values can be quickly and efficiently retrieved at execution time.

Presence bits may be utilized with the CAM architecture to indicate whether a data value associated with a tag is present and/or whether the look-up table corresponding to that tag is cached or not. The presence bits may be stored along with the each lookup table entry. For example, 2 bits may be allocated for representing presence information. The first bit may indicate whether a lookup table entry or data value associated with a tag bit field is present or not. The second bit may indicate whether a look-up table entry or data value corresponding to the tag bit field is available in the cache memory or not. Each time a portion of a CAM data structure (e.g. look-up tables 5302, 5304, 5306 etc.) is loaded into the cache, the presence bit(s) are modified to indicate the presence of the data structure in the cache memory.

Thus, the presence bits associated with a matching tag may correspond to one of the following state information (indicia):
not present,
present but not cached, and
present as well as cached.

It may be noted that when the presence bits indicate that a lookup table entry or data value for a matching tag bit field is present and the is available in the cache memory, such as on-chip CAM storage 106, the retrieval of the lookup table entry or data value is faster as it consumes fewer memory cycles. On the other hand, if the presence bits indicate that the lookup table entry or data value is present but is not available in the cache memory, the lookup table entry or data value is retrieved from the off-chip memory, such as RAM.

As discussed earlier, the CAM architecture also supports use of wildcard bits, or "don't care" values, in arbitrary positions in the query tag (e.g. 5310). Thus the CAM supports the retrieval of multiple data values by accessing multiple matching tags in response to the query thereby enabling the CAM to perform ranged queries to retrieve multiple data values. For example, if a query tag has a first bit field as "101??111" where "?" denotes a wildcard bit, the CAM architecture provides all the data values associated with the query tag considering a "don't care" bit value for the $4^{th}$ and $5^{th}$ bit position of the bit field. The query tag "101??111" will return a result set of data values that contains A7, AF, B7, and BF (in hexadecimal number system). The four data values correspond to all possible combinations of the wildcard bits "??" at the $4^{th}$ and $5^{th}$ bit positions in the bit field, i.e. "00", "01", "10", and "11".

A special logic may assist the wildcard process. The logic may have two lines, or wires, the first wire corresponding to the presence of a wildcard bit and the second wire corresponding to the bits that are to be mapped, i.e., bits other than wildcard bits. The logic may be implemented alongside each of the entries of a look-up table in the form of hard-coded information.

Leading field bits in a tag may be utilized to address a particular CAM data structure by accessing a matching ID in a RAM. Further, the leading field bits in the tag may also be used to place each CAM data structure into a physically separate memory under software control. Accordingly, there may be a multitude of CAM architectures, e.g. data structures like binary TRIEs, in a single RAM chip with an identifier (ID) characterizing each of these CAMs.

The CAM architecture also supports variable length tags by implementing different data structures, where longer tags are stored in a larger data structure and shorter tags are stored in a smaller data structure, separate from the larger data structure. By way of example, the CAM architecture (e.g. 5300) may include a first tag (e.g. 5300) having a first length, or number of bit fields, and a second tag having a second length. These first and second lengths may be the same or different. The first and the second length tags may be implemented in multiple CAMs, with each CAM being associated with separate RAM memories and/or controllers, which may allow for parallel accesses to the CAMs. Such an implementation allows realization of more than one CAM using one or more RAMs.

A memory write operation in the CAM architecture begins with allocation of a look-up table whenever a new value is stored by the system hardware. The hardware fills in the initial entries in the root look-up table and updates the presence bit(s) to indicate the presence of a data value. One or more look-up tables may be allocated based on the number of bit fields in a prospective query tag. Finally, the last look-up table (e.g. 5306) may store the data value associated with the tag.

Alternatively, for duplicate tag entries, the data value is written in a linked list of bins (e.g. 5308) as pointed to by an entry in the last look-up table (e.g. 5306). The CAM architecture may also implement a localized write operation to ensure fast access of data values that have a higher probability of being accessed together.

A delete operation follows in a similar fashion to the read operation described above with an additional step of updating the presence bit(s) to indicate that data value is not present. In case of duplicate tag entries, the data values in the linked list may be deleted individually, or may be deleted by deleting the contents of the entire linked list. A start and a finish pointer in the memory (RAM) characterize a linked list (such as 5308). Accordingly, upon receipt of a request to delete a data value corresponding to a tag, the system hardware may delete a single value or may delete the data values of the entire linked list under software control. The CAM architecture also supports use of wildcard bits in a tag to facilitate the delete operation. For example, a query tag that has one or more wildcard bits may be used to delete data values corresponding to a range of query tags. This enables faster memory operations and increased parallelism.

As can be seen from the foregoing detailed description, there is provided an improved architecture for parallel computing. The architecture provides fixed or function-based tags to facilitate out-of-order processing, configurations (possibly reconfigurable) to execute dataflow graphs, and enables performance of a number of computing concepts, including conditional execution, (e.g., if-then statements and while loops), function calls and recursion.

While the invention is susceptible to various modifications and alternative constructions, certain illustrated embodiments thereof are shown in the drawings and have been described above in detail. It should be understood, however, that there is no intention to limit the invention to the specific forms disclosed, but on the contrary, the intention is to cover all modifications, alternative constructions, and equivalents falling within the spirit and scope of the invention.

What is claimed is:

1. A computer implemented system comprising:
   one or more processors;
   a memory; and
   a Content Addressable Memory (CAM) controller communicatively coupled to the one or more processors and the memory, the CAM controller configured to process data for parallel execution via a CAM data structure associated with the memory, the data structure having a tag comprising bits, the bits in the tag being sub-divided into a plurality of bit fields to index pointers in a hierarchy of look up tables stored in the memory, wherein the CAM controller is further configured to access the CAM data structure and successively search the hierarchy of look up tables associated with the plurality of bit fields, wherein:
   each entry in each of the look up tables of a high level in the hierarchy is associated with a pointer to another look up table of a low level in the hierarchy;
   each of the plurality of bit fields corresponds to a look up table in the hierarchy of the look up tables;
   each entry in a look up table of a lowest level in the hierarchy that corresponds to a last bit field in the tag is associated with a bin that stores multiple data entries in the memory and is configured to associate the multiple data entries to the tag; and
   each tag is associated with presence bits stored with each tag to indicate whether a data value associated with the respective tag is:
   not present,
   present but not cached, or
   present and cached.

2. The system of claim 1, wherein the tag further comprises n number of bit fields associated with the tag, each bit field containing an index providing a pointer that points to a next adjacent bit field in the tag, the n-th bit field associated with a table of pointers that references the bin.

3. The system of claim 2, wherein the data structure retrieves one or more of the data entries stored in the bin in response to a tag query referencing the tag associated with the bin.

4. The system of claim 3, further comprising a hardware memory manager to locate the data entries for each bin in consecutive physical memory locations.

5. The system of claim 3, wherein the CAM data structure supports use of a wildcard bit in the query to retrieve multiple data items by accessing multiple matching tags and multiple data entries in response to the query.

6. The system of claim 1, wherein the data structure also allows for early termination of nonexistent tags by providing a null pointer in the look-up table.

7. The system of claim 1, wherein the CAM controller implements a caching scheme that caches at least a portion of the look-up table.

8. A system comprising:
   one or more processors;
   a plurality of memories; and
   a plurality of Content Addressable Memory (CAM) controllers communicatively coupled to the one or more processors and the plurality of memories, the plurality of CAM controllers configured to process data for parallel execution via multiple predefined CAM data structures associated with the plurality of memories the multiple predefined CAM data structures comprising a first CAM data structure to store a first tag having a first length and a second CAM data structure to store a second tag having a second length, the plurality of CAM controllers further configured to access the multiple predefined CAM data structures and successively search the first tag and the second tag associated, respectively, with a plurality of bit fields, wherein each of the first tag and the second tag is sub-divided into the plurality of bit fields to index pointers in a hierarchy of look up tables stored in the plurality of memories such that each of the first tag and the second tag is associated with a first look-up table that comprises a pointer based upon a first bit field in each of the first tag and the second tag to point to a second look-up table corresponding to a second bit field in each of the first tag and the second tag, wherein the first or second tag is associated with presence bits stored with each tag to indicate whether a data value associated with the respective tag is:
   not present,
   present but not cached, or
   present and cached.

9. The system of claim 8, wherein the first CAM data structure is associated with a first memory of the plurality of memories and a first controller of the plurality of CAM controllers and the second CAM data structure is associated with a second memory of the plurality of memories and a second controller of the plurality of CAM controllers.

10. The system of claim 9, wherein the first tag is associated with a first look-up table that comprises a pointer based upon a first bit field in the first tag to point to a second look-up table corresponding to a second bit field in the first tag, the first and second look-up tables being connected with carry chain logic.

11. The system of claim 8, wherein the first length is different from the second length.

* * * * *